(12) United States Patent
Mikasa

(10) Patent No.: US 8,686,496 B2
(45) Date of Patent: Apr. 1, 2014

(54) SEMICONDUCTOR DEVICE AND METHOD OF FORMING THE SAME

(76) Inventor: Noriaki Mikasa, Tokyo (JP)

(*) Notice: Subject to any disclaimer, the term of this patent is extended or adjusted under 35 U.S.C. 154(b) by 119 days.

(21) Appl. No.: 13/307,775

(22) Filed: Nov. 30, 2011

(65) Prior Publication Data

US 2012/0132971 A1 May 31, 2012

(30) Foreign Application Priority Data

Nov. 30, 2010 (JP) .................................. 2010-266916
May 10, 2011 (JP) .................................. 2011-105376

(51) Int. Cl.
*H01L 29/66* (2006.01)

(52) U.S. Cl.
USPC .................................. 257/331; 257/E29.345

(58) Field of Classification Search
USPC .......................................... 257/331, E29.345
See application file for complete search history.

(56) References Cited

U.S. PATENT DOCUMENTS

| | | | |
|---|---|---|---|
| 4,954,854 A | 9/1990 | Ghong et al. | |
| 5,789,792 A * | 8/1998 | Tsutsumi | 257/506 |
| 5,998,836 A * | 12/1999 | Williams | 257/341 |
| 2006/0138477 A1 | 6/2006 | Suh | |

FOREIGN PATENT DOCUMENTS

| | | |
|---|---|---|
| CN | 1794467 A | 6/2006 |
| JP | 9-102607 | 4/1997 |
| JP | 2006-339476 A | 12/2006 |
| JP | 2007-81095 A | 3/2007 |
| KR | 10-2009-0096996 | 9/2009 |

OTHER PUBLICATIONS

Korean Office Action issued Feb. 25, 2013 in corresponding Korean Application No. 10-2011-0125282.

* cited by examiner

*Primary Examiner* — Lex Malsawma
(74) *Attorney, Agent, or Firm* — Sughrue Mion, PLLC

(57) ABSTRACT

A semiconductor device includes a semiconductor substrate having a first gate groove having first and second side walls facing to each other. A first gate insulating film covers the first and second side walls. A first gate electrode is disposed on the first gate insulating film and in a lower portion of the first gate groove. A first burying insulating film buries the first gate groove and covers the first gate electrode. A first diffusion region is adjacent to a first upper portion of the first gate insulating film. The first upper portion is positioned on an upper portion of the first side wall of the first gate groove. A second diffusion region is in contact with an upper portion of the second side wall of the first gate groove.

20 Claims, 74 Drawing Sheets

SEMICONDUCTOR DEVICE AND METHOD OF FORMING THE SAME

BACKGROUND OF THE INVENTION

1. Field of the Invention

The present invention generally relates to a semiconductor device and a method of forming the same.

Priorities are claimed on Japanese Patent Applications Nos. 2010-266916, filed Nov. 30, 2010 and 2011-105376, filed May 10, 2011, the contents of which are incorporated herein by reference.

2. Description of the Related Art

In recent years, semiconductor devices such as DRAMs (Dynamic Random Access Memories) have been miniaturized. Accordingly, if a gate length of a transistor is shortened, a short channel effect of the transistor is noticeable. As a result, sub-threshold current increases and a threshold voltage (Vt) of the transistor decreases.

Further, when impurity concentration of a semiconductor substrate increases in order to suppress the decrease of the threshold voltage (Vt) of the transistor, junction leak current increases.

Thereby, when a memory cell of a semiconductor device such as a DRAM is miniaturized, degradation of a refresh characteristic is a severe problem.

As a structure for resolving such problems, a trench gate transistor in which a gate electrode is buried in a trench formed in a main surface of a semiconductor substrate (also called "recess channel transistor") is disclosed in Japanese Patent Laid-open Publication No. 2006-339476 and Japanese Patent Laid-open Publication No. 2007-081095.

As the transistor is a trench gate transistor, an effective channel length (gate length) can be secured physically sufficiently and a DRAM including a fine cell having a minimum processing dimension equal to or less than 60 nm can be realized.

Further, a DRAM including two trenches formed to be adjacent to each other in a semiconductor substrate, gate electrodes formed in the respective trenches through a gate insulating film, a first impurity diffusion region formed in a main surface of the semiconductor substrate located between the two gate electrodes and common to the two gate electrodes, and a second impurity diffusion region formed in the main surface of the semiconductor substrate located at a side of an element isolation region of the two gate electrodes is disclosed in Japanese Patent Laid-open Publication No. 2007-081095.

SUMMARY

In one embodiment, a semiconductor device may include, but is not limited to, a semiconductor substrate having a first gate groove having first and second side walls facing to each other; a first gate insulating film covering the first and second side walls of the first gate groove; a first gate electrode on the first gate insulating film, the first gate electrode being in a lower portion of the first gate groove; a first burying insulating film that buries the first gate groove, the first burying insulating film covering the first gate electrode; a first diffusion region adjacent to a first upper portion of the first gate insulating film, the first upper portion being on an upper portion of the first side wall of the first gate groove; and a second diffusion region in contact with an entire portion of the second side wall of the first gate groove.

In another embodiment, a semiconductor device may include, but is not limited to, a semiconductor substrate having at least an active region that extends in a first direction, the semiconductor substrate having first and second gate electrode grooves; first and second isolation regions in the semiconductor substrate, the first and second isolation regions extending in a second direction, the first and second isolation regions extending across the at least active region to divide the at least active region into a plurality of device formation regions; first and second transistors disposed between the first and second isolation regions, the first and second transistors being aligned and adjacent to each other in the first direction, the first and second transistors having first and second diffusion regions, respectively, the first and second transistors having a third diffusion region as a common diffusion region, the third diffusion region being disposed between the first and second gate electrode grooves; a bit line electrically coupled to the third diffusion region; first and second gate insulating films in the first and second gate electrode grooves; and first and second gate electrodes on the first and second gate insulating films, respectively, the first and second gate electrodes burying lower portions of the first and second gate electrode grooves. The first diffusion region is in the semiconductor substrate, the first diffusion region is disposed between the first isolation region and the first gate electrode groove, the first diffusion region has a first bottom which is higher in level than a top portion of the first gate electrode. The second diffusion region is in the semiconductor substrate, the second diffusion region is disposed between the second isolation region and the second gate electrode groove, the second diffusion region has a second bottom which is higher in level than a top portion of the second gate electrode. The first gate electrode groove has first and second side surfaces and a first bottom, the first side surface facing against the first isolation region, the second side surface being adjacent to the third diffusion region. The second gate electrode groove has third and fourth side surfaces and a second bottom, the third side surface facing against the second isolation region, the fourth side surface being adjacent to the third diffusion region. The third diffusion region fills entirely in an interposed region of the semiconductor substrate between the first and second gate grooves, the third diffusion region extending from an upper surface of the semiconductor substrate to the bottoms of the first and second gate electrode grooves. The first transistor has a first channel region between the first diffusion region and the bottom of the third diffusion region. The second transistor has a second channel region between the second diffusion region and the bottom of the third diffusion region.

In still another embodiment, a method of forming a semiconductor device may include, but is not limited to, forming a gate electrode groove in a semiconductor substrate, the gate electrode groove having first and second side surfaces facing to each other, the gate electrode groove extending in a first direction; forming a gate insulating film on the first and second side surfaces of the gate electrode groove; forming a gate electrode which buries the gate electrode groove, the gate electrode covering the gate electrode; forming a first impurity diffusion region in the semiconductor substrate, the first impurity diffusion region covering the top of the gate insulating film disposed on the first side surface; and forming a second impurity diffusion region in the semiconductor substrate, the second impurity diffusion region covering the top of the gate insulating film disposed on the second side surface.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained, in order to facilitate the understanding of the present invention.

In the DRAM having the trench gate transistor disclosed in Japanese Patent Laid-open Publication No. 2006-339476 and Japanese Patent Laid-open Publication No. 2007-081095, a channel region of the transistor is formed in three surfaces, i.e., both side surfaces and a bottom of the trench.

The inventor has found that if the transistor having this configuration is further miniaturized, on current of the transistor is not sufficiently secured and normal operation of the DRAM is obstructed. This is caused by high channel resistance due to a channel region of the transistor being formed in the three surfaces constituting the trench, as described above.

Further, if an arrangement pitch of a trench gate becomes small, when a transistor is operated, an operation state of the transistor interferes with another adjacent transistor. Accordingly, the transistor cannot be independently operated.

This can be caused by a channel region formed between adjacent trench gates.

Further, in a trench gate transistor, since a gate electrode is formed to protrude upward from a surface of the semiconductor substrate, the protruding gate electrode itself makes it greatly difficult to form a bit line or a capacitor to be formed in a subsequent process. Thus, it is difficult to fabricate a DRAM.

Accordingly, even in a DRAM including a transistor using a trench, there is a need for a semiconductor device and a fabrication method thereof in which on current of the transistor is sufficiently secured and operation interference of an adjacent transistor is avoided to thereby resolve the difficulty of fabrication.

The inventor has newly found that if a memory cell of a DRAM (Dynamic Random Access Memory) is miniaturized, an interval between two adjacent cells provided in one active region becomes small, and, as a result, a disturbance defect between adjacent cells (hereinafter referred to simply as "disturbance defect"), in which, when one cell accumulates data "0," the other cell accumulates data "1," and the cell accumulating data "0" is continuously accessed, accumulated data in the cell accumulating the data "1" is destructed, is generated. This disturbance defect causes degradation of the reliability of a semiconductor device.

Figure 42:
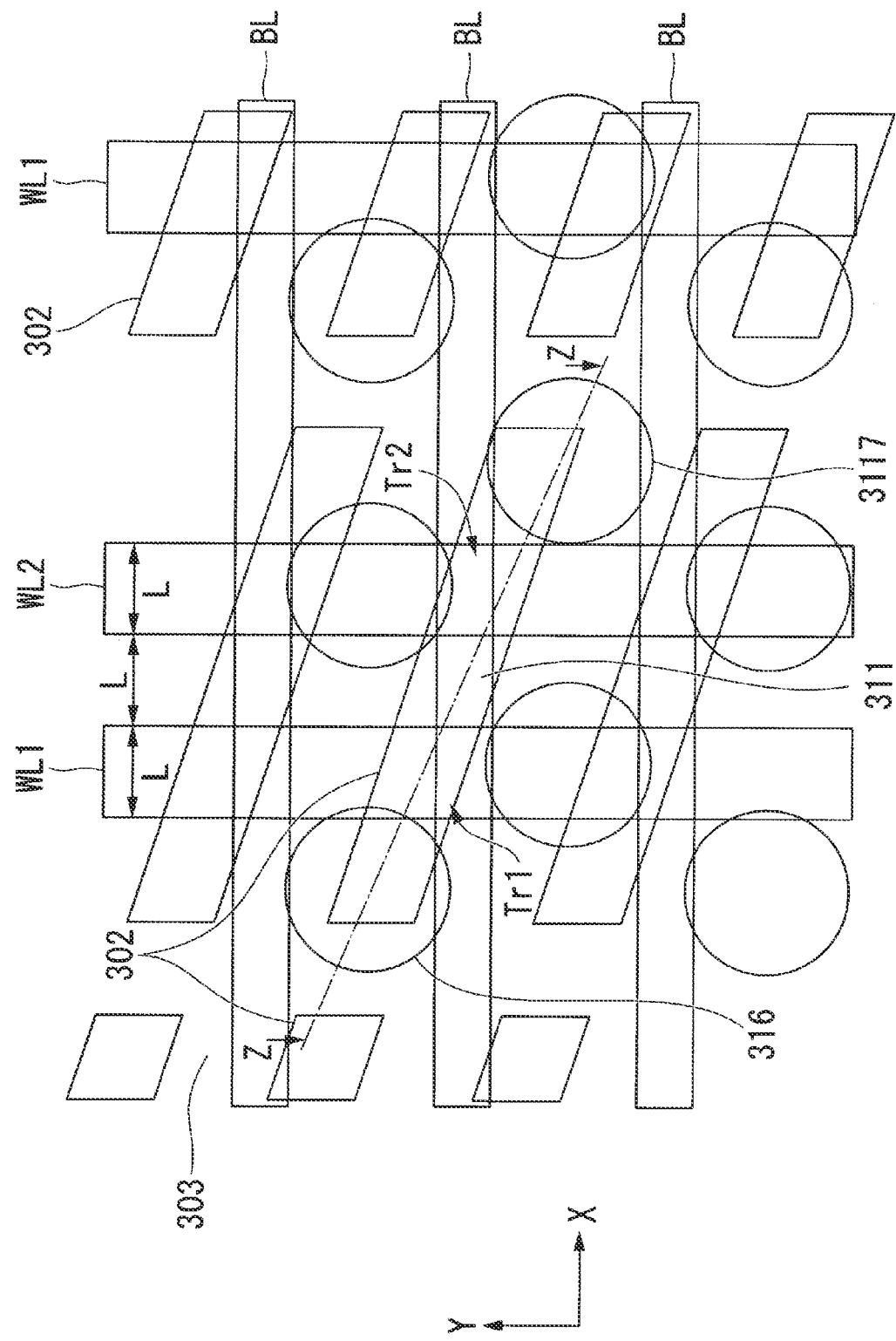
FIG. 42 is a fragmentary plan view of a memory cell array of the DRAM in the related art.
Figure 43:
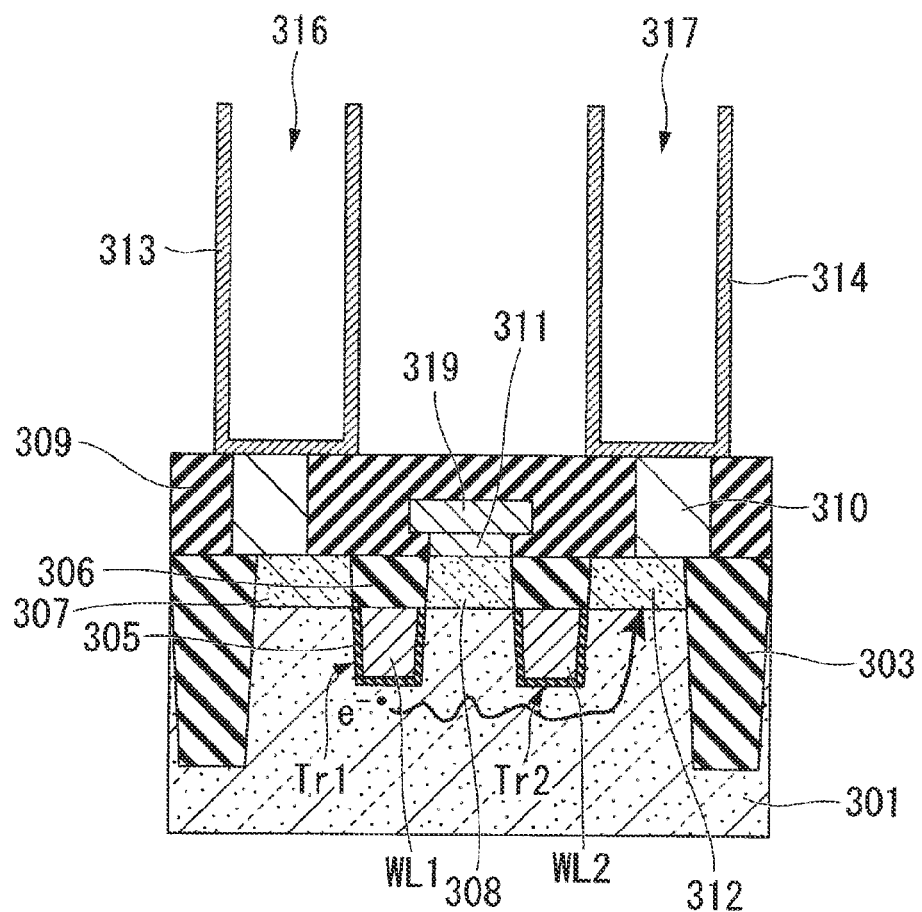
FIG. 43 is a fragmentary cross sectional elevation view taken along a Z-Z line of FIG. 42.

FIG. 42 is a plan view showing an example of a layout of a conventional DRAM, and FIG. 43 is a cross-sectional view taken along a line Z-Z of the DRAM shown in FIG. 42.

Next, the above-described disturbance defect found by the inventor will be described with reference to FIGS. 42 and 43.

Referring to FIG. 42, a plurality of regularly arranged active regions 302 are provided in a surface of a semiconductor substrate 301. Each active region 302 is surrounded by an element isolation region 303 in which a trench formed in the surface of the semiconductor substrate 301 is buried with an insulating film. In a Y direction intersecting the active region 302, a plurality of word lines WL extending in the Y direction are arranged.

Referring to FIG. 43, word lines WL1 and WL2 are formed by burying trenches provided across the plurality of active regions 302 and the element isolation region 303 in the surface of the semiconductor substrate 301 through a gate insulating film 305.

On upper surfaces of the word lines WL1 and WL2, a cap insulating film 306 is formed to bury the trenches. In one active region 302, two word lines consisting of the word line WL1 and the word line WL2 are provided to intersect each other.

The two word lines WL1 and WL2 constitute gate electrodes of two corresponding transistors Tr1 and Tr2, respectively. The transistor Tr1 includes a drain diffusion layer 307 and a source diffusion layer 308, in addition to the gate electrode consisting of the word line WL1.

Further, the transistor Tr2 includes a drain diffusion layer 312 and the source diffusion layer 308, in addition to the gate electrode consisting of the word line WL2. The source diffusion layer 308 is common to the transistors Tr1 and Tr2, and is connected to a bit line BL at a bit line contact 311.

Meanwhile, the drain diffusion layers 307 and 312 are connected to lower electrodes 313 and 314 (storage nodes) via capacitive contact plugs 310 formed in an interlayer insulating film 309, respectively.

The lower electrodes 313 and 314 constitute capacitive elements 316 and 317 together with a capacitive insulating film and an upper electrode, which are not shown, respectively. The surface of the semiconductor substrate 301 corresponding to a bottom and two opposing side surfaces of the trenches buried with the word lines are channels of the transistors Tr1 and Tr2.

For example, if the word line WL1 is in an on state to form the channel of the transistor Tr1 and a potential at a low (L) level is applied to the bit line 319, the lower electrode 313 enters an "L" state. Then, the word line WL1 is transferred to an off state to thereby accumulate L (data "0") information in the lower electrode 313.

Furthermore, for example, if the word line WL2 is in an on state to form the channel of the transistor Tr2 and a potential at a high (H) level is applied to the bit line 319, the lower electrode 314 enters an H state. Then, the word line WL2 is transferred to an off state to thereby accumulate H (data "1") information in the lower electrode 314.

Furthermore, for example, if the word line WL2 is in an on state to form the channel of the transistor Tr2 and a potential at a high (H) level is applied to the bit line 319, the lower electrode 314 enters an H state. Then, the word line WL2 is transferred to an off state to thereby accumulate H (data "1") information in the lower electrode 314.

As a result, electrons e− induced in the channel of the transistor Tr1 reach the adjacent drain diffusion layer 312, such that H information accumulated in the lower electrode 314 is destructed and the state is changed to the L state.

That is, a mode defect, which indicates that the data "1" is changed into the data "0," is generated. This defect depends on the number of on/off times of the word line WL1. For example, if the number of on/off times is 10000, one of a plurality of cells is destroyed, and if the number of on/off times is 100000, ten cells are destroyed.

Originally, adjacent cells must independently hold information. However, if a disturbance defect, in which an accumulation state of one cell is changed due to an operation state of the other adjacent cell, is generated, a normal operation of the semiconductor device (DRAM) is obstructed and reliability is degraded.

This disturbance defect is not problematic when a cell is large, that is, when an interval L between the word line WL1 and the word line WL2, which is defined as a minimum processing dimension F as shown in FIG. 42, is 70 nm.

However, if the memory cell is reduced and the interval between the word line WL1 and the word line WL2 becomes smaller than 50 nm, the disturbance defect is noticeable. Further, such a small interval causes a severer problem.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate having a first gate groove having first and second side walls facing to each other; a first gate insulating film covering the first and second side walls of the first gate groove; a first gate electrode on the first gate insulating film, the first gate electrode being in a lower portion of the first gate groove; a first burying insulating film that buries the first gate groove, the first burying insulating film covering the first gate electrode; a first diffusion region adjacent to a first upper portion of the first gate insulating film, the first upper portion being on an upper portion of the first side wall of the first gate groove; and a second diffusion region in contact with an entire portion of the second side wall of the first gate groove.

In some cases, the semiconductor substrate further includes a second gate groove having third and fourth side walls facing to each other, and the second diffusion region is disposed between the first and second gate grooves, the second diffusion region being adjacent to the first and second gate grooves.

In some cases, the second diffusion region fills entirely in an interposed region of the semiconductor substrate between the first and second gate grooves.

In some cases, the semiconductor device may further include, but is not limited to, a second gate insulating film covering the third and fourth side walls of the second gate groove; a second gate electrode on the second gate insulating film, the second gate electrode being in an upper portion of the second gate groove; and a second burying insulating film that buries the second gate groove, the second burying insulating film covering the second gate electrode.

In some cases, the second diffusion region has a bottom portion which is lower than bottoms of the first and second gate grooves.

In some cases, the second diffusion region includes first and second regions which are united with each other, the first region being adjacent to the bottoms of the first and second gate grooves, and the second region filling entirely in an interposed region of the semiconductor substrate between the first and second gate grooves.

In some cases, the first and second gate grooves extend in a first direction in the semiconductor substrate.

In some cases, the semiconductor device may further include, but is not limited to, first isolation regions in the semiconductor substrate, the first isolation regions extending in a second direction crossing the first direction, the first isolation regions defining at least an active region of the semiconductor substrate; and second isolation regions in the semiconductor substrate, the second isolation regions extending in the first direction, the second isolation regions dividing the at least an active region into a plurality of device formation regions.

In some cases, the first region of the second diffusion region is a layered region, the first and second isolation regions have bottoms which are deeper than bottom of the first region of the second diffusion region, the first and second isolation regions divide the first region of the second diffusion region into a plurality of regions.

In some cases, the second isolation regions have bottoms which are substantially the same level as the bottoms of the first and second gate electrode grooves.

In some cases, the semiconductor device may further include, but is not limited to, third diffusion regions around the bottoms of the fourth regions, the third diffusion regions being the same in conductivity type as the semiconductor substrate, the third diffusion regions being higher in impurity concentration than the semiconductor substrate, the third diffusion regions contacting the first region of the second diffusion region.

In some cases, the first isolation region includes a first insulating film which buries in a first isolation groove extending in the second direction and in the semiconductor substrate.

In some cases, the second isolation region includes a second insulating film which buries in a second isolation groove extending in the first direction and in the semiconductor substrate.

In some cases, the semiconductor device may further include, but is not limited to, a bit line electrically coupled to the second diffusion region, the bit line extending in a direction crossing an extension direction of the gate electrode.

In some cases, the semiconductor device may further include, but is not limited to, an inter-layer insulating film over the first burying insulating film; a contact plug contacting the first diffusion region, the contact plug being in the first burying insulating film and the interlayer insulating film; a contact pad over the interlayer insulating film, the contact pad contacting an upper surface of the contact plug; and a capacitor electrically coupled to the contact pad.

In another embodiment, a semiconductor device may include, but is not limited to, a semiconductor substrate having at least an active region that extends in a first direction, the semiconductor substrate having first and second gate electrode grooves; first and second isolation regions in the semiconductor substrate, the first and second isolation regions extending in a second direction, the first and second isolation regions extending across the at least active region to divide the at least active region into a plurality of device formation regions; first and second transistors disposed between the first and second isolation regions, the first and second transistors being aligned and adjacent to each other in the first direction, the first and second transistors having first and second diffusion regions, respectively, the first and second transistors having a third diffusion region as a common diffusion region, the third diffusion region being disposed between the first and second gate electrode grooves; a bit line electrically coupled to the third diffusion region; first and second gate insulating films in the first and second gate electrode grooves; and first and second gate electrodes on the first and second gate insulating films, respectively, the first and second gate electrodes burying lower portions of the first and second gate electrode grooves. The first diffusion region is in the semiconductor substrate, the first diffusion region is disposed between the first isolation region and the first gate electrode groove, the first diffusion region has a first bottom which is higher in level than a top portion of the first gate electrode. The second diffusion region is in the semiconductor substrate, the second diffusion region is disposed between the second isolation region and the second gate electrode groove, the second diffusion region has a second bottom which is higher in level than a top portion of the second gate electrode. The first gate electrode groove has first and second side surfaces and a first bottom, the first side surface facing against the first isolation region, the second side surface being adjacent to the third diffusion region. The second gate electrode groove has third and fourth side surfaces and a second bottom, the third side surface facing against the second isolation region, the fourth side surface being adjacent to the third diffusion region. The third diffusion region fills entirely in an interposed region of the semiconductor substrate between the first and second gate grooves, the third diffusion region extending from an upper surface of the semiconductor substrate to the bottoms of the first and second gate electrode grooves. The first transistor has a first channel region between the first diffusion region and the bottom of the third diffusion region. The second transistor has a second channel region between the second diffusion region and the bottom of the third diffusion region.

In some cases, the first channel region extends from the bottom of the first diffusion region along the first side surface of the first gate electrode groove, and the second channel region extends from the bottom of the second diffusion region along the third side surface of the second gate electrode groove.

In some cases, the third diffusion region include first and second regions united with each other, the first region extends entirely in an interposed region between the first and second gate electrode grooves and from the upper surface of the semiconductor substrate to a deep portion between the bottoms of the first and second gate electrode grooves, the second region extending between the bottoms of the first and second gate electrode grooves, the second region contacting the bottoms of the first and second gate electrode grooves, the second region is a lowered region, the first channel region extends between the bottom of the first diffusion region to the second region of the third diffusion region, and the second channel region extends between the bottom of the second diffusion region to the second region of the third diffusion region.

In some cases, the first and second isolation regions have bottoms which are deeper than the bottom of the third diffusion region, and the third diffusion region is divided by the first and second isolation regions into a plurality of diffusion regions.

In some cases, the semiconductor device may further include, but is not limited to, fourth diffusion regions around the bottoms of the first and second isolation regions, the fourth diffusion regions being the same in conductivity type as the semiconductor substrate, the fourth diffusion regions being higher in impurity concentration than the semiconductor substrate, the fourth diffusion regions contacting the second region of the third diffusion region.

In still another embodiment, a method of forming a semiconductor device may include, but is not limited to, forming a gate electrode groove in a semiconductor substrate, the gate electrode groove having first and second side surfaces facing to each other, the gate electrode groove extending in a first direction; forming a gate insulating film on the first and second side surfaces of the gate electrode groove; forming a gate electrode which buries the gate electrode groove, the gate electrode covering the gate electrode; forming a first impurity diffusion region in the semiconductor substrate, the first impurity diffusion region covering the top of the gate insulating film disposed on the first side surface; and forming a second impurity diffusion region in the semiconductor substrate, the second impurity diffusion region covering the top of the gate insulating film disposed on the second side surface.

In some cases, the method may further include, but is not limited to, forming, before forming the gate electrode groove, first isolation grooves in the semiconductor substrate, the first isolation grooves extending in a second direction crossing the first direction; forming first isolation insulating films which buries the first isolation grooves to form first isolation regions defining active regions; forming second isolation grooves in the semiconductor substrate, the second isolation grooves extending in the first direction; and forming second isolation insulating films which buries the second isolation grooves to form second isolation regions dividing the active regions into a plurality of device formation regions. Forming the gate electrode grooves includes forming the gate electrode grooves each of which being disposed between the second isolation regions. The second diffusion region is formed by carrying out a selective ion implantation of an impurity of a different conductivity type from the semiconductor substrate into portions of the semiconductor substrates between the gate electrode grooves to form the second diffusion region.

In some cases, the second diffusion region is formed to have a bottom portion which is lower than the bottoms of the gate electrode grooves.

In some cases, the method may further include, but is not limited to, forming, before forming the gate electrode grooves, grooves in the semiconductor substrate, the grooves extending in a second direction crossing the first direction, the grooves having the same depth as the gate electrode grooves; making the grooves deeper to form the first isolation grooves; forming first isolation insulating films which bury the first isolation grooves to form first isolation regions defining active regions; forming second isolation grooves in the semiconductor substrate, the second isolation grooves extending in the first direction; forming second isolation insulating films which bury the second isolation grooves to divide the active regions into a plurality of device isolation regions; forming, before forming the first isolation insulating film, a first region in the form of a layer in the semiconductor substrate by carrying out a selective ion implantation of an impurity of a different conductivity type from the semiconductor substrate into the bottoms of the grooves; and forming a second region between the gate electrode grooves and contacting the first region by carrying out a selective ion implantation of an impurity of a different conductivity type from the semiconductor substrate into a portion in the semiconductor substrate between the gate electrode grooves, to form the second diffusion region. The gate electrode grooves are formed so that the bottoms of the gate electrode grooves are covered by the first region.

In some cases, the method may further include, but is not limited to, forming, before forming the gate electrode grooves, first isolation grooves in the semiconductor substrate, the first isolation grooves extending in a second direction crossing the first direction; forming first isolation insulating films which bury the first isolation grooves to form first isolation regions defining active regions; forming second isolation grooves in the semiconductor substrate, the second isolation grooves extending in the first direction; forming second isolation insulating films which bury the second isolation grooves to divide the active regions into a plurality of device isolation regions; forming, before forming the first isolation insulating film, a first region in the form of a layer in the semiconductor substrate by carrying out a selective ion implantation of an impurity of a different conductivity type from the semiconductor substrate into entirely a main surface of the grooves; and forming a second region between the gate electrode grooves and contacting the first region by carrying out a selective ion implantation of an impurity of a different conductivity type from the semiconductor substrate into a portion in the semiconductor substrate between the gate electrode grooves, to form the second diffusion region. The gate electrode grooves are formed so that the bottoms of the gate electrode grooves are covered by the first region.

In some cases, the method may further include, but is not limited to, forming, before forming the gate electrode grooves, first isolation grooves in the semiconductor substrate, the first isolation grooves extending in a second direction crossing the first direction; forming first isolation insulating films which bury the first isolation grooves to form first isolation regions defining active regions; forming second isolation grooves in the semiconductor substrate, the second isolation grooves extending in the first direction, the second isolation grooves having the same depth as the gate electrode grooves; forming second isolation insulating films which bury the second isolation grooves to divide the active regions into a plurality of device isolation regions; forming, before forming the second isolation insulating film, third diffusion regions around the bottoms of the second isolation grooves by carrying out an ion implantation of an impurity of the same conductivity type as the semiconductor substrate at a higher impurity concentration than the semiconductor substrate; forming, before forming the gate electrode, a first region in the form of a layer in the semiconductor substrate by carrying out a selective ion implantation of an impurity of a different conductivity type from the semiconductor substrate into the bottoms of the gate electrode grooves; and forming a second region between the gate electrode grooves and contacting the first region by carrying out a selective ion implantation of an impurity of a different conductivity type from the semiconductor substrate into a portion in the semiconductor substrate between the gate electrode grooves, to form the second diffusion region.

In some cases, the method may further include, but is not limited to, forming a bit line electrically coupled to the second diffusion region, the bit line extending in a direction crossing an extension direction of the gate electrode, the bit line extending over the second diffusion region between the gate electrode grooves.

In some cases, the method may further include, but is not limited to, forming an inter-layer insulating film over the buried insulating film; forming a contact plug contacting the first diffusion region, the contact plug being in the first burying insulating film and the interlayer insulating film; forming a contact pad over the interlayer insulating film, the contact pad contacting an upper surface of the contact plug; and forming a capacitor electrically coupled to the contact pad.

Hereinafter, embodiments to which the present invention is applied will be described in detail with reference to the accompanying drawings. Further, drawings used in the following description are for explaining configurations of the embodiments of the present invention, and a size, a thickness, or a dimension of each shown portion may differ from that of a real semiconductor device.

First Embodiment

Figure 1:
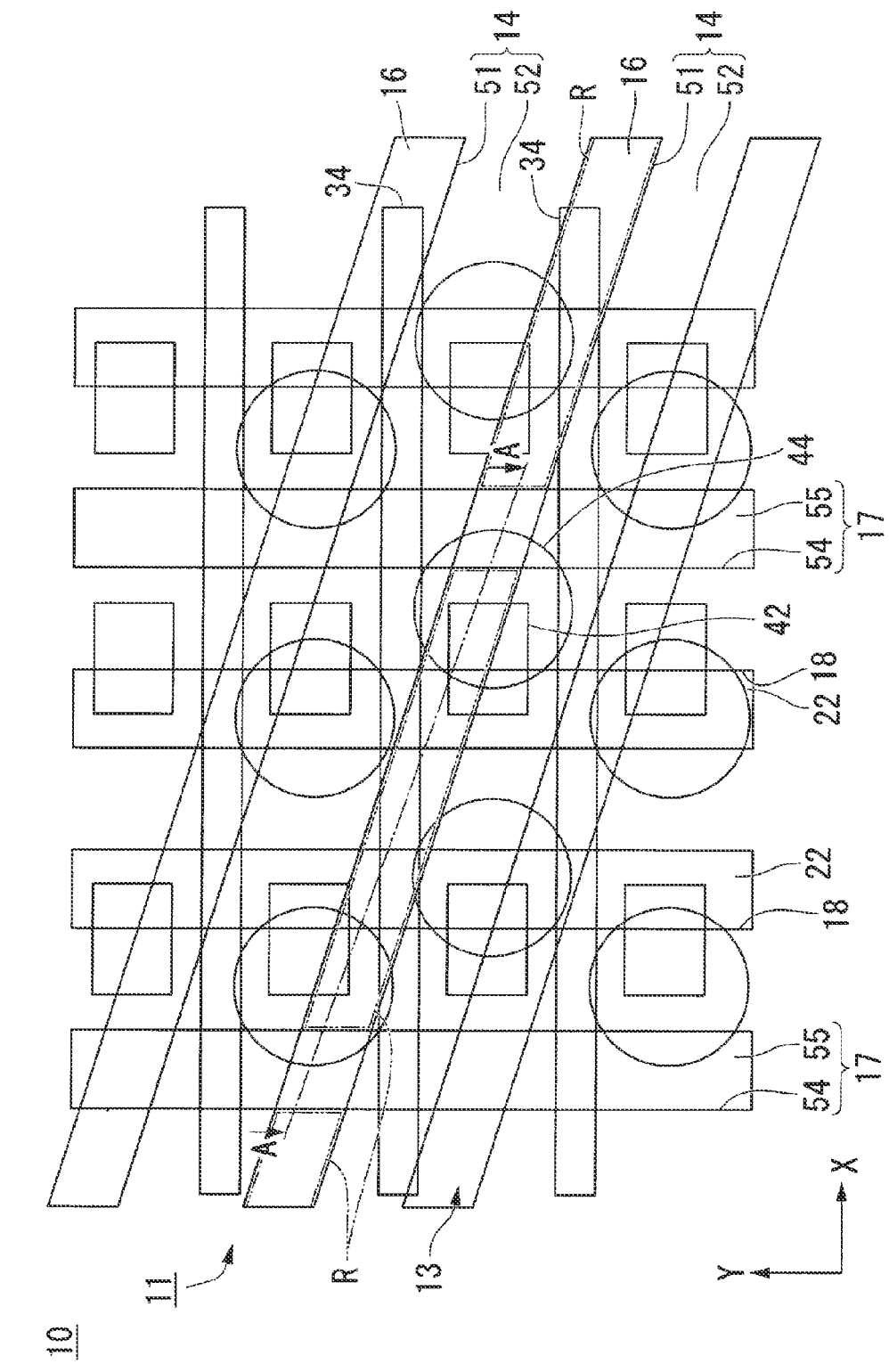
FIG. 1 is a fragmentary plan view of a memory cell array of a semiconductor device in accordance with a first embodiment of the present invention.
Figure 2:
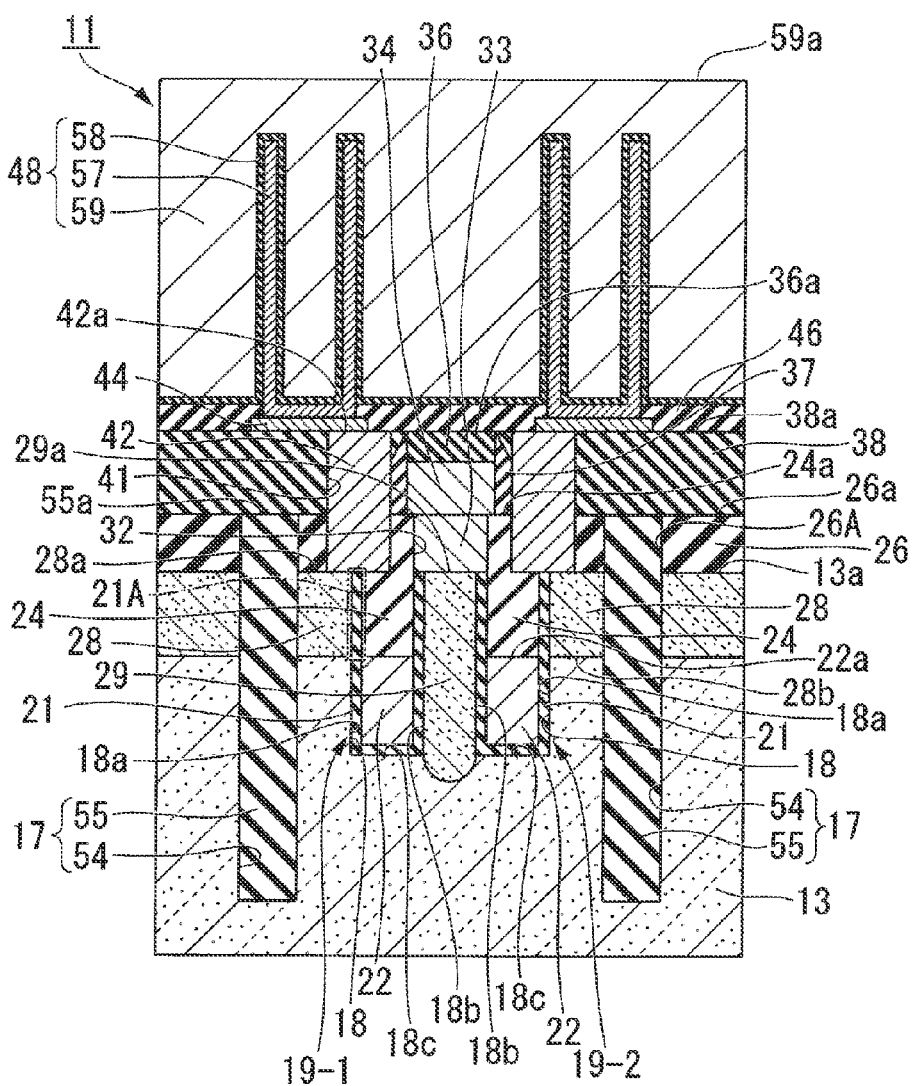
FIG. 2 is a fragmentary cross sectional elevation view, taken along an A-A' line of FIG. 1, of the semiconductor device of FIG. 1.

FIG. 1 is a schematic plan view of a memory cell array provided in a semiconductor device according to a first embodiment of the present invention, and FIG. 2 is a cross-sectional view taken along a line A-A of the memory cell array shown in FIG. 1.

In FIGS. 1 and 2, a DRAM (Dynamic Random Access Memory) is described as an example of the semiconductor device 10 of the first embodiment. Further, in FIG. 1, an example of a layout of a memory cell array of the DRAM is shown.

In FIG. 1, an X direction indicates a direction in which a bit line 34 extends, and a Y direction indicates a direction (a second direction) in which a gate electrode 22 and a second element isolation region 17, which intersects the X direction, extend.

In FIG. 1, for convenience of explanation, among components of the memory cell array 11, only a semiconductor substrate 13, a first element isolation region 14, an active region 16, a second element isolation region 17, a gate electrode trench 18, a gate electrode 22, the bit line 34, a capacitive contact plug 42, a capacitive contact pad 44, and a plurality of element forming regions R are shown, and other components of the memory cell array 11 are not shown.

In FIG. 2, in fact, the bit line 34 extending in the X direction shown in FIG. 1 is schematically shown. In FIG. 2, the same components as those of the semiconductor device 10 shown in FIG. 1 are assigned the same reference numerals.

The semiconductor device 10 of the first embodiment includes a memory cell region in which the memory cell array 11 shown in FIGS. 1 and 2 is formed, and a peripheral circuit region (a region in which a peripheral circuit is formed; not shown) arranged around the memory cell region.

Referring to FIGS. 1 and 2, the memory cell array 11 provided in the semiconductor device 10 of the first embodiment includes a semiconductor substrate 13, a first element isolation region 14, an active region 16 having a plurality of element forming regions R, a second element isolation region 17, a gate electrode trench 18, first and second transistors 19-1 and 19-2, a gate insulating film 21, a buried gate electrode 22, a buried insulating film 24, a mask insulating film 26, a first impurity diffusion region 28, a second impurity diffusion region 29, an aperture 32, a bit line contact plug 33, a bit line 34, a cap insulating film 36, a sidewall film 37, an interlayer insulating film 38, a contact hole 41, a capacitive contact plug 42, a capacitive contact pad 44, a silicon nitride film 46, and a capacitor 48.

Referring to FIGS. 1 and 2, the semiconductor substrate 13 is a plate-shaped substrate. For example, a p-type single-crystal silicon substrate may be used as the semiconductor substrate 12. In this case, a p-type impurity concentration of the semiconductor substrate 13 may be, for example, 1E16 atoms/cm$^2$.

Referring to FIG. 1, the first element isolation region 14 includes a first element isolation trench 51 and a first element isolation insulating film 52.

The first element isolation trench 51 is formed in the semiconductor substrate 13 to extend in a direction (a second direction) tilted at a given angle with respect to the X direction shown in FIG. 1. A plurality of first element isolation trenches 51 are formed at given intervals with respect to the Y direction shown in FIG. 1. A depth of the first element isolation trench 51 may be, for example, 250 nm.

The first element isolation insulating film 52 is arranged to bury the first element isolation trench 51. Although not shown, an upper surface of the first element isolation insulating film 52 is flush with the main surface 13a of the semiconductor substrate 13. For example, a silicon oxide film (SiO$_2$ film) may be used as the first element isolation insulating film 52.

The first formed element isolation region 14 extends in a band shape in the second direction and partitions the active region 16.

Referring to FIGS. 1 and 2, the second element isolation region 17 includes a second element isolation trench 54, and a second element isolation insulating film 55. The second element isolation trench 54 is formed in the semiconductor substrate 13 to extend in the Y direction (the first direction) shown in FIG. 1. Accordingly, the second element isolation trench 54 partitions part of the first element isolation region 14. The second element isolation trench 54 is formed to be sandwiched between two gate electrodes 22 arranged to be adjacent to each other.

Each gate electrode 22 constitutes the word line of the memory cell. That is, in the memory cell of the present embodiment, one second element isolation region 17 and two gate electrodes 22 (word line) extending in the Y direction are paired and repeatedly arranged in the X direction.

The depth of the second element isolation trench 54 may be, for example, 250 nm.

The second element isolation insulating film 55 is arranged to bury the second element isolation trench 54 and the aperture 26A formed in the mask insulating film 26. The upper surface 55a of the second element isolation insulating film 55 is flush with the upper surface 26a of the mask insulating film 26. For example, a silicon oxide film (SiO$_2$ film) may be used as the second element isolation insulating film 55.

The second formed element isolation region 17 partitions a plurality of element forming regions R in the second direction.

Thus, the first element isolation region 14 formed by burying the first element isolation trench 51 formed in the semiconductor substrate 13 with the first element isolation insulating film 52, and the second element isolation region 17 formed by burying the second element isolation trench 54 formed in the semiconductor substrate 13 with the second element isolation insulating film 55 are provided to thereby partition the active region 16 into a plurality of element forming regions R. Accordingly, the first and second transistors 19-1 and 19-2 can be easily turned on and a data retention characteristic of the memory cell array 11 can be improved so that a potential of the dummy gate electrode does not adversely affect the first and second transistors 19-1 and 19-2, in comparison with a case in which a dummy gate electrode (not shown) to which a negative potential is applied through the gate insulating film 21 is provided in the second element isolation trench 54 to partition a plurality of element forming regions R.

Referring to FIGS. 1 and 2, the two gate electrode trenches 18 are provided to extend in the Y direction in the semiconductor substrate 13 located between the two second element isolation regions 17. The gate electrode trench 18 is partitioned by inner surfaces consisting of a bottom 18c and first and second opposing side surfaces 18a and 18b. The two gate electrode trenches 18 are arranged so that the second side surfaces 18b face each other.

A depth of the gate electrode trench 18 is smaller than that of the first and second element isolation trenches 51 and 54 (a depth of the first and second element isolation regions 14 and 17). If the depth of the first and second element isolation trenches 51 and 54 is 250 nm, the depth of the gate electrode trench 18 may be, for example, 150 nm.

Referring to FIG. 2, the first and second transistors 19-1 and 19-2 are trench gate transistors, each including a gate insulating film 21, a gate electrode 22, a buried insulating film 24, a first impurity diffusion region 28, and a second impurity diffusion region 29.

As shown in FIG. 2, the first and second transistors 19-1 and 19-2 are arranged to be adjacent to each other. The second impurity diffusion region 29 functions as a common impurity diffusion region (a drain region in the structure shown in FIG. 2) of the first and second transistors 19-1 and 19-2.

That is, the second side surface 18b of the gate electrode trench 18 constituting the first transistor 19-1, and the second side surface 18b of the gate electrode trench 18 constituting the second transistor 19-2 face each other via the second impurity diffusion region 29.

Referring to FIG. 2, the gate insulating film 21 is provided to cover the first and second side surfaces 18a and 18b of the gate electrode trench 18 and the bottom 18c of the gate electrode trench 18. For example, a silicon oxide film (SiO$_2$ film) of a single layer, a film (SiON film) formed by nitration of a silicon oxide film, a stacked silicon oxide film (SiO$_2$ film), a stacked film formed by stacking a silicon nitride film (SiN film) on a silicon oxide film (SiO$_2$ film), or the like may be used as the gate insulating film 21.

If the silicon oxide film (SiO$_2$ film) of the single layer is used as the gate insulating film 21, a thickness of the gate insulating film 21 may be, for example, 5 nm.

Referring to FIG. 2, the gate electrode 22 is arranged to bury a lower portion of the gate electrode trench 18 through the gate insulating film 21. Accordingly, an upper surface 22a of the gate electrode 22 is arranged in a position lower than a main surface 13a of the semiconductor substrate 13. The gate electrode 22 may have, for example, a stacked structure formed by sequentially stacking a titanium nitride film and a tungsten film.

Referring to FIG. 2, the buried insulating film 24 is arranged to bury the gate electrode trench 18 in which the gate insulating film 21 is formed, in order to cover the upper surface 22a of the gate electrode 22.

Further, an upper portion of the buried insulating film 24 protrudes from the main surface 13a of the semiconductor substrate 13, and an upper surface 24a of the protruding portion is flush with the upper surface 26a of the mask insulating film 26. A silicon oxide film (SiO$_2$ film) may be used as the buried insulating film 24.

Referring to FIG. 2, the mask insulating film 26 is provided on the upper surface 28a of the first impurity diffusion region 28. The mask insulating film 26 has a trench-shaped aperture 26A formed on the second element isolation trench 54. The mask insulating film 26 functions as an etching mask when the second element isolation trench 54 is formed in the semiconductor substrate 13 by anisotropic etching. A silicon nitride film is used as the mask insulating film 26. In this case, a thickness of the mask insulating film 26 may be, for example, 50 nm.

Referring to FIG. 2, the first impurity diffusion region 28 is provided in the semiconductor substrate 13 located at a side of the first side surface 18a to cover the upper portion 21A of the gate insulating film 21 formed in the first side surface 18a of the gate electrode trench 18.

That is, the first side surface 18a of the gate electrode trench 18 constituting the first transistor 19-1 and the first side surface 18a of the gate electrode trench 18 constituting the second transistor 19-2 face the side surface of the second element isolation trench 54 via the semiconductor substrate 13.

Accordingly, the first impurity diffusion region 28 includes the upper surface 13a of the semiconductor substrate 13 sandwiched between the first side surface 18a and the second element isolation trench 54, and is provided to cover the upper portion 21A of the gate insulating film 21 formed on the first side surface 18a.

The bottom 28b of the first impurity diffusion region 28 is arranged in a higher position than the upper surface 22a of the gate electrode 22 buried in the gate electrode trench 18 (a position at a side of the upper surface 13a of the semiconductor substrate 13). A distance between a horizontal line including the bottom 28b of the first impurity diffusion region 28 and a horizontal line including the upper surface 22a of the buried gate electrode 22 is preferably less than 10 nm.

The first impurity diffusion region 28 is provided for the respective gate electrodes 22 constituting the first and second transistors 19-1 and 19-2.

The first impurity diffusion region 28 is an impurity diffusion region functioning as the source/drain region (a source region in the structure shown in FIG. 2) of the first and second transistors 19-1 and 19-2. If the semiconductor substrate 13 is a p-type silicon substrate, the first impurity diffusion region 28 is formed by ion-implanting n-type impurities into the semiconductor substrate 13.

Referring to FIG. 2, the second impurity diffusion region 29 is provided in an entire portion of the semiconductor substrate 13 arranged between the two gate electrode trenches 18. Accordingly, the second impurity diffusion region 29 is arranged to cover the entire gate insulating film 21 provided on the second side surfaces 18b of the two gate electrode trenches 18.

Further, a bottom of the second impurity diffusion region 29 protrudes downward from the bottoms 18c of the two gate electrode trenches 18.

Thus, the second impurity diffusion region 29 provided in an entire portion of the semiconductor substrate 13 arranged between the two gate electrode trenches 18 and having a bottom protruding downward from the bottoms 18c of the two gate electrode trenches 18 is provided such that a state in which "L" is accumulated in the lower electrode 57 electrically connected with the first transistor 19-1 and "H" is accumulated in the lower electrode 57 electrically connected with the first transistor 19-1 is obtained. In this state, when on/off of the gate electrode 22 (word line) corresponding to the first transistor 19-1 is repeated, electrons e− induced in the channel of the first transistor 19-1 (not shown) are trapped by the bottom of the second impurity diffusion region 29 containing the n-type impurities, and thus the electrons e− induced in the channel of the first transistor 19-1 can be suppressed from reaching the second impurity diffusion region 29 (drain region) constituting the second transistor 19-2.

Accordingly, generation of a disturbance defect when an accumulation state of one cell is changed due to an operation state of the other adjacent cell can be suppressed so that H information resulting from the electrons e− induced in the channel of the first transistor 19-1 being accumulated in the lower electrode 57 electrically connected with the second transistor 19-2 is not destructed and the state is not changed into an L state.

Further, even in a DRAM in which an interval between two gate electrodes 22 arranged to be adjacent to each other is equal to or less than 50 nm, generation of the disturbance defect can be suppressed.

The second impurity diffusion region 29 functions as the first and second common source/drain region (a drain region in the structure shown in FIG. 2) to the transistors 19-1 and 19-2. If the semiconductor substrate 13 is a p-type silicon substrate, the second impurity diffusion region 29 is formed by ion-implanting n-type impurities into the semiconductor substrate 13.

Thus, the first impurity diffusion region 28 including the upper surface 13a of the semiconductor substrate 13 sandwiched between the first side surface 18a and the second element isolation trench 54 and covering the upper portion 21A of the gate insulating film 21 arranged on the first side surface 18a, and the second impurity diffusion region 29 arranged in an entire portion of the semiconductor substrate 13 located between the two gate electrode trenches 18 and covering the entire gate insulating film 21 arranged on the second side surfaces 18b of the two gate electrode trenches 18 are provided. Accordingly, when the first and second transistors 19-1 and 19-2 are operated, the channel region is formed only in the semiconductor substrate 13 contacting a lower portion of the gate insulating film 21 arranged on the first side surface 18a and the semiconductor substrate 13 constituting the bottom 18c of the gate electrode trench 18. Thus, the channel region is not provided in the semiconductor substrate 13 contiguous to the second side surface 18b, that is, between the first and second transistors 19-1 and 19-2.

That is, only two surfaces of the one side surface (the first side surface 18a) and a bottom (bottom 18c) among three surfaces constituting the gate electrode trench 18 may be a channel region, and the other side surface (the second side surface 18b) may not be the channel region.

Accordingly, when the first and second transistors 19-1 and 19-2 are in an on state, a channel region in which on current flows can be reduced in comparison with a conventional transistor. Accordingly, even in a miniaturized memory cell, channel resistance can be reduced to increase on current.

Further, when one of the first and second transistors 19-1 and 19-2 operates, the other transistor can be suppressed from malfunctioning.

Accordingly, even when the semiconductor device 10 is miniaturized and the gate electrode 22 is arranged with a small pitch, the first and second transistors 19-1 and 19-2 can be operated independently and stably.

Referring to FIG. 2, the aperture 32 is formed between the buried insulating films 24 protruding from the two gate electrode trenches 18. The aperture 32 is formed to expose an upper surface 29a of the second impurity diffusion region 29.

Referring to FIG. 2, the bit line contact plug 33 is provided to bury the aperture 32 and is integrally formed with the bit line 34. The lower end of the bit line contact plug 33 contacts the upper surface 29a of the second impurity diffusion region 29. If the bit line 34 is formed of a stacked film by sequentially stacking a polysilicon film, a titanium nitride (TiN) film, and a tungsten (W) film, the bit line contact plug 33 can be formed of a polysilicon film.

Referring to FIG. 2, the bit line 34 is provided in the upper surface 24a of the buried insulating film 24 and integrally formed with the bit line contact plug 33. Accordingly, the bit line 34 is electrically connected with the second impurity diffusion region 29 via the bit line contact plug 33.

A stacked film formed by sequentially stacking a polysilicon film, a titanium nitride film and a tungsten film, a polysilicon film, a titanium nitride film, or the like may be used as a material of the bit line 34.

Referring to FIG. 2, the cap insulating film 36 is provided to cover an upper surface of the bit line 34. The cap insulating film 36 protects the upper surface of the bit line 34 and functions as an etching mask when a base material that becomes the bit line 34 is patterned by anisotropic etching (specifically, dry etching). A stacked film formed by sequentially stacking a silicon nitride film (SiN film) and a silicon oxide film (SiO$_2$ film) may be used as the cap insulating film 36.

Referring to FIG. 2, the sidewall film 37 is provided to cover a side surface of the bit line 34. The sidewall film 37 has a function of protecting a sidewall of the bit line 34. A stacked film formed by sequentially stacking a silicon nitride film (SiN film) and a silicon oxide film (SiO$_2$ film) may be used as the sidewall film 37.

Referring to FIG. 2, the interlayer insulating film 38 is provided on the upper surface 26a of the mask insulating film 26 and the upper surface 55a of the second element isolation insulating film 55. An upper surface 38a of the interlayer insulating film 38 is flush with the upper surface 36a of the cap insulating film 36. For example, a silicon oxide film (SiO$_2$ film) formed using CVD (Chemical Vapor Deposition) or a coated insulating film (silicon oxide film (SiO$_2$ film)) formed using SOG (Spin on Glass) may be used as the interlayer insulating film 38.

Referring to FIG. 2, the contact hole 41 is formed in the pad insulating film 13, the buried insulating film 24, and the interlayer insulating film 38 to expose part of the upper surface 28a of the first impurity diffusion region 28.

Referring to FIG. 2, the capacitive contact plug 42 is provided to bury the contact hole 41. A lower end of the capacitive contact plug 42 contacts part of the upper surface 28a of the first impurity diffusion region 28. Accordingly, the capacitive contact plug 42 is electrically connected with the first impurity diffusion region 28. An upper surface 42a of the capacitive contact plug 42 is flush with the upper surface 38a of the interlayer insulating film 38. The capacitive contact plug 42 may be, for example, a stacked structure formed by sequentially stacking a titanium nitride film and a tungsten film.

Referring to FIG. 2, the capacitive contact pad 44 is provided on the upper surface 38a of the interlayer insulating film 38 so that part of the capacitive contact pad 44 connects to the upper surface 42a of the contact plug 42. A lower electrode 57 forming a capacitor 48 is connected to the capacitive contact pad 44.

Accordingly, the capacitive contact pad 44 electrically connects the contact plug 42 with the lower electrode 57.

Referring to FIG. 1, the capacitive contact pad 44 is circular and arranged in a position different from the capacitive contact plug 42 in the Y direction. The capacitive contact pads 44 are arranged between the adjacent bit lines 34 in the X direction.

That is, the capacitive contact pads 44 are repeatedly arranged in a staggered arrangement, in which a center portion of the capacitive contact pad 44 is arranged on the gate electrode 22 or upward from the side surface of the gate electrode 22 at one interval in the Y direction. In other words, the capacitive contact pads 44 are arranged in a flock formation in the Y direction.

Referring to FIG. 2, the silicon nitride film 46 is provided on the upper surface 38a of the interlayer insulating film 38 to surround an outer peripheral portion of the capacitive contact pad 44.

One capacitor 48 is provided for each capacitive contact pad 44.

Each capacitor 48 includes a lower electrode 57, a capacitive insulating film 62 that is common to a plurality of lower electrodes 57, and an upper electrode 59 that is common to the plurality of lower electrodes 57.

The lower electrode 57 is provided on the capacitive contact pad 44 and connected with the capacitive contact pad 44. The lower electrode 57 is crown-shaped. The capacitive insulating film 58 is provided to cover surfaces of the plurality of lower electrodes 57 exposed from the silicon nitride film 46 and the upper surface of the silicon nitride film 46.

The upper electrode 59 is provided to cover a surface of the capacitive insulating film 58. The upper electrode 59 is arranged to bury the inside of the lower electrode 57 in which the capacitive insulating film 58 is formed and spaces between the plurality of lower electrodes 57. An upper surface 59a of the upper electrode 59 is arranged upward from upper ends of the plurality of lower electrodes 57.

The formed capacitor 48 is electrically connected with the first impurity diffusion region 28 via the capacitive contact pad 44.

Further, an interlayer insulating film (not shown) covering the upper surface 59a of the upper electrode 59, a contact plug (not shown) provided in the interlayer insulating film, a wiring (not shown) connected with the contact plug, and the like may be provided.

The semiconductor device 10 according to an aspect of the first embodiment has the following configuration: The semiconductor device 10 includes the active region 16 consisting of the semiconductor substrate 13 and extending in the second direction, the plurality of second element isolation trenches 54 extending in the first direction across the active region 16, the first and second transistors 19-1 and 19-2 provided between two of the second adjacent element isolation trenches 54 and arranged to be adjacent in the second direction, one second impurity diffusion region 29 shared between the first and second transistors 19-1 and 19-2 and connected to the bit line 34, two gate electrode trenches 18 sandwiching the second impurity diffusion region 29 therebetween and provided at both sides of the second impurity diffusion region 29, the gate insulating film 21 covering the inner surface of the two gate electrode trenches 18, the gate electrode 22 burying the lower portion of each gate electrode trench 18, and the two first impurity diffusion regions 28 connected to the capacitor 48 provided in the upper surface 13a of the semiconductor substrate 13 between the second element isolation trenches 54 facing the gate electrode trenches 18. The gate electrode trench 18 has the first side surface 18a facing the second element isolation trench 54, the second side surface 18b facing the first side surface 18a via the second impurity diffusion region 29, and the bottom 18c. The first impurity diffusion region 28 includes the upper surface 13a of the semiconductor substrate 13 sandwiched between the first side surface 18a and the second element isolation trench 54 and has the bottom 28b in a higher position than the upper surface 22a of the gate electrode 22. The second impurity diffusion region 29 has a configuration provided in an entire portion from the upper surface 13a of the semiconductor substrate 13 sandwiched at the second side surface 18b to the bottom 18c of the gate electrode trench 18. The semiconductor substrate 13 in a portion contiguous to the second side surface 18b is not the channel regions of the first and second transistors 19-1 and 19-2.

Further, a portion of the semiconductor substrate 13 located downward from the bottom 28b of the first impurity diffusion region 28 and contiguous to the first side surface 18a and a portion of the semiconductor substrate 13 contiguous to the bottom 18c of the gate electrode trench 18 become channel regions of the first and second transistors 19-1 and 19-2.

According to the semiconductor device of the first embodiment, the first impurity diffusion region 28 including the upper surface 13a of the semiconductor substrate 13 sandwiched between the first side surface 18a and the second element isolation trench 54 and having a bottom 28b in a higher position than the upper surface 22a of the gate electrode 22, and the second impurity diffusion region 29 provided in an entire portion from the upper surface 13a of the semiconductor substrate 13 sandwiched at the second side surface 18b to the bottom 18c of the gate electrode trench 18 are provided to thereby form the channel region in only two surfaces of the bottom 18c of the gate electrode trench 18 and the first side surface 18a. Accordingly, channel resistance can be reduced in comparison with a conventional semiconductor device in which a channel region is formed in three surfaces (two opposing side surfaces and a bottom) of a gate electrode trench. Thus, it is possible to sufficiently secure on current of the first and second transistors 19-1 and 19-2.

Further, the two gate electrode trenches 18 are provided at both sides of the second impurity diffusion region 29 to sandwich the second impurity diffusion region 29 and the second impurity diffusion region 29 is provided in an entire portion from the upper surface 13a of the semiconductor substrate 13 sandwiched at the second side surface 18b to the bottom 18c of the gate electrode trench 18, such that the channel region is not formed between the two gate electrode trenches 18.

Accordingly, in a case in which an arrangement pitch of the gate electrode trench 18 is small, the first and second transistors 19-1 and 19-2 can be independently operated so that, when one of the first and second transistors 19-1 and 19-2 is operated, an operation state of the transistor does not interfere with the other adjacent transistor.

Further, the gate electrode 22 arranged to bury the lower portion of the gate electrode trench 18 via the gate insulating film, and the buried insulating film 24 arranged to bury the gate electrode trench 18 and covering the upper surface 22a of the gate electrode 22 are provided, so that the gate electrode 22 does not protrude upward from the surface 13a of the semiconductor substrate 13.

Accordingly, as in the present embodiment, when a DRAM is used as the semiconductor device 10, the bit line 34 or the capacitor 48, which is formed after the gate electrode 22 is formed, can be easily formed. Thus, it is possible to easily fabricate the semiconductor device 10.

Further, the second impurity diffusion region 29 provided in an entire portion of the semiconductor substrate 13 arranged between the two gate electrode trenches 18 and having a bottom protruding downward from the bottoms 18c of the two gate electrode trenches 18 is provided such that a state in which "L" is accumulated in the lower electrode 57 electrically connected with the first transistor 19-1 and "H" is accumulated in the lower electrode 57 electrically connected with the first transistor 19-1 is obtained. In this state, when on/off of the gate electrode 22 (word line) corresponding to the first transistor 19-1 is repeated, electrons e– induced in the channel of the first transistor 19-1 (not shown) are trapped by the bottom of the second impurity diffusion region 29 containing the n-type impurities. Thus, the electrons e– induced in the channel of the first transistor 19-1 can be suppressed from reaching the second impurity diffusion region 29 (drain region) constituting the second transistor 19-2.

Accordingly, generation of a disturbance defect, which means that an accumulation state of one cell is changed due to an operation state of the other adjacent cell, can be suppressed so that H information resulting from electrons e– induced in the channel of the first transistor 19-1 being accumulated in the lower electrode 57 electrically connected with the second transistor 19-2 is not destructed and the state is not changed into an L state.

Further, even in a DRAM in which an interval between the two gate electrodes 22 arranged to be adjacent to each other is equal to or less than 50 nm, the generation of the disturbance defect can be suppressed.

FIGS. 3A through 3C, FIGS. 4A through 4C, FIGS. 5A through 5C, FIGS. 6A through 6C, FIGS. 7A through 7C, FIGS. 8A through 8C, FIGS. 9A through 9C, FIGS. 10A through 10C, FIGS. 11A through 11C, FIGS. 12A through 12C, FIG. 13, FIG. 14, and FIG. 15 are views showing a process of fabricating the memory cell array provided in the semiconductor device according to the first embodiment of the present invention.

Figure 3A:
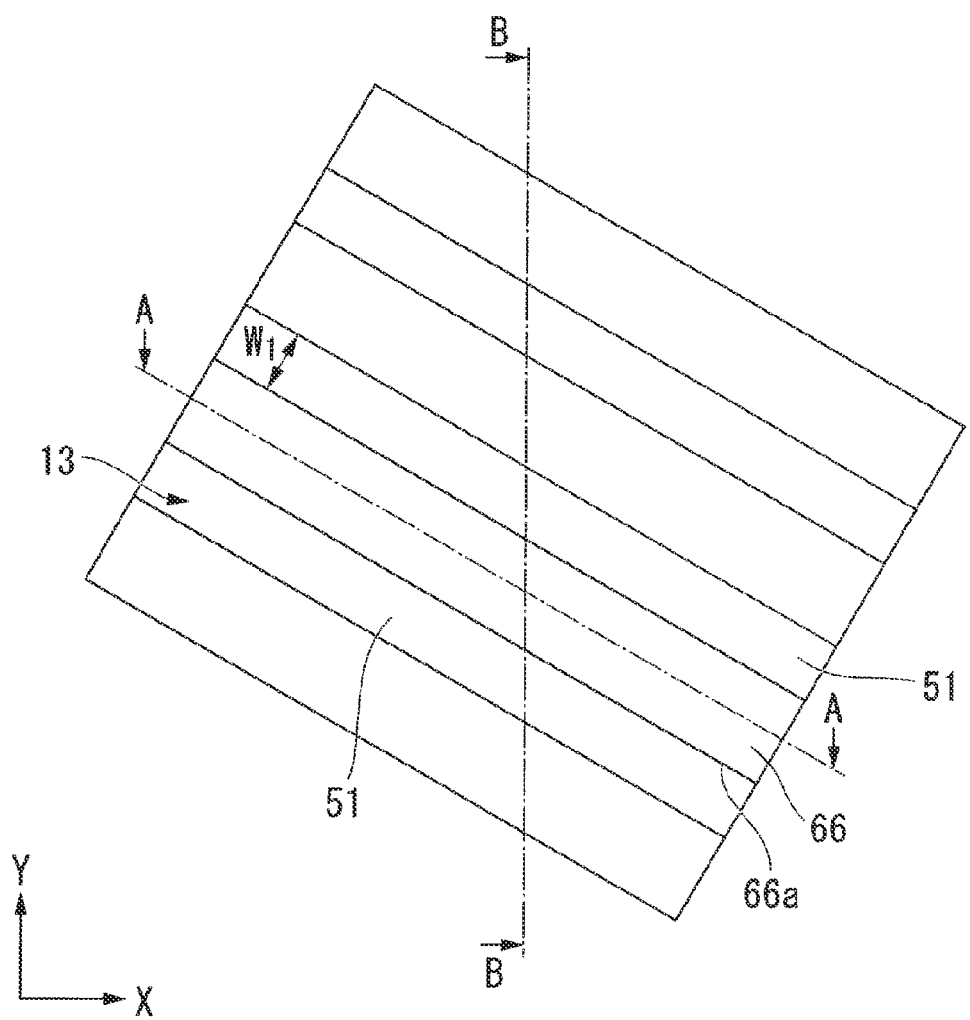
FIG. 3A is a fragmentary plan view of a memory cell array in a step involved in a method of forming the semiconductor device of FIGS. 1 and 2.
Figure 3B:
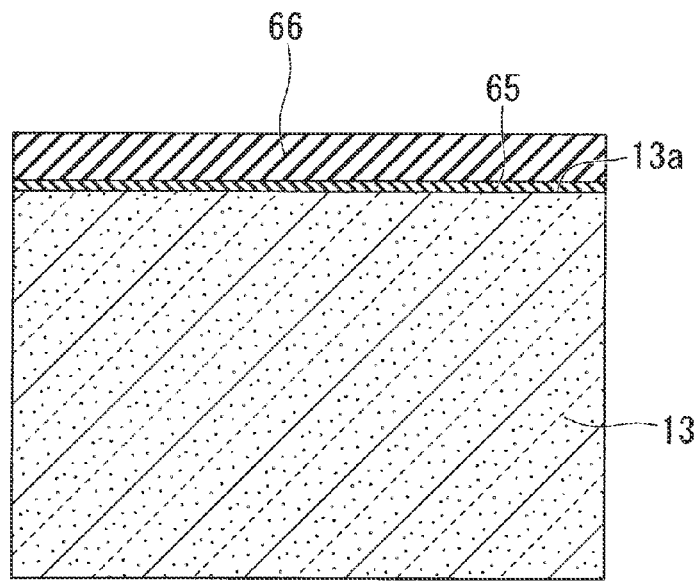
FIG. 3B is a fragmentary cross sectional elevation view, taken along an A-A' line, of a memory cell array in the step of FIG. 3A, involved in the method of forming the semiconductor device of FIGS. 1 and 2.
Figure 3C:
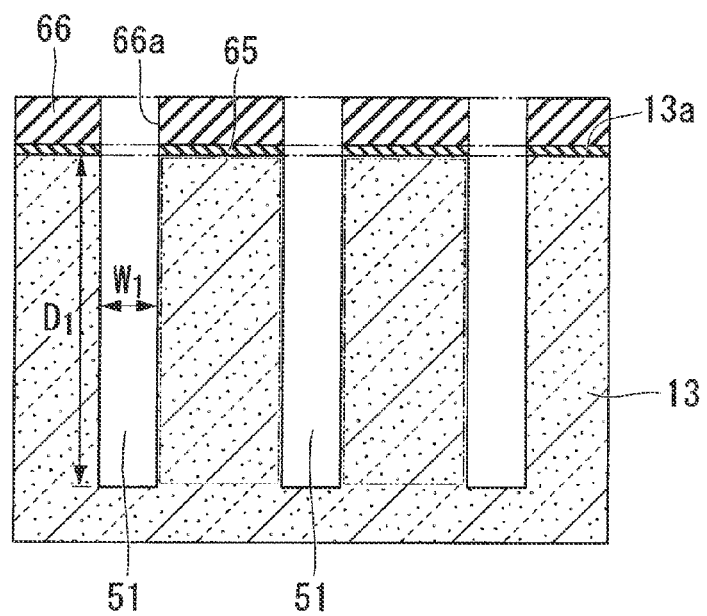
FIG. 3C is a fragmentary cross sectional elevation view, taken along a B-B' line, of the memory cell array in the step of FIG. 3A, involved in the method of forming the semiconductor device of FIGS. 1 and 2.

FIG. 3A is a plan view of a region in which the memory cell array is formed, FIG. 3B is a cross-sectional view taken along a line A-A of a structure shown in FIG. 3A, and FIG. 3C is a cross-sectional view taken along a line B-B of the structure shown in FIG. 3A.

Figure 4A:
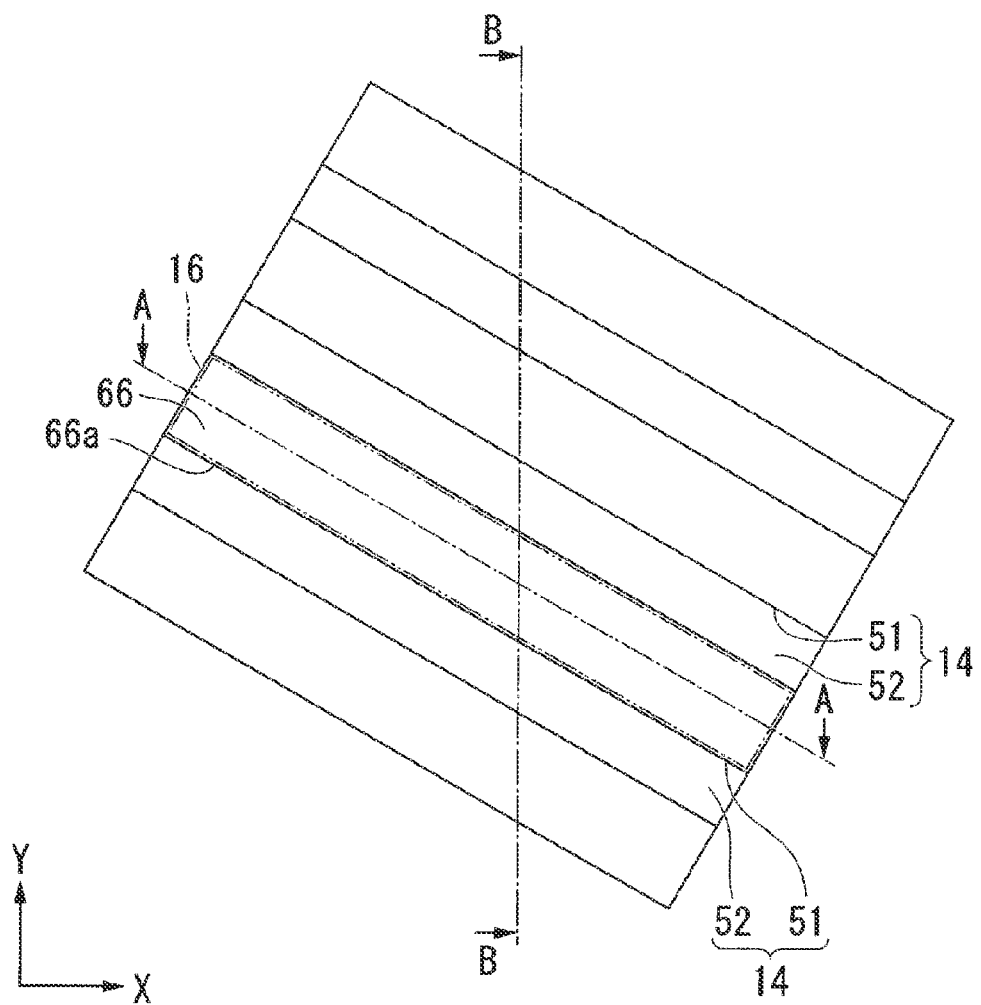
FIG. 4A is a fragmentary plan view of a memory cell array in a step, subsequent to the step of FIGS. 3A, 3B and 3C, involved in the method of forming the semiconductor device of FIGS. 1 and 2.
Figure 4B:
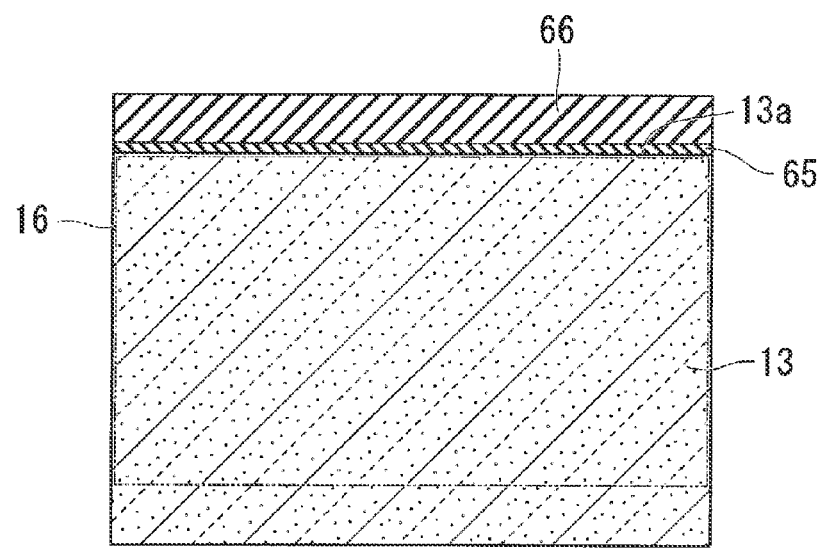
FIG. 4B is a fragmentary cross sectional elevation view, taken along an A-A' line, of a memory cell array in the step of FIG. 4A, involved in the method of forming the semiconductor device of FIGS. 1 and 2.
Figure 4C:
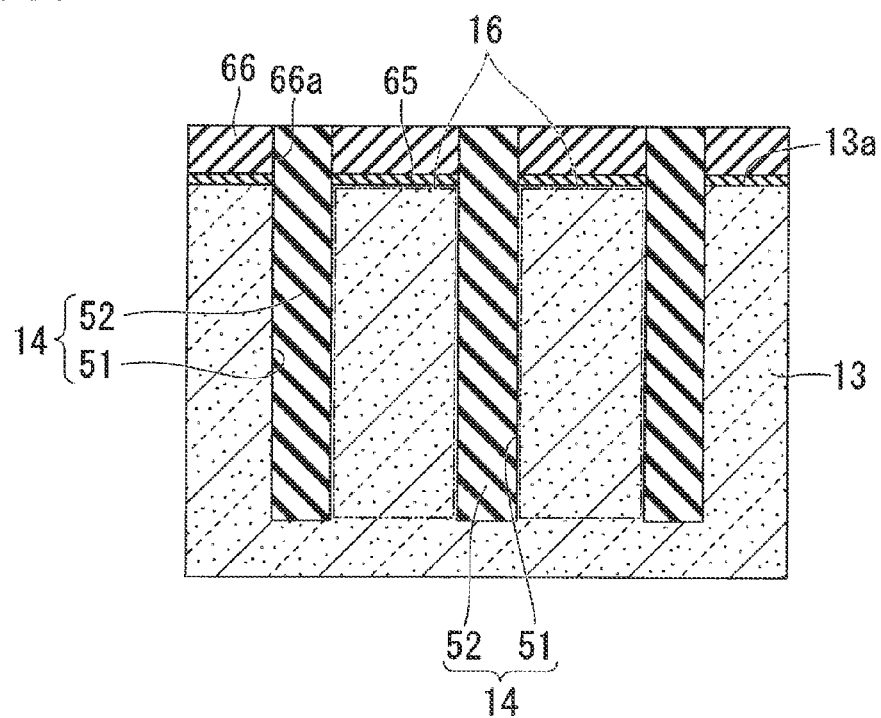
FIG. 4C is a fragmentary cross sectional elevation view, taken along a B-B' line, of the memory cell array in the step of FIG. 4A, involved in the method of forming the semiconductor device of FIGS. 1 and 2.

FIG. 4A is a plan view of a region in which the memory cell array is formed, FIG. 4B is a cross-sectional view taken along a line A-A of a structure shown in FIG. 4A, and FIG. 4C is a cross-sectional view taken along a line B-B of the structure shown in FIG. 4A.

Figure 5A:
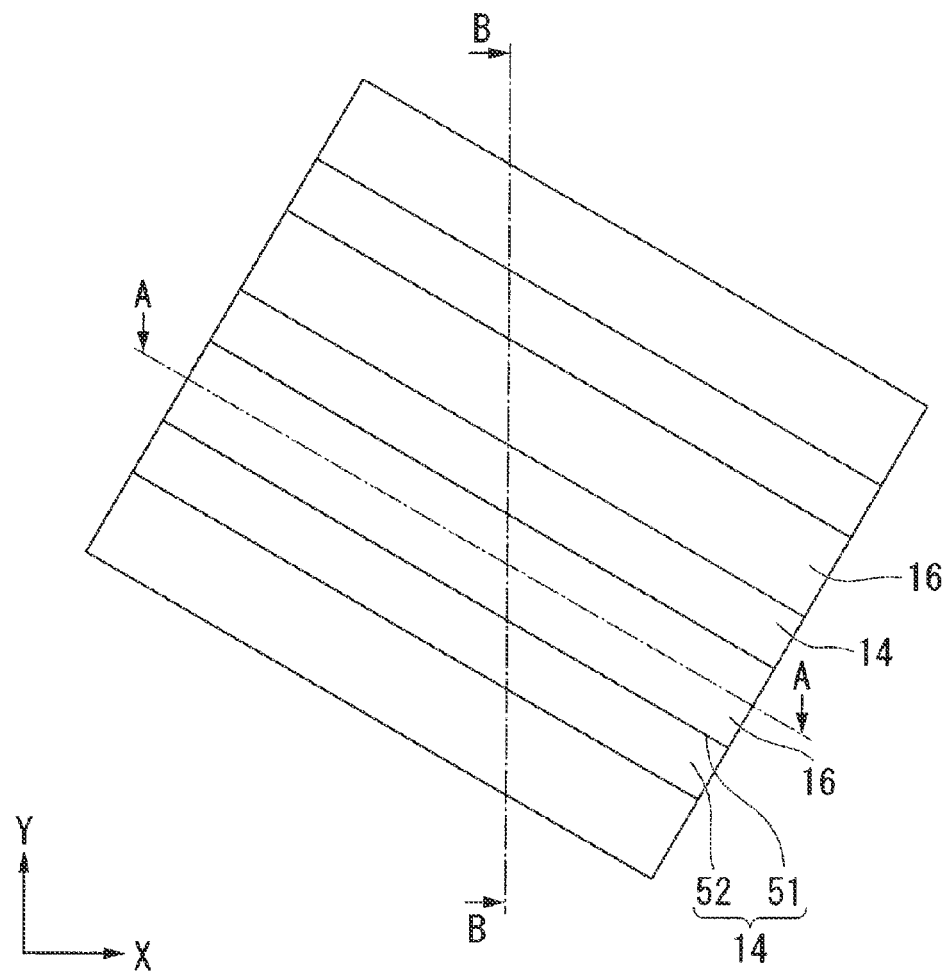
FIG. 5A is a fragmentary plan view of a memory cell array in a step, subsequent to the step of FIGS. 4A, 4B and 4C, involved in the method of forming the semiconductor device of FIGS. 1 and 2.
Figure 5B:
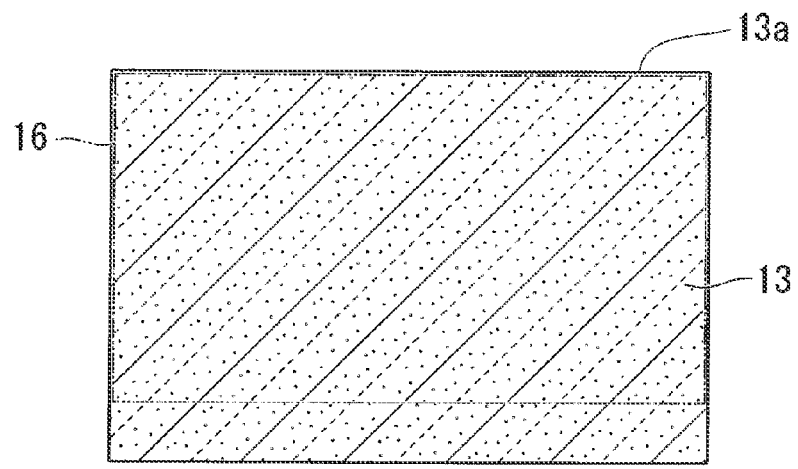
FIG. 5B is a fragmentary cross sectional elevation view, taken along an A-A' line, of a memory cell array in the step of FIG. 5A, involved in the method of forming the semiconductor device of FIGS. 1 and 2.
Figure 5C:
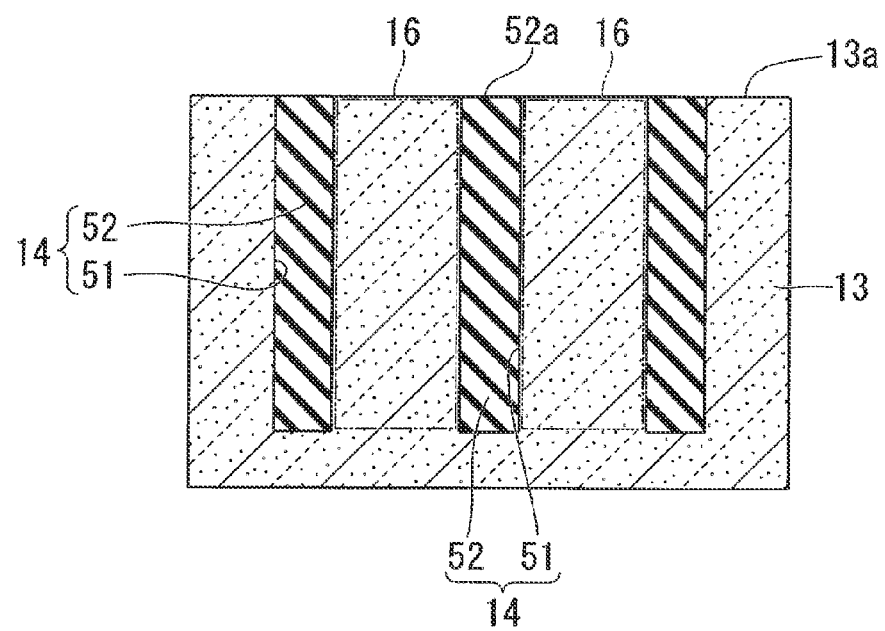
FIG. 5C is a fragmentary cross sectional elevation view, taken along a B-B' line, of the memory cell array in the step of FIG. 5A, involved in the method of forming the semiconductor device of FIGS. 1 and 2.

FIG. 5A is a plan view of a region in which the memory cell array is formed, FIG. 5B is a cross-sectional view taken along a line A-A of a structure shown in FIG. 5A, and FIG. 5C is a cross-sectional view taken along a line B-B of the structure shown in FIG. 5A.

Figure 6A:
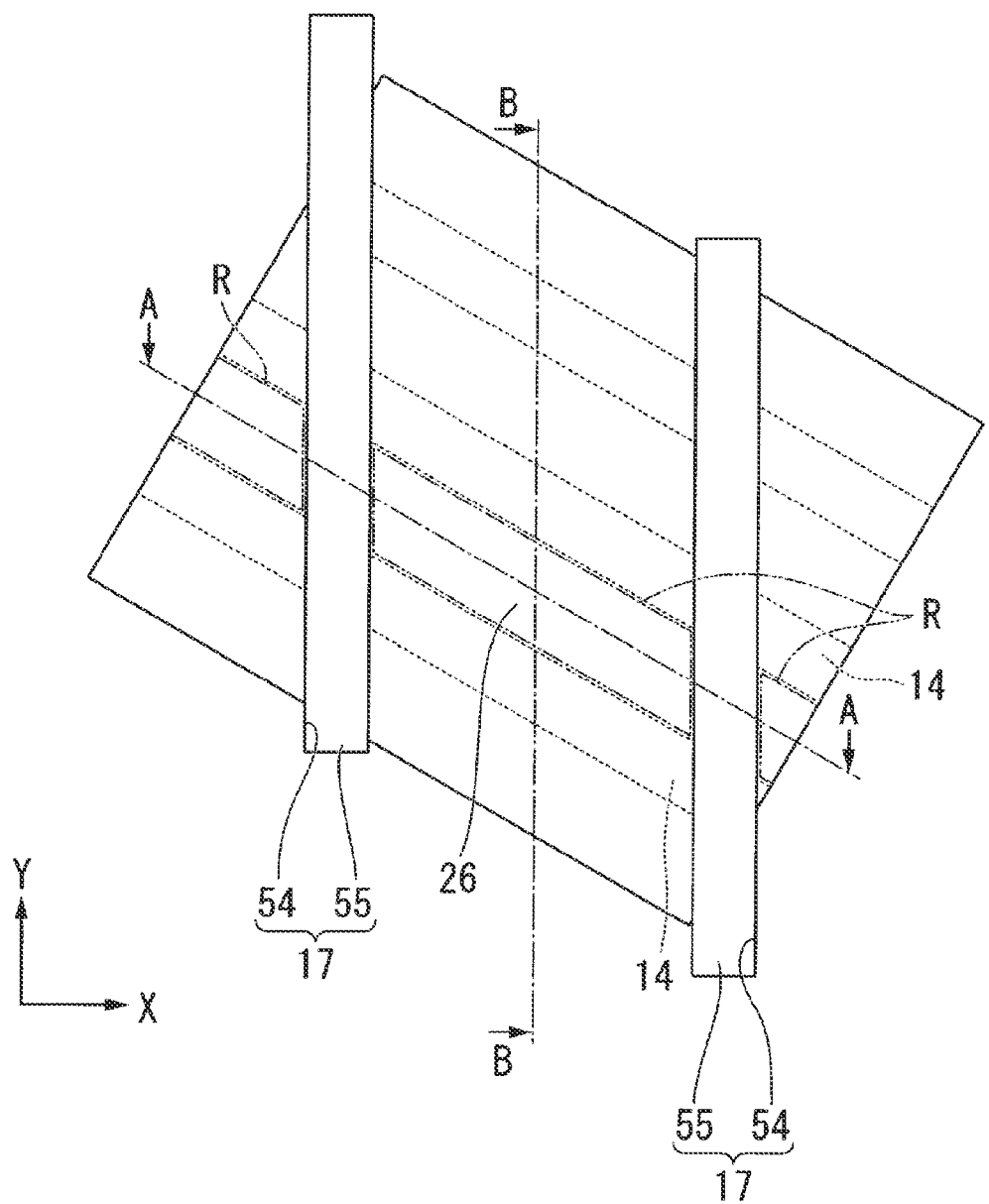
FIG. 6A is a fragmentary plan view of a memory cell array in a step, subsequent to the step of FIGS. 5A, 5B and 5C, involved in the method of forming the semiconductor device of FIGS. 1 and 2.
Figure 6B:
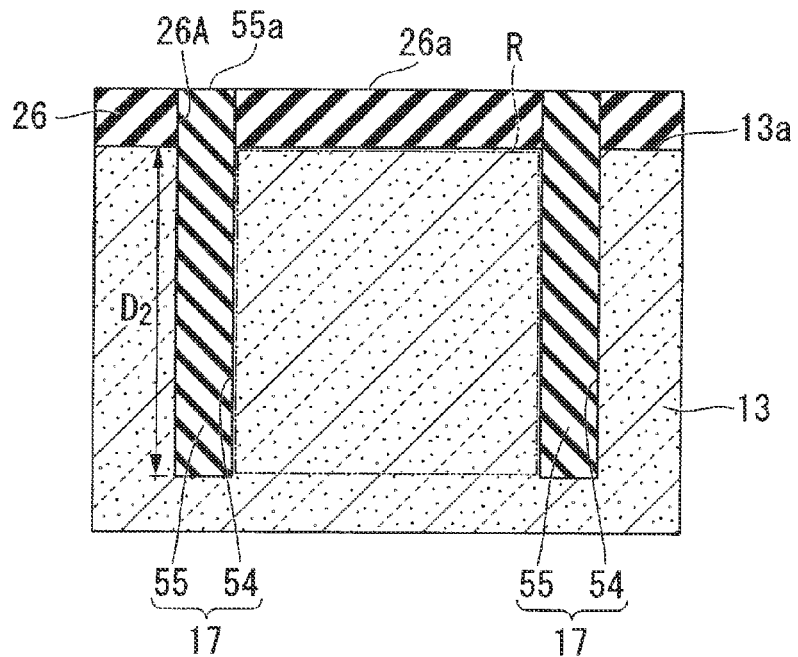
FIG. 6B is a fragmentary cross sectional elevation view, taken along an A-A' line, of a memory cell array in the step of FIG. 6A, involved in the method of forming the semiconductor device of FIGS. 1 and 2.
Figure 6C:
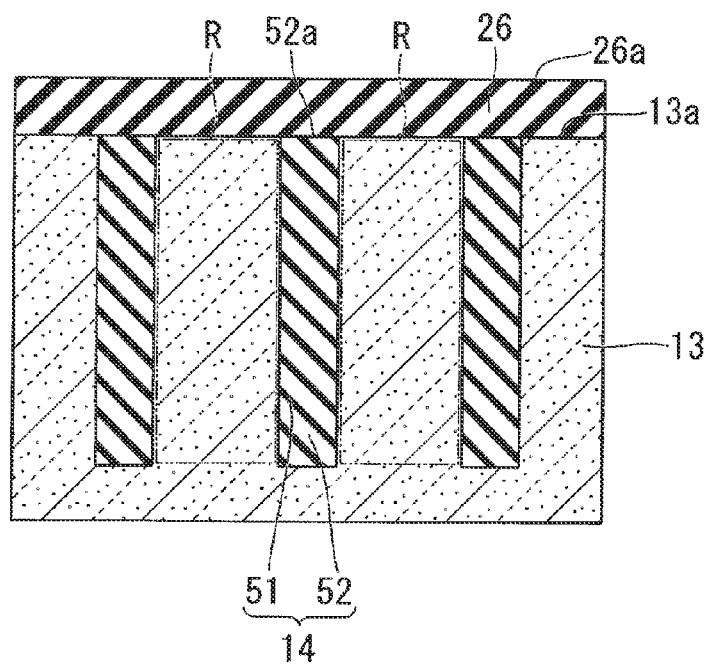
FIG. 6C is a fragmentary cross sectional elevation view, taken along a B-B' line, of the memory cell array in the step of FIG. 6A, involved in the method of forming the semiconductor device of FIGS. 1 and 2.

FIG. 6A is a plan view of a region in which the memory cell array is formed, FIG. 6B is a cross-sectional view taken along a line A-A of a structure shown in FIG. 6A, and FIG. 6C is a cross-sectional view taken along a line B-B of the structure shown in FIG. 6A.

Figure 7A:
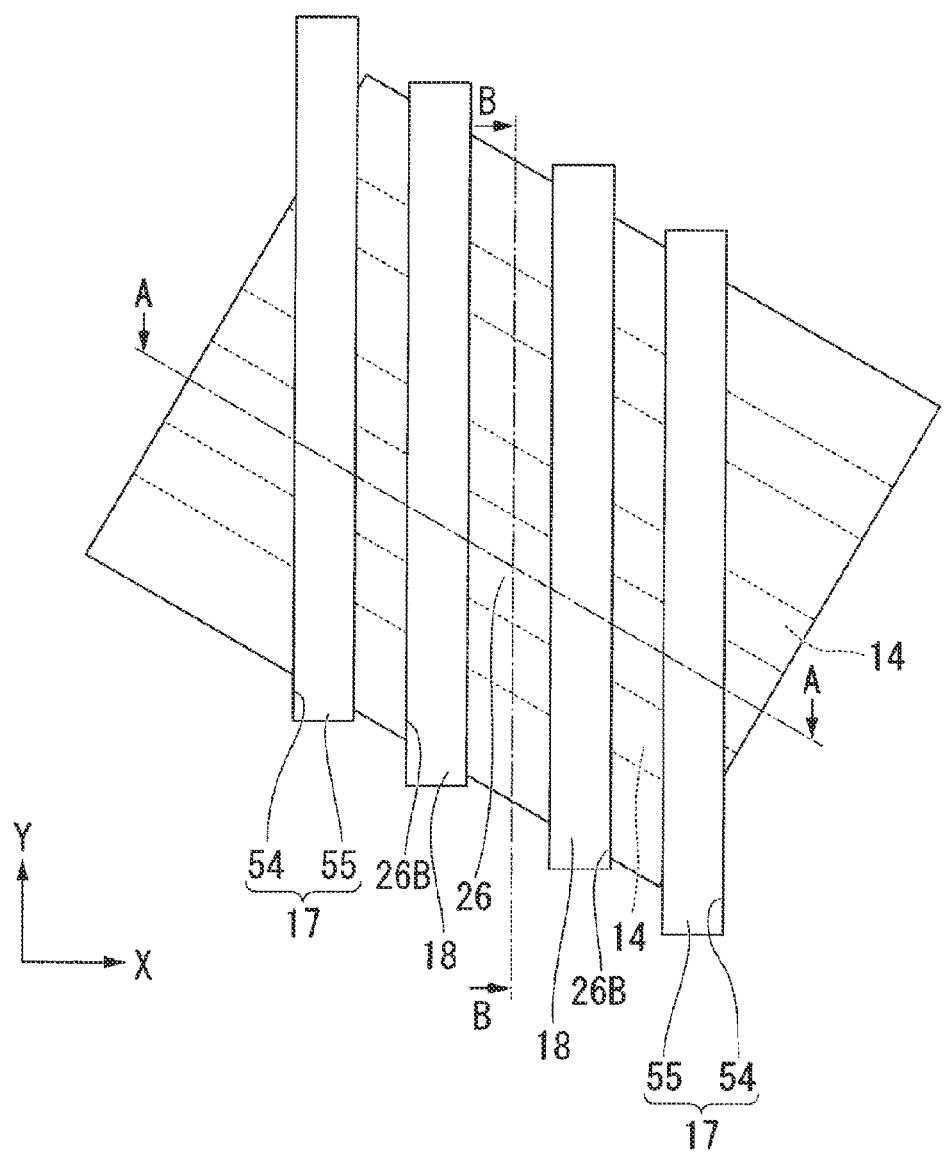
FIG. 7A is a fragmentary plan view of a memory cell array in a step, subsequent to the step of FIGS. 6A, 6B and 6C, involved in the method of forming the semiconductor device of FIGS. 1 and 2.
Figure 7B:
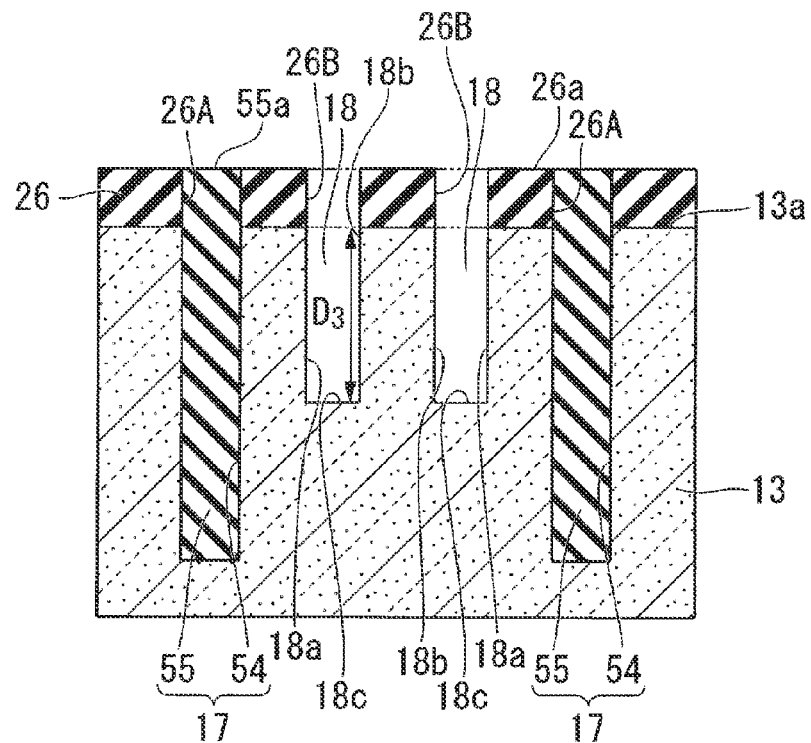
FIG. 7B is a fragmentary cross sectional elevation view, taken along an A-A' line, of a memory cell array in the step of FIG. 7A, involved in the method of forming the semiconductor device of FIGS. 1 and 2.
Figure 7C:
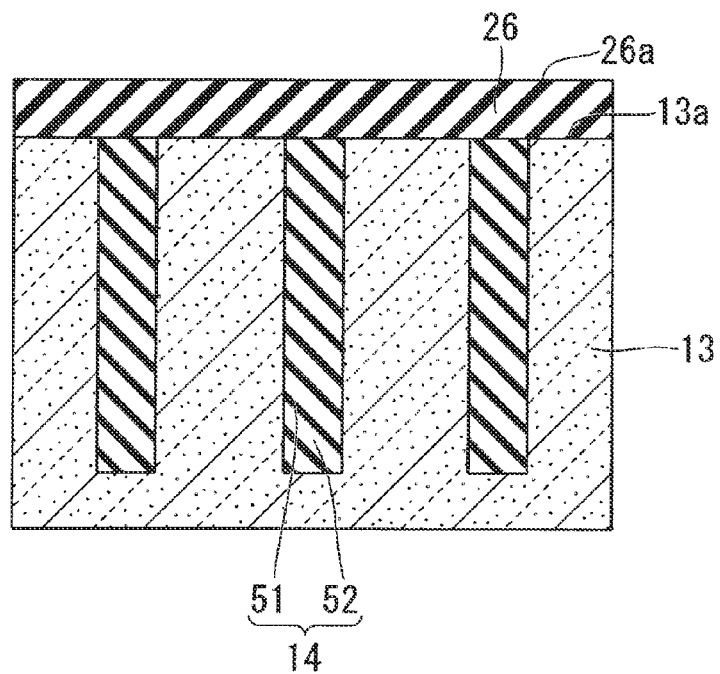
FIG. 7C is a fragmentary cross sectional elevation view, taken along a B-B' line, of the memory cell array in the step of FIG. 7A, involved in the method of forming the semiconductor device of FIGS. 1 and 2.

FIG. 7A is a plan view of a region in which the memory cell array is formed, FIG. 7B is a cross-sectional view taken along a line A-A of a structure shown in FIG. 7A, and FIG. 7C is a cross-sectional view taken along a line B-B of the structure shown in FIG. 7A.

Figure 8A:
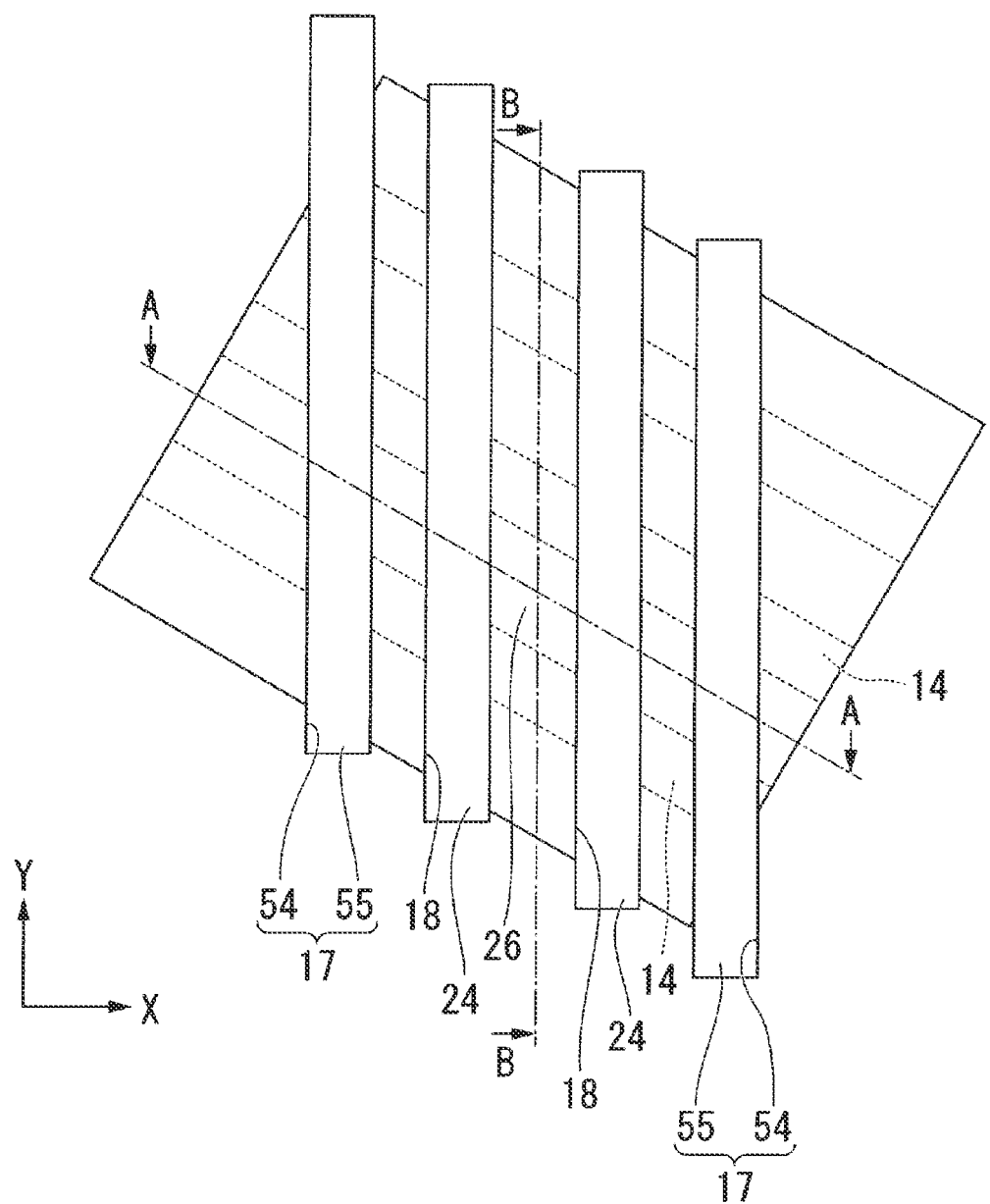
FIG. 8A is a fragmentary plan view of a memory cell array in a step, subsequent to the step of FIGS. 7A, 7B and 7C, involved in the method of forming the semiconductor device of FIGS. 1 and 2.
Figure 8B:
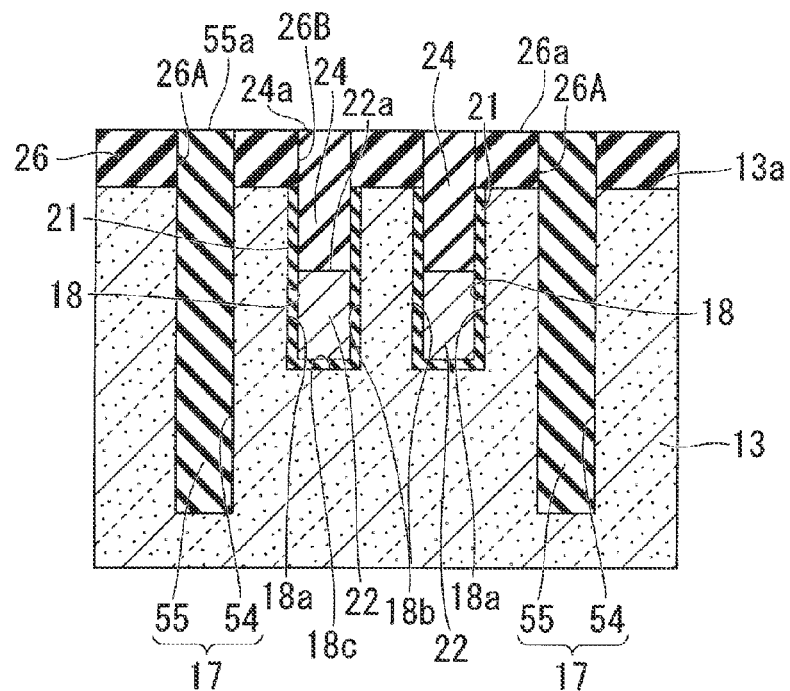
FIG. 8B is a fragmentary cross sectional elevation view, taken along an A-A' line, of a memory cell array in the step of FIG. 8A, involved in the method of forming the semiconductor device of FIGS. 1 and 2.
Figure 8C:
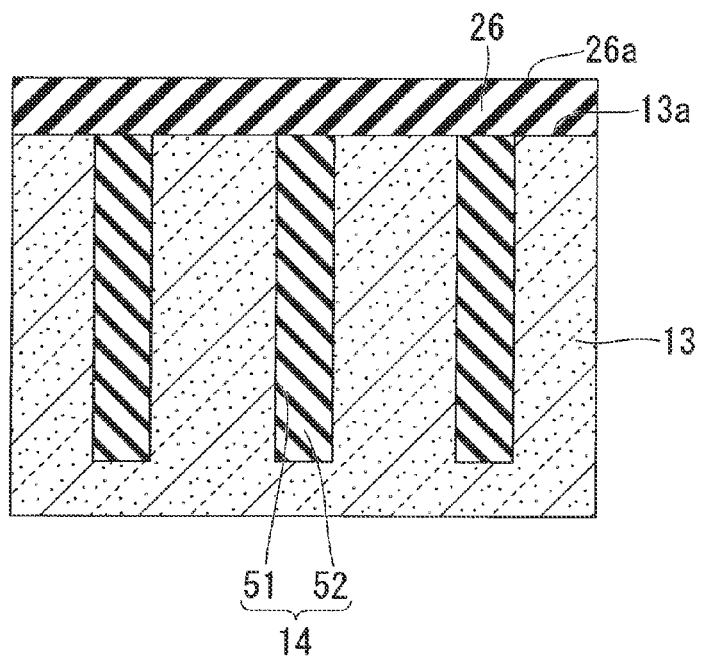
FIG. 8C is a fragmentary cross sectional elevation view, taken along a B-B' line, of the memory cell array in the step of FIG. 8A, involved in the method of forming the semiconductor device of FIGS. 1 and 2.

FIG. 8A is a plan view of a region in which the memory cell array is formed, FIG. 8B is a cross-sectional view taken along a line A-A of a structure shown in FIG. 8A, and FIG. 8C is a cross-sectional view taken along a line B-B of the structure shown in FIG. 8A.

Figure 9A:
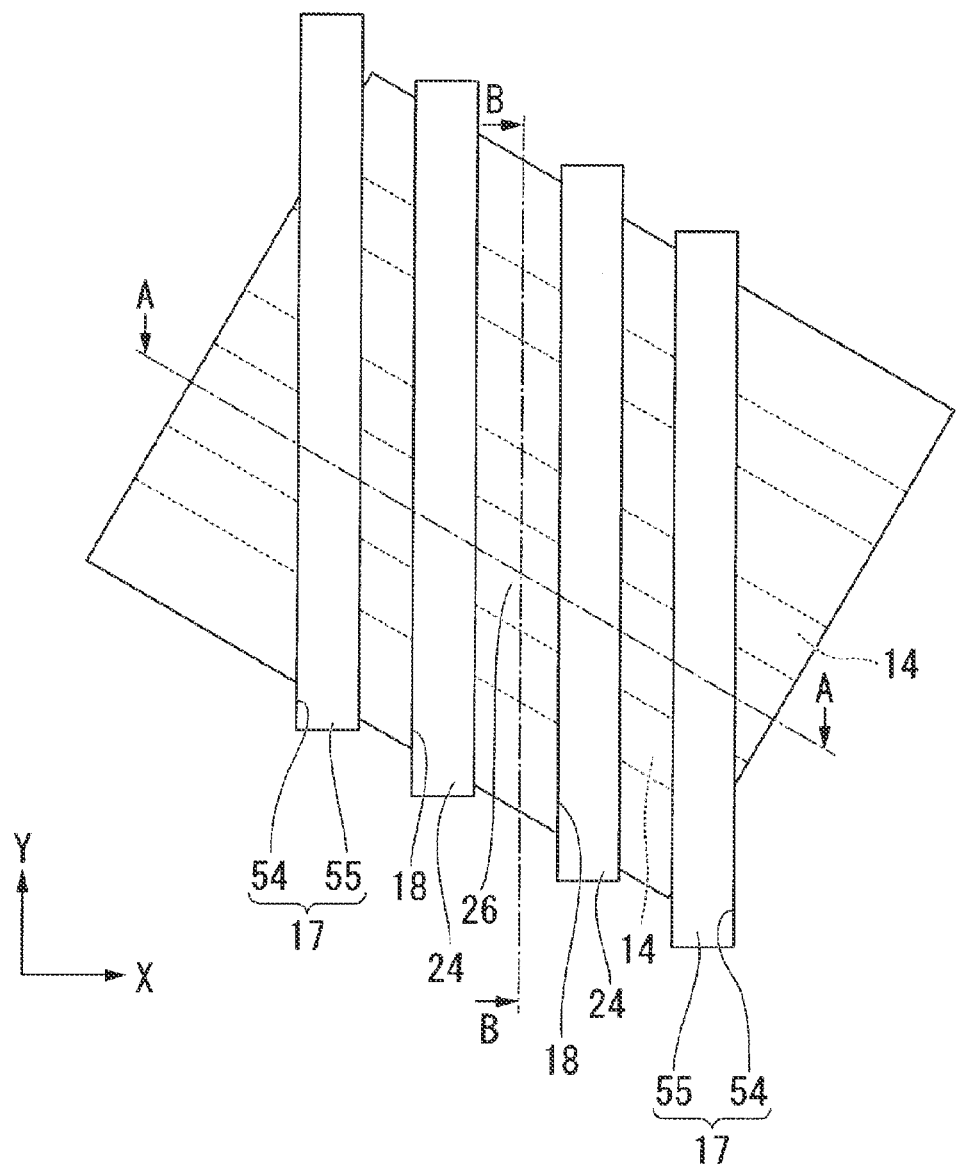
FIG. 9A is a fragmentary plan view of a memory cell array in a step, subsequent to the step of FIGS. 8A, 8B and 8C, involved in the method of forming the semiconductor device of FIGS. 1 and 2.
Figure 9B:
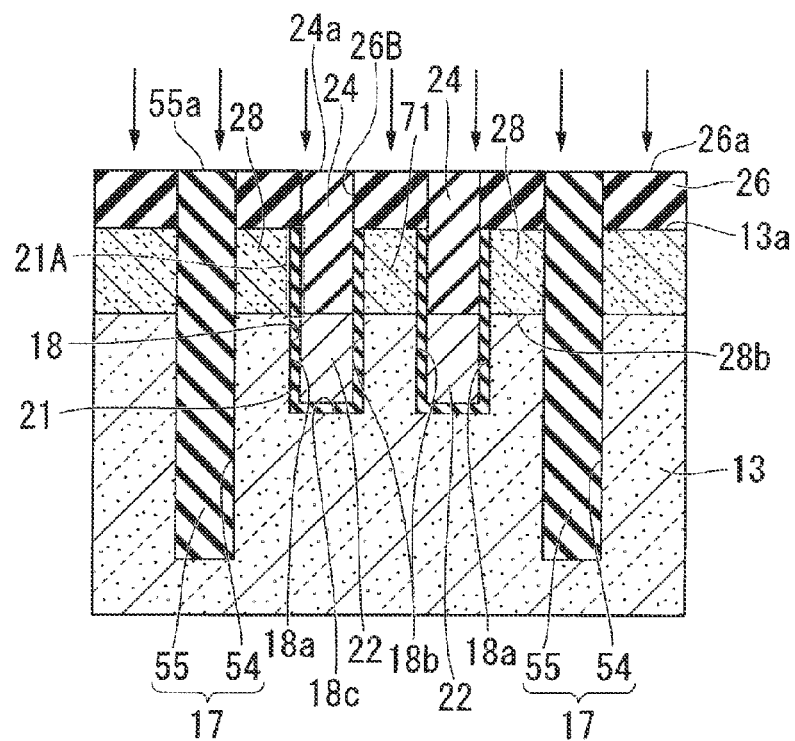
FIG. 9B is a fragmentary cross sectional elevation view, taken along an A-A' line, of a memory cell array in the step of FIG. 9A, involved in the method of forming the semiconductor device of FIGS. 1 and 2.
Figure 9C:
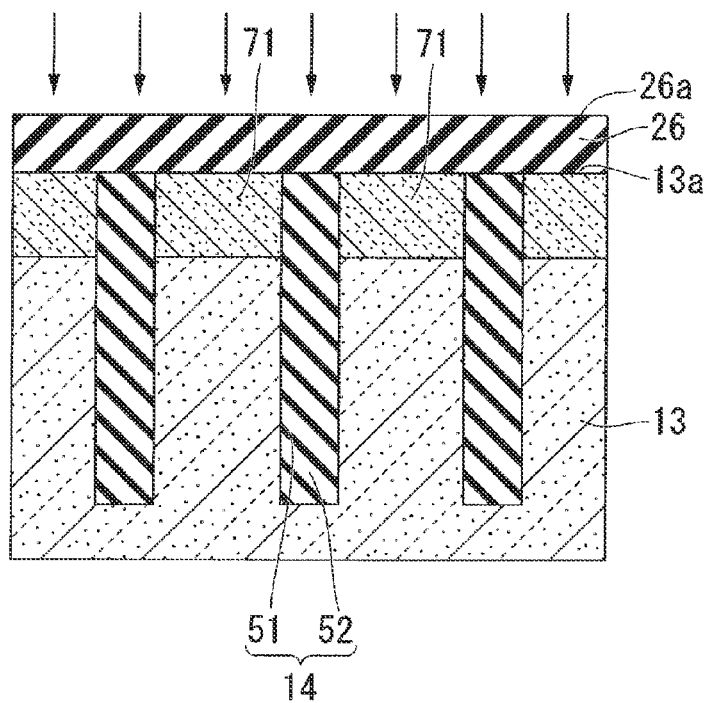
FIG. 9C is a fragmentary cross sectional elevation view, taken along a B-B' line, of the memory cell array in the step of FIG. 9A, involved in the method of forming the semiconductor device of FIGS. 1 and 2.

FIG. 9A is a plan view of a region in which the memory cell array is formed, FIG. 9B is a cross-sectional view taken along a line A-A of a structure shown in FIG. 9A, and FIG. 9C is a cross-sectional view taken along a line B-B of the structure shown in FIG. 9A.

Figure 10A:
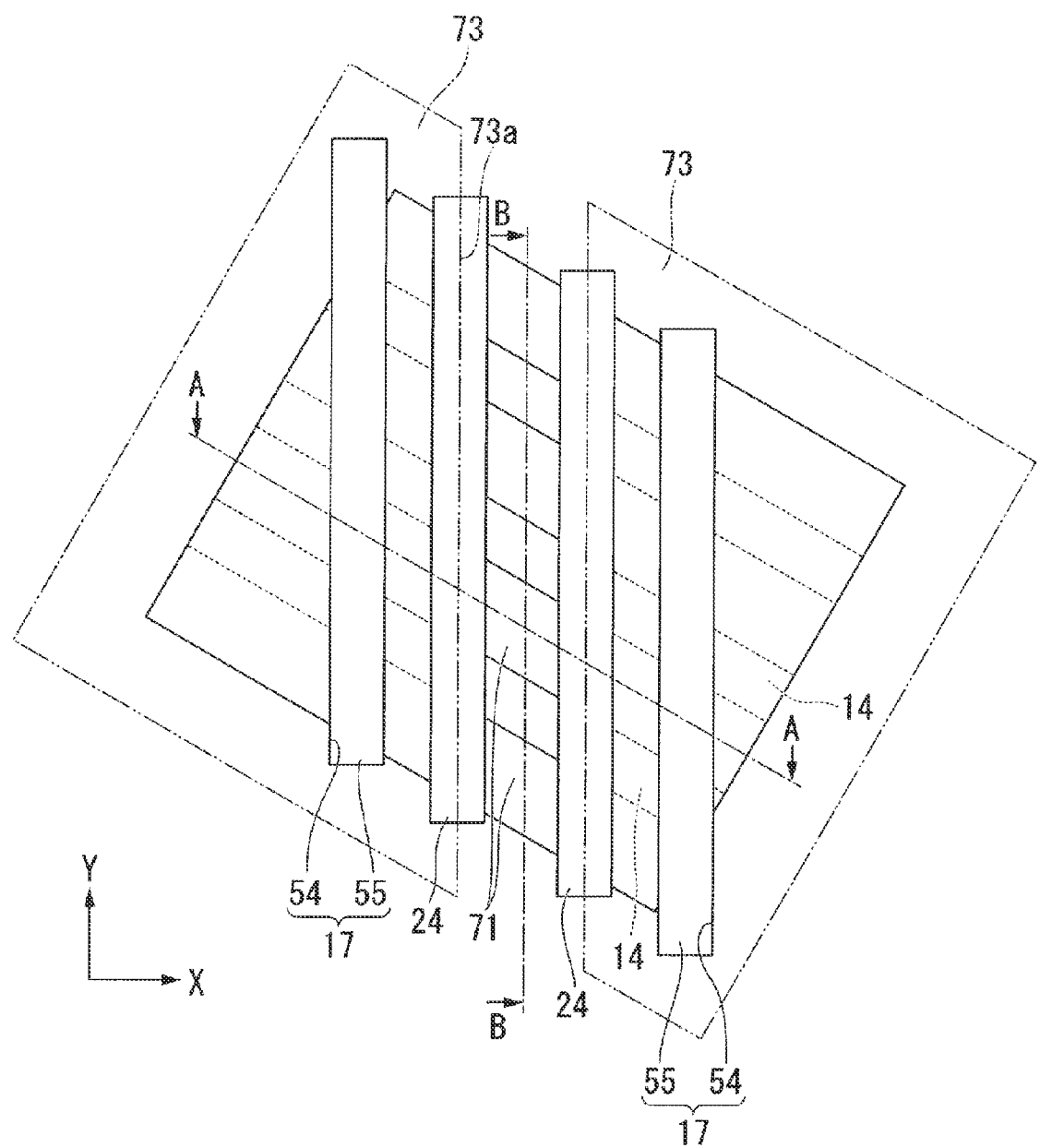
FIG. 10A is a fragmentary plan view of a memory cell array in a step, subsequent to the step of FIGS. 9A, 9B and 9C, involved in the method of forming the semiconductor device of FIGS. 1 and 2.
Figure 10B:
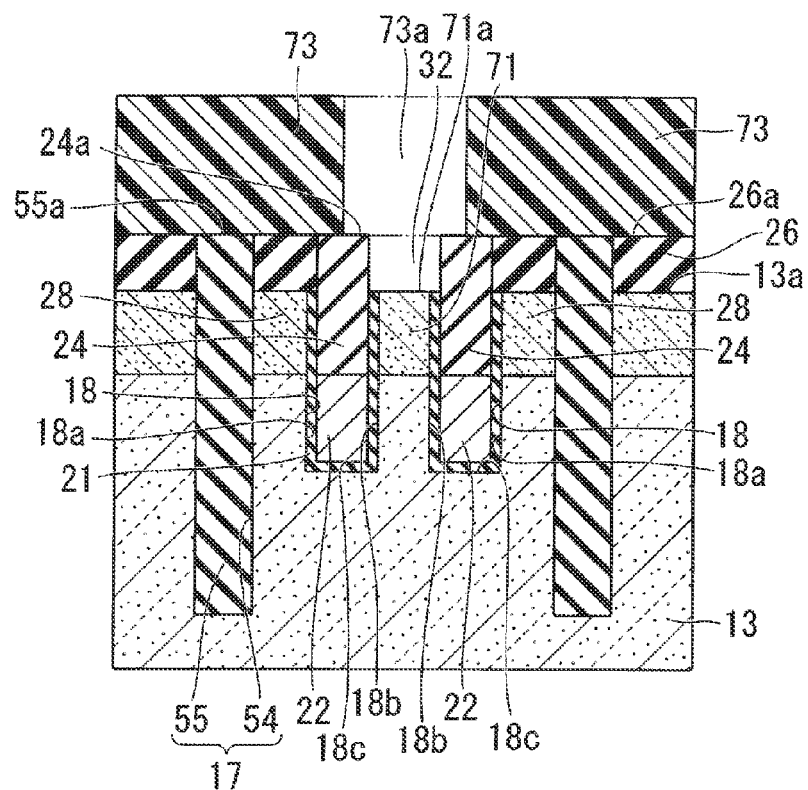
FIG. 10B is a fragmentary cross sectional elevation view, taken along an A-A' line, of a memory cell array in the step of FIG. 10A, involved in the method of forming the semiconductor device of FIGS. 1 and 2.
Figure 10C:
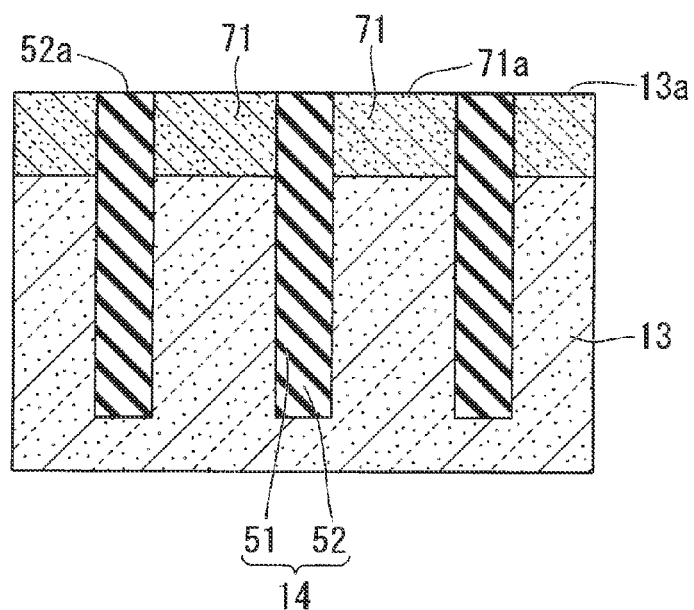
FIG. 10C is a fragmentary cross sectional elevation view, taken along a B-B' line, of the memory cell array in the step of FIG. 10A, involved in the method of forming the semiconductor device of FIGS. 1 and 2.

FIG. 10A is a plan view of a region in which the memory cell array is formed, FIG. 10B is a cross-sectional view taken along a line A-A of a structure shown in FIG. 10A, and FIG. 10C is a cross-sectional view taken along a line B-B of the structure shown in FIG. 10A.

Figure 11A:
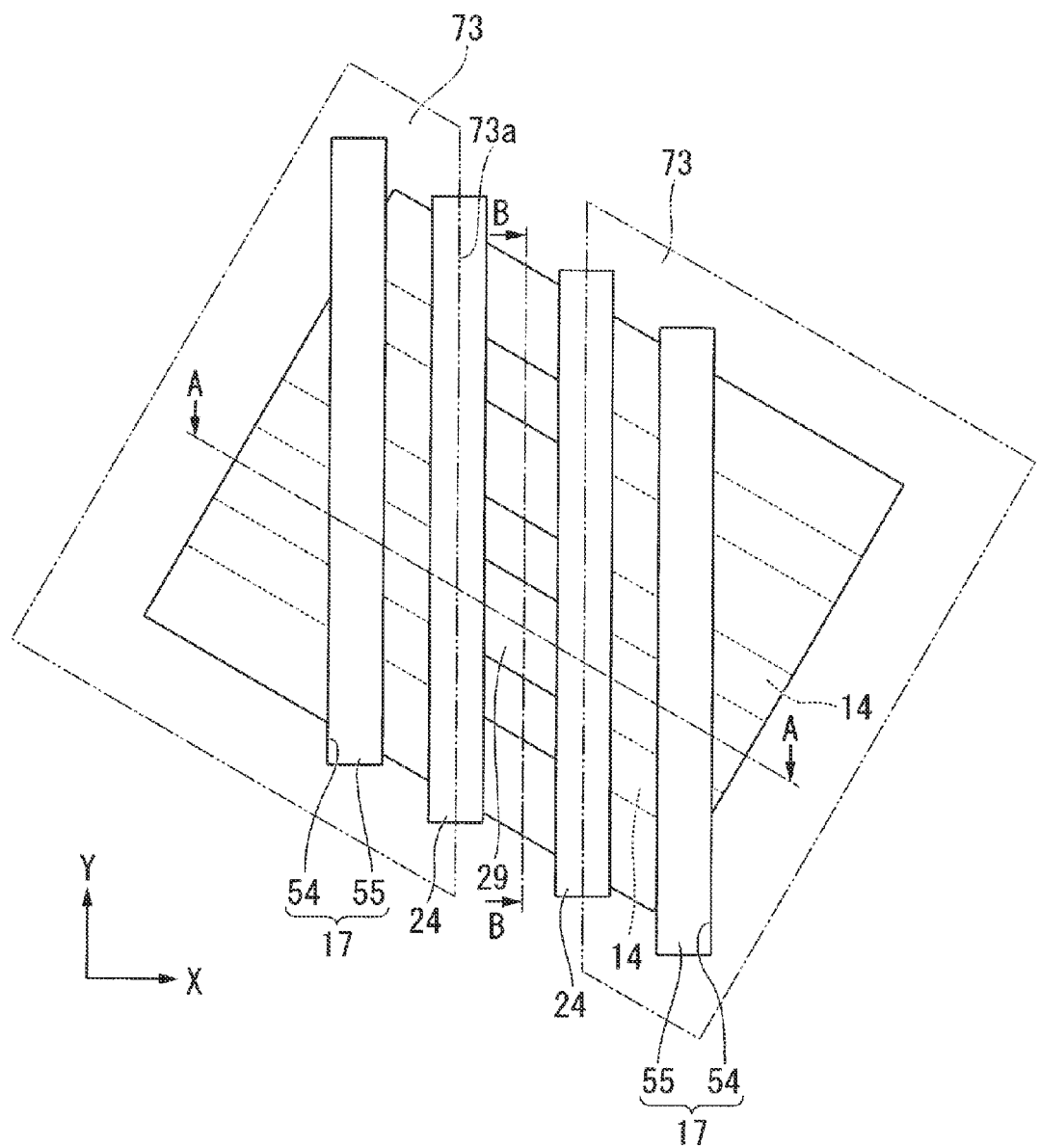
FIG. 11A is a fragmentary plan view of a memory cell array in a step, subsequent to the step of FIGS. 10A, 10B and 10C, involved in the method of forming the semiconductor device of FIGS. 1 and 2.
Figure 11B:
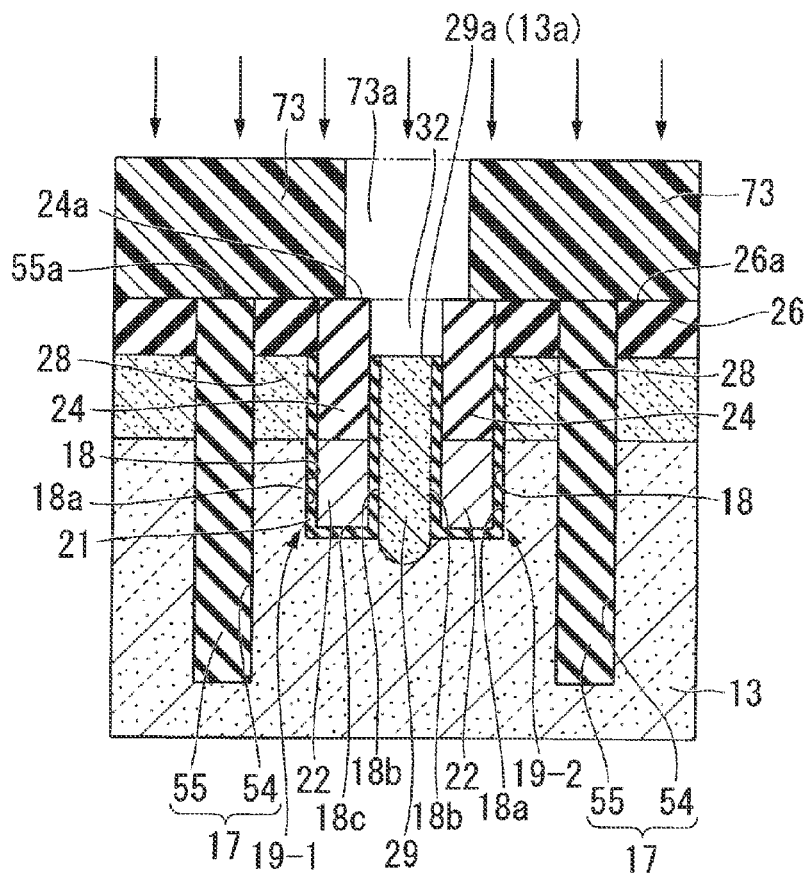
FIG. 11B is a fragmentary cross sectional elevation view, taken along an A-A' line, of a memory cell array in the step of FIG. 11A, involved in the method of forming the semiconductor device of FIGS. 1 and 2.
Figure 11C:
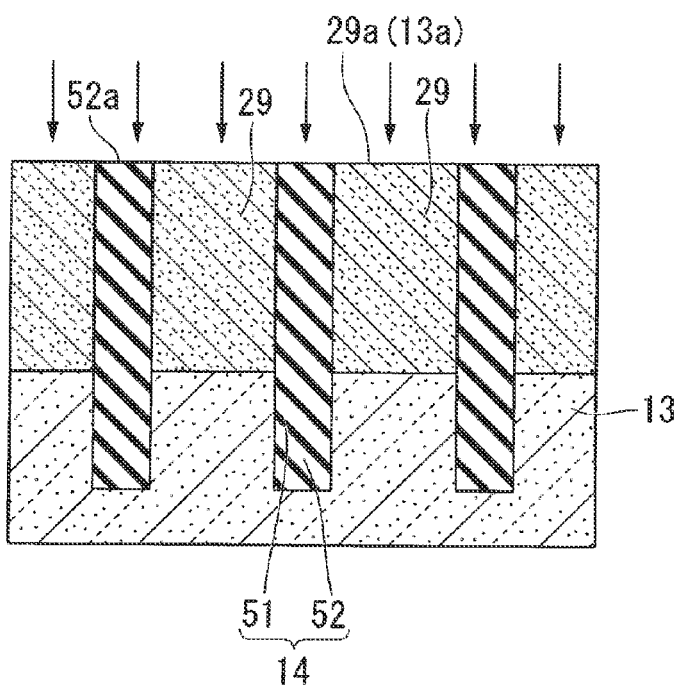
FIG. 11C is a fragmentary cross sectional elevation view, taken along a B-B' line, of the memory cell array in the step of FIG. 11A, involved in the method of forming the semiconductor device of FIGS. 1 and 2.

FIG. 11A is a plan view of a region in which the memory cell array is formed, FIG. 11B is a cross-sectional view taken along a line A-A of a structure shown in FIG. 11A, and FIG. 11C is a cross-sectional view taken along a line B-B of the structure shown in FIG. 11A.

Figure 12A:
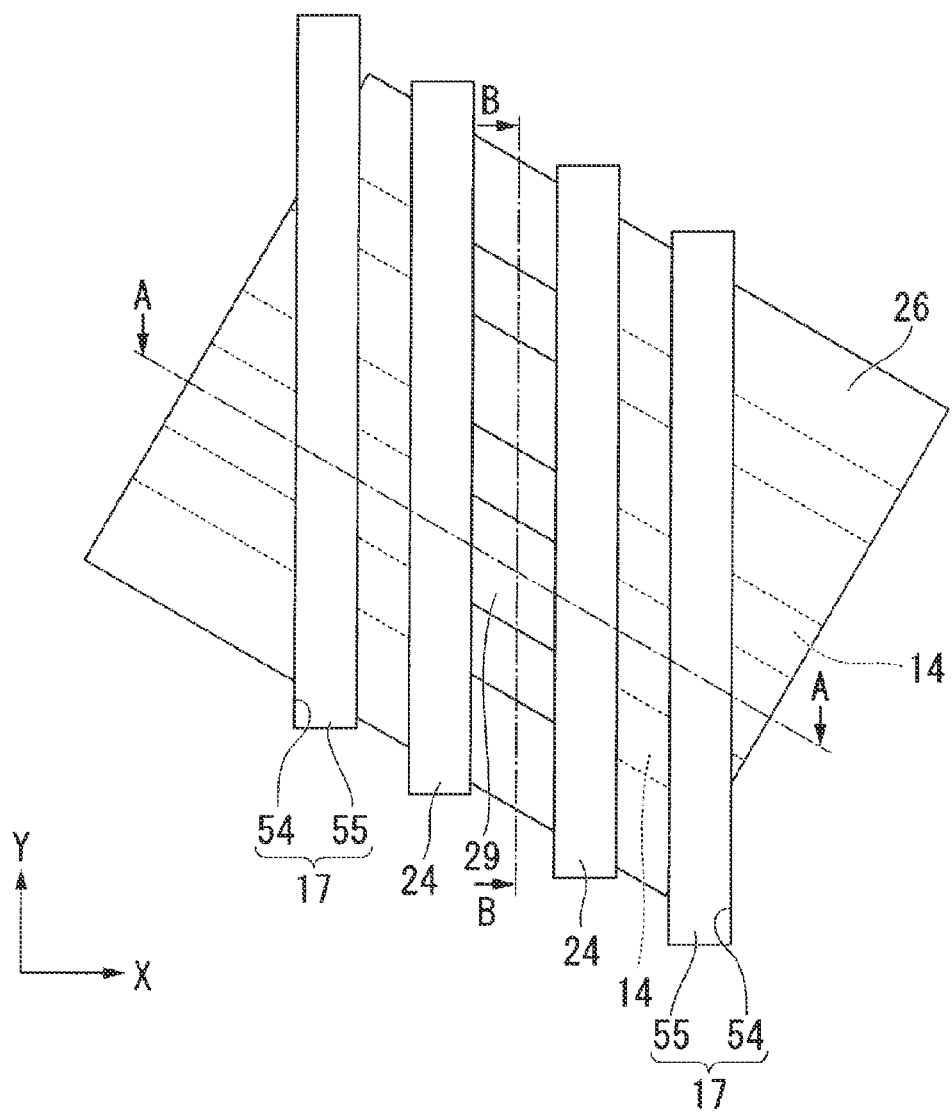
FIG. 12A is a fragmentary plan view of a memory cell array in a step, subsequent to the step of FIGS. 11A, 11B and 11C, involved in the method of forming the semiconductor device of FIGS. 1 and 2.
Figure 12B:
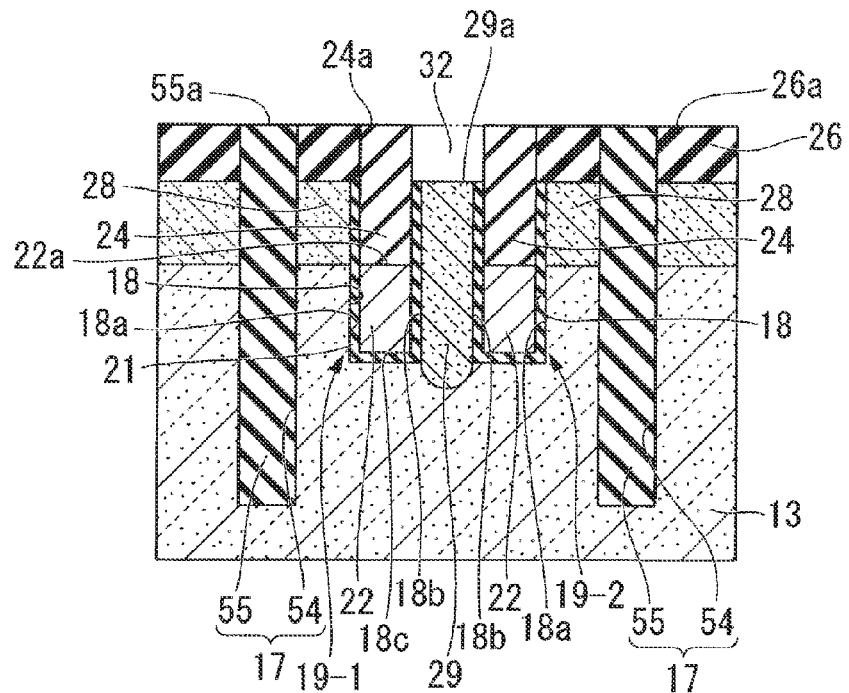
FIG. 12B is a fragmentary cross sectional elevation view, taken along an A-A' line, of a memory cell array in the step of FIG. 12A, involved in the method of forming the semiconductor device of FIGS. 1 and 2.
Figure 12C:
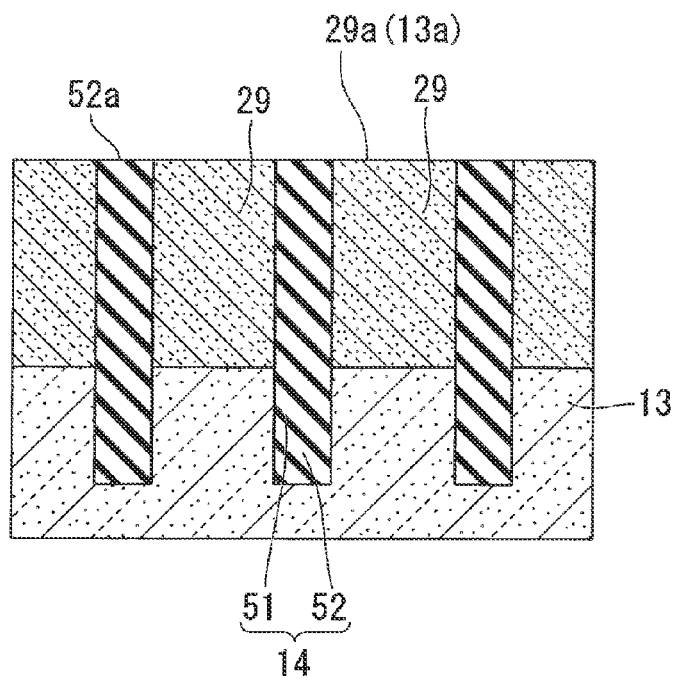
FIG. 12C is a fragmentary cross sectional elevation view, taken along a B-B' line, of the memory cell array in the step of FIG. 12A, involved in the method of forming the semiconductor device of FIGS. 1 and 2.

FIG. 12A is a plan view of a region in which the memory cell array is formed, FIG. 12B is a cross-sectional view taken along a line A-A of a structure shown in FIG. 12A, and FIG. 12C is a cross-sectional view taken along a line B-B of the structure shown in FIG. 12A.

The line A-A shown in FIG. 3A, FIG. 4A, FIG. 5A, FIG. 6A, FIG. 7A, FIG. 8A, FIG. 9A, FIG. 10A, FIG. 11A, and FIG. 12A corresponds to the line A-A shown in FIG. 1.

Figure 13:
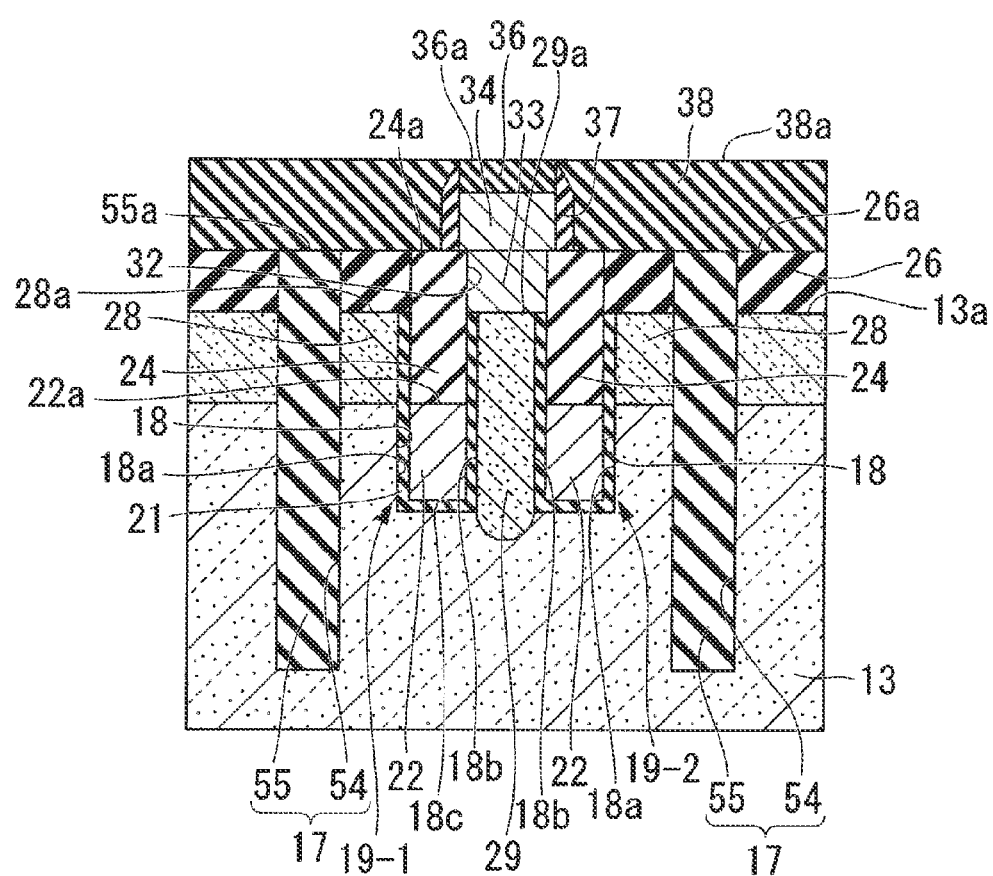
FIG. 13 is a fragmentary cross sectional elevation view with the same section as FIG. 2, of the memory cell array in a step, subsequent to the step of FIGS. 12A, 12B and 12C, involved in the method of forming the semiconductor device of FIGS. 1 and 2.
Figure 14:
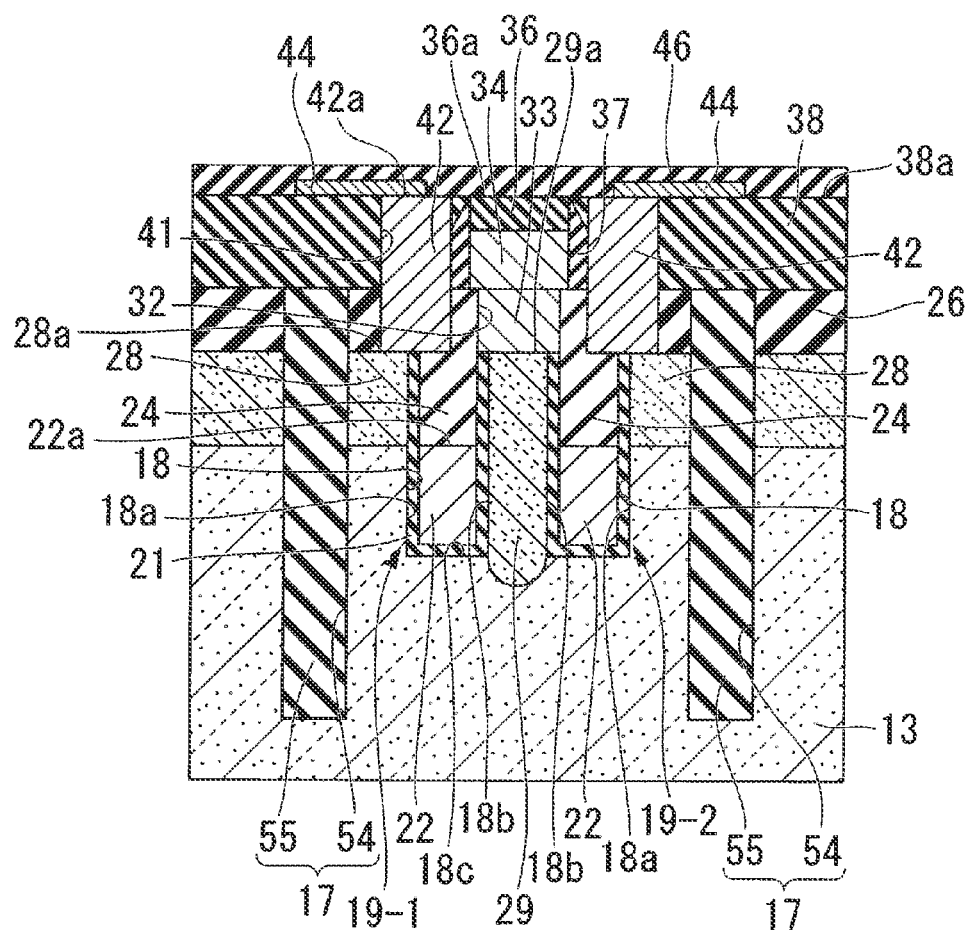
FIG. 14 is a fragmentary cross sectional elevation view with the same section as FIG. 2, of the memory cell array in a step, subsequent to the step of FIG. 13, involved in the method of forming the semiconductor device of FIGS. 1 and 2.
Figure 15:
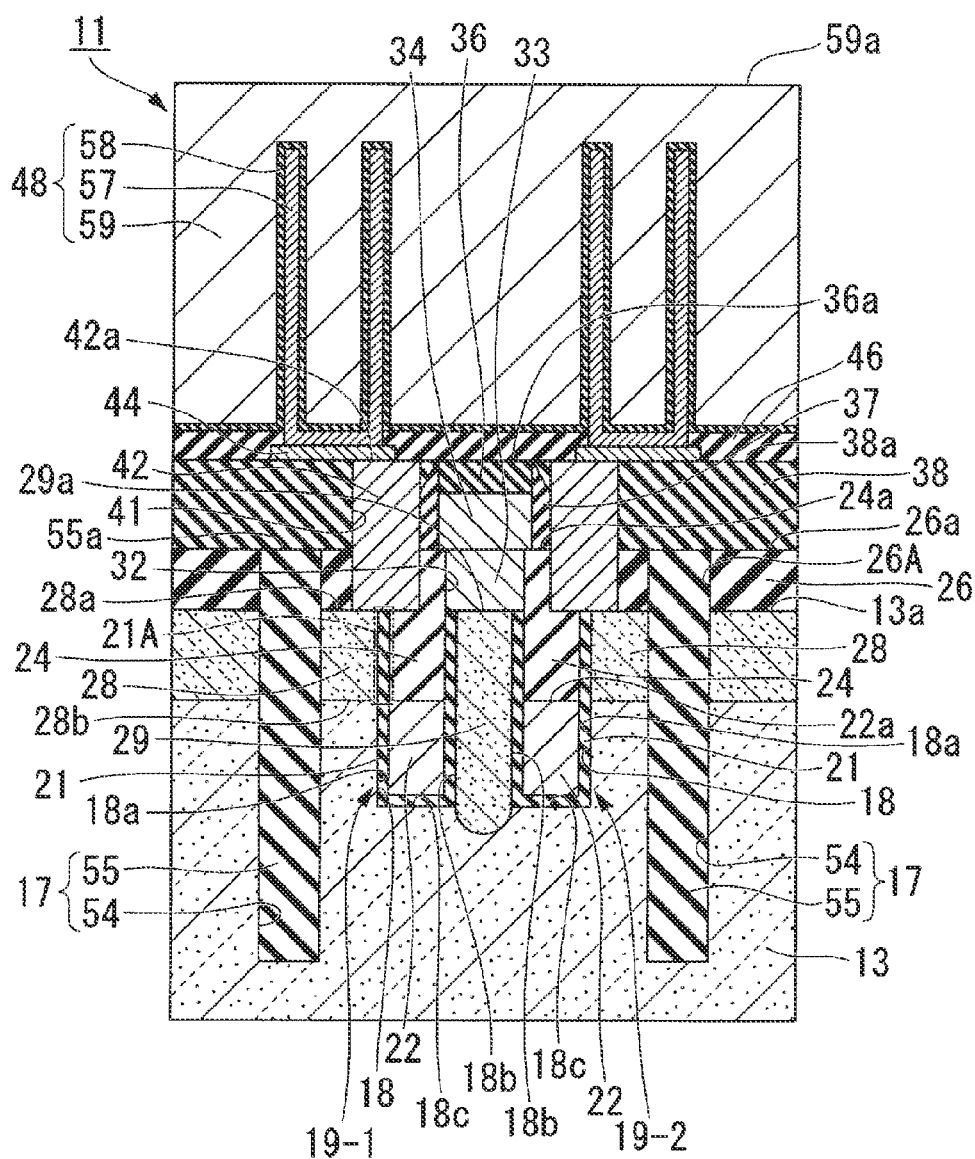
FIG. 15 is a fragmentary cross sectional elevation view with the same section as FIG. 2, of the memory cell array in a step, subsequent to the step of FIG. 14, involved in the method of forming the semiconductor device of FIGS. 1 and 2.

Further, FIGS. 13 through 15 are cross-sectional views, and correspond to a cross-section of the semiconductor device 10 shown in FIG. 2.

A method of fabricating the semiconductor device 10 (specifically, memory cell array 11) according to the first embodiment will be described with reference to FIGS. 3A through 3C, FIGS. 4A through 4C, FIGS. 5A through 5C, FIGS. 6A through 6C, FIGS. 7A through 7C, FIGS. 8A through 8C, FIGS. 9A through 9C, FIGS. 10A through 10C, FIGS. 11A through 11C, FIGS. 12A through 12C, FIG. 13, FIG. 14, and FIG. 15.

First, in a process shown in FIGS. 3A through 3C, a pad oxide film 65 is formed on the main surface 13a of the semiconductor substrate 13. Next, a trench-shaped silicon nitride film 66 having apertures 66a is formed on the pad oxide film 65. As shown in FIG. 3A, the apertures 66a extend in a band shape in a direction (a second direction) tilted at a given angle in an X direction and are formed at given intervals in a Y direction.

In this case, the apertures 66a are formed to expose an upper surface of the pad oxide film 13 corresponding to a forming region of a first element isolation trench 51. The apertures 66a are formed by forming photoresist (not shown) patterned on the silicon nitride film 66 and etching the silicon nitride film 66 through anisotropic etching using the photoresist as a mask. The photoresist is removed after the apertures 66a are formed.

Next, the semiconductor substrate 13 is etched by anisotropic etching (specifically, dry etching) using the silicon nitride film 66 having the apertures 66a as a mask to thereby form the first element isolation trench 51 extending in the second direction.

A width W1 of the first element isolation trench 51 may be, for example, 43 nm. A depth $D_1$ of the first element isolation trench 51 (a depth from the main surface 13a of the semiconductor substrate 13) may be, for example, 250 nm.

Next, in a process shown in FIGS. 4A through 4C, the first element isolation insulating film 52 burying the first element isolation trench 51 is formed.

Specifically, the first element isolation trench 51 is buried with a silicon oxide film ($SiO_2$ film) formed using an HDP (High Density Plasma) method or a coated silicon oxide film ($SiO_2$ film) formed using an SOG method Then, a silicon oxide film ($SiO_2$) formed upward from the upper surface of the silicon nitride film 66 silicon oxide film ($SiO_2$ film) is removed by a CMP (Chemical Mechanical Polishing) method to thereby form a first element isolation insulating film 52 consisting of a silicon oxide film ($SiO_2$ film) in the first element isolation trench 51.

Accordingly, the first element isolation region 14 consisting of the first element isolation trench 51 and the first element isolation insulating film 52 and partitioning a band-shaped active region 16 extending in the second direction is formed.

Next, in a process shown in FIGS. 5A through 5C, the silicon nitride film 66 shown in FIGS. 4A through 4C is removed, and then the pad oxide film 65 is removed. Specifically, the silicon nitride film 66 is removed by thermal phosphoric acid and then the pad oxide film 65 is removed by HF (hydrogen fluoride) etchant. Accordingly, the band-shaped active region 16 is exposed.

Next, part of the first element isolation insulating film 52 protruding from the main surface 13a of the semiconductor substrate 13 is removed to thereby make the upper surface 52a of the first element isolation insulating film 52 flush with the main surface 13a of the in the semiconductor substrate 13. Removal of the first element isolation insulating film 52 protruding from the main surface 13a of the semiconductor substrate 13 is performed, for example, by wet etching.

Next, in a process shown in FIGS. 6A through 6C, the mask insulating film 26 having the trench-shaped aperture 26A is formed in the main surface 13a of the semiconductor substrate 13 and the upper surface 52a of the first element isolation insulating film 52 shown in FIGS. 5A through 5C.

Specifically, the mask insulating film 26 is formed by forming a silicon nitride film (a base material of the mask insulating film 26) covering the main surface 13a of the semiconductor substrate 13 and the upper surface 52a of the first element isolation insulating film 52, forming photoresist (not shown) patterned on the silicon nitride film, and processing the aperture 26A through anisotropic etching using the photoresist as a mask.

In this case, a plurality of apertures 26A extend in a Y direction (a first direction) and are formed at given intervals in the X direction (see FIG. 6A). Further, the apertures 26A are formed to expose the main surface 13a of the semiconductor substrate 13 corresponding to the forming region of the second element isolation trench 54. The photoresist (not shown) is removed after the apertures 26A are formed.

Next, the semiconductor substrate 13 is etched by anisotropic etching (specifically, dry etching) using the mask insulating film 26 having the aperture 26A as a mask to thereby form the second element isolation trench 54 extending in the first direction.

The depth $D_2$ of the second element isolation trench 54 (a depth from the main surface 13a of the semiconductor substrate 13) may be, for example, 250 nm.

Next, the second element isolation insulating film 55 burying the second element isolation trench 54 is formed.

Specifically, the second element isolation trench 54 is buried with a silicon oxide film ($SiO_2$ film) formed by an HDP method or a coated silicon oxide film ($SiO_2$ film) formed by an SOG method.

Next, the insulating film formed upward from the upper surface 26a of the mask insulating film 26 is removed using a CMP method to thereby form a second element isolation insulating film 55 having an upper surface 55a formed of a silicon oxide film ($SiO_2$ film) and flush with the upper surface 26a of the mask insulating film 26 in the second element isolation trench 54.

Thereby, the second element isolation region 17 consisting of the second element isolation trench 54 and the second element isolation insulating film 55 and partitioning the band-shaped active region 16 shown in FIGS. 5A through 5C into a plurality of element forming regions R is formed.

Thus, after the first element isolation region 14 consisting of the first element isolation trench 51 formed in the semiconductor substrate 13 and the first element isolation insulating film 52 burying the first element isolation trench 51 and partitioning the band-shaped active region 16 is formed, the second element isolation region 17 consisting of the second element isolation trench 54 formed in the semiconductor substrate 13 and the second element isolation insulating film 55 burying the second element isolation trench 54 and partitioning the plurality of element forming regions R is formed. Accordingly, the first and second transistors 19-1 and 19-2 can be easily turned on and a data holding characteristic of the memory cell array 11 can be improved so that a potential of the dummy gate electrode does not adversely affect the first and second transistors 19-1 and 19-2 (see FIG. 2), in comparison with a case in which a dummy gate electrode (not shown) to which a negative potential is applied through the gate insulating film 21 is provided in the second element isolation trench 54 to partition a plurality of element forming regions R.

Next, in a process shown in FIGS. 7A through 7C, two trench-shaped apertures 26B extending in the Y direction are formed in the mask insulating film 26 located between the two second element isolation regions 17.

In this case, the apertures 26B are formed to expose the main surface 13a of the semiconductor substrate 13 corresponding to the forming region of the gate electrode trench 18. The apertures 26B are formed by forming photoresist (not shown) patterned on the mask insulating film 26 and etching the mask insulating film 26 through anisotropic etching (specifically, dry etching) using the photoresist as a mask. The photoresist is removed after the apertures 26B are formed.

Next, the semiconductor substrate 13 is etched by anisotropic etching (specifically, dry etching) using the mask insulating film 26 having the apertures 26B as a mask to thereby form two gate electrode trenches 18 each having a bottom 18c and first and second opposing side surfaces 18a and 18b.

In this case, the two gate electrode trenches 18 are formed so that second side surfaces 18b face each other via the semiconductor substrate 13 (specifically, the semiconductor substrate 13 in a portion in which the second impurity diffusion region 29 is formed). Further, the depth $D_3$ of the gate electrode trench 18 (a depth from the main surface 13a of the semiconductor substrate 13) is smaller than the depths $D_1$ and $D_2$ of the first and second element isolation trenches 51 and 54.

If the depths $D_1$ and $D_2$ of the first and second element isolation trenches 51 and 54 are 250 nm, the depth $D_3$ of the gate electrode trench 18 may be, for example, 150 nm.

Next, in a process shown in FIGS. 8A through 8C, a gate insulating film 21 covering the first and second side surfaces 18a and 18b of the gate electrode trench 18 and the bottom 18c of the gate electrode trench 18 is formed. For example, a silicon oxide film ($SiO_2$ film) of a single layer, a film (SiON film) formed by nitriding a silicon oxide film, a stacked silicon oxide film ($SiO_2$ film), a stacked film formed by stacking a silicon nitride film (SiN film) on a silicon oxide film ($SiO_2$ film), or the like may be used as the gate insulating film 21.

If a silicon oxide film ($SiO_2$ film) of a single layer is used as the gate insulating film 21, the gate insulating film 21 may be formed by a thermal oxidation method. In this case, a thickness of the gate insulating film 21 may be, for example, 6 nm.

Next, the gate electrode 22 burying a lower portion of each gate electrode trench 18 through the gate insulating film 21 so that the upper surface 22a is lower than the main surface 13a of the semiconductor substrate 13 is formed.

Specifically, a titanium nitride film and a tungsten film are sequentially stacked, for example, by a CVD method to bury the gate electrode trench 18, and then the titanium nitride film and the tungsten film are both etched back by dry etching so that the titanium nitride film and the tungsten film are left in a lower portion of the gate electrode trench 18, to thereby form the gate electrode 22 consisting of the titanium nitride film and the tungsten film. Each gate electrode 22 constitutes the word line of the memory cell.

Next, a buried insulating film 24 covering the upper surface 22a of the gate electrode 22 and burying the gate electrode trench 18 and the trench-shaped aperture 26B is formed.

Specifically, an upper portion of the gate electrode trench 18 and the apertures 26B are buried with an insulating film (e.g., silicon oxide film ($SiO_2$ film)) formed by an HDP method or a coated insulating film (e.g., silicon oxide film ($SiO_2$ film)) formed by an SOG method.

Next, the insulating film formed upward from the upper surface 26a of the mask insulating film 26 is removed by a CMP method. Accordingly, a buried insulating film 24 consisting of the insulating film (e.g., silicon oxide film ($SiO_2$ film)) burying the gate electrode trench 18 and the apertures 26B and having an upper surface 24a flush with the upper surface 26a of the mask insulating film 26 is formed.

Next, in a process shown in FIGS. 9A through 9C, phosphorus (P), which is impurities having a different conductivity type from the n-type impurities (a p-type silicon substrate that is a semiconductor substrate 13e), is ion-implanted into in an entire upper surface of the structure shown in FIGS. 8A through 8C under conditions in which energy is 100 KeV and a dose amount is 1E14 atoms/$cm^2$, to thereby form the first impurity diffusion region 28 in the semiconductor substrate 13 located between the gate electrode trench 18 and the first element isolation region 17 and form the impurity diffusion region 71 that is part of the second impurity diffusion region 29 in the semiconductor substrate 13 located between the two gate electrode trenches 18.

Accordingly, the first impurity diffusion region 28 is formed in the semiconductor substrate 13 located at a side of the first side surface 18a of the gate electrode trench 18 to cover the upper portion 21A of the gate insulating film 21 formed on the first side surface 18a.

In this case, the first impurity diffusion region 28 is formed to include the upper surface 13a of the semiconductor substrate 13 sandwiched between the first side surface 18a and the second element isolation trench 54 and to have a bottom 28b buried in a higher position than the upper surface 22a of the gate electrode 22.

Further, a thickness of the mask insulating film 26 in this step may be, for example, 50 nm.

Next, in a process shown in FIGS. 10A through 10C, photoresist 73 having a trench-shaped aperture 73a exposing the upper surface 26a of the mask insulating film 26 located between the buried insulating films 24 is formed on the upper surface 24a of the buried oxide film 24, the upper surface 26a of the mask insulating film 26, and the upper surface 55a of the second element isolation insulating film 55.

Next, the mask insulating film 26 exposed from the aperture 73a is removed by etching (wet etching or dry etching) using the photoresist 73 as a mask.

Accordingly, the upper surface 71a of the impurity diffusion region 71 is exposed and part of the upper surface 52a of the first element isolation insulating film 52 flush with the upper surface 71a of the impurity diffusion region 71 is exposed.

Next, in a process shown in FIGS. 11A through 11C, phosphorus (P), which is impurities having a different conductivity type from the n-type impurities (a p-type silicon substrate that is a semiconductor substrate 13e), is selectively ion-implanted into the impurity diffusion region 71 exposed from the photoresist 73 (in other words, the semiconductor substrate 13 in which the impurity diffusion region 71 has been formed) under conditions in which energy is 100 KeV and a dose amount is 1E14 atoms/$cm^2$, to thereby form the second impurity diffusion region 29 in the entire semiconductor substrate 13 located between the two gate electrode trenches 18.

Accordingly, the second impurity diffusion region 29 covering the entire gate insulating film 21 formed in the second side surfaces 18b of the two gate electrode trenches 18 is formed in an entire portion of the semiconductor substrate 13 arranged between the two gate electrode trenches 18, and the first and second transistors 19-1 and 19-2 each including the gate insulating film 21, the gate electrode 22, the buried insulating film 24, the first impurity diffusion region 28, and the second impurity diffusion region 29 are formed.

Thus, the first impurity diffusion region 28 covering the upper portion 21A of the gate insulating film 21 arranged on the first side surface 18a is formed and the second impurity diffusion region 29 covering the entire gate insulating film 21 arranged in the second side surfaces 18b of the two gate electrode trenches 18 is formed in an entire portion of the semiconductor substrate 13 located between the two gate electrode trenches 18. Accordingly, when the first and second transistors 19-1 and 19-2 shown in FIG. 2 are operated, a channel region is formed only in the semiconductor substrate 13 contacting the lower portion of the gate insulating film 21 arranged on the first side surface 18a and the semiconductor substrate 13 constituting the bottom 18c of the gate electrode trench 18, such that a channel region cannot be formed between the first and second transistors 19-1 and 19-2.

That is, when the first and second transistors 19-1 and 19-2 are in an on state, a channel region in which on current flows can be reduced in comparison with a conventional transistor. Accordingly, even in the miniaturized memory cell, the channel resistance can be reduced to increase on current.

Further, when one of the first and second transistors 19-1 and 19-2 operates, the other transistor can be suppressed from malfunctioning. Accordingly, even when the semiconductor device 10 is miniaturized and the gate electrode 22 is arranged with a small pitch, the first and second transistors 19-1 and 19-2 can be operated independently and stably.

Further, in a process shown in FIGS. 11A through 11C, a bottom of the second impurity diffusion region 29 is formed to protrude downward from the bottoms 18c of the two gate electrode trenches 18.

Thus, since the bottom of the second impurity diffusion region 29 protrudes downward from the bottoms 18c of the two gate electrode trenches 18, a state in which "L" is accumulated in the lower electrode 57 electrically connected with the first transistor 19-1 and "H" is accumulated in the lower electrode 57 electrically connected with the first transistor 19-1 is obtained. In this state, when on/off of the gate electrode 22 (word line) corresponding to the first transistor 19-1 is repeated, electrons e– (not shown) induced in the channel of the first transistor 19-1 are trapped by the bottom of the second impurity diffusion region 29 containing the n-type impurities. Accordingly, the electrons e– induced in the channel of the first transistor 19-1 can be suppressed from reaching the second impurity diffusion region 29 (drain region) constituting the second transistor 19-2.

Accordingly, generation of a disturbance defect, in which an accumulation state of one cell is changed due to an operation state of the other adjacent cell, can be suppressed so that H information resulting from electrons e– induced in the channel of the first transistor 19-1 being accumulated in the lower electrode 57 electrically connected with the second transistor 19-2 is not destructed and the state is not changed into an L state.

Further, even in a DRAM in which an interval between the two gate electrodes 22 arranged to be adjacent to each other is equal to or less than 50 nm, the generation of the disturbance defect can be suppressed.

Next, in a process shown in FIGS. 12A through 12C, the photoresist 73 shown in FIGS. 11A and 11B is removed.

Next, in a process shown in FIG. 13, the bit line contact plug 33 burying the aperture 32 and the bit line 34 arranged on the bit line contact plug 33 and extending in the X direction (see FIG. 1) are formed en bloc.

Specifically, a polysilicon film, a titanium nitride film, and a tungsten film, which are not shown, are sequentially formed on the upper surface 24a of the buried insulating film 24 to bury the aperture 32 (in this case, so that the polysilicon film buries the aperture 32).

Next, a silicon nitride film (SiN film), which is not shown and is a base material of the cap insulating film 36, is formed on the tungsten film that is not shown.

Then, photoresist (not shown) covering the forming region of the bit line 34 is formed on the silicon nitride film (SiN film) using photolithography technology.

Next, the silicon nitride film (SiN film), the tungsten film, the titanium nitride film, and the polysilicon film are patterned by anisotropic etching (specifically, dry etching) using the photoresist as a mask to thereby form, en bloc, the cap insulating film 36 constituting of the silicon nitride film (SiN film), the bit line contact plug 33 constituting of a polysilicon film and contacting the upper surface 29a of the second impurity diffusion region 29, and the bit line 34 arranged on the bit line contact plug 33 and consisting of a polysilicon film, a titanium nitride film, and a tungsten film.

Next, a silicon nitride film (SiN film) and a silicon oxide film ($SiO_2$ film) that are not shown are sequentially formed to cover the side surface of the bit line 34, and the cap insulating film 36, and then the silicon oxide film ($SiO_2$ film) and silicon nitride film (SiN film) are etched back over their entire surface to thereby form a sidewall film 37 that covers a side surface of the cap insulating film 36 and a side surface of the bit line 34.

Thus, since the silicon nitride film (SiN film) and the silicon oxide film ($SiO_2$ film) are sequentially stacked to thereby form the sidewall film 37, wettability of the silicon oxide film (coated insulating film) is enhanced when a coated insulating film (specifically, silicon oxide film ($SiO_2$ film)) is formed as the interlayer insulating film 38 using an SOG method. Thus, generation of voids in the silicon oxide film (coated insulating film) can be suppressed.

Next, the upper surface 24a of the buried insulating film 24, the upper surface 26a of the mask insulating film 26, and the upper surface 55a of the second element isolation insulating film 55 are covered with the sidewall film 37 and an interlayer insulating film 38 having an upper surface 38a flush with the upper surface 36a of the cap insulating film 36 is formed. Accordingly, the upper surface 36a of the cap insulating film 36 is exposed from the interlayer insulating film 38.

Specifically, the upper surface 24a of the buried insulating film 24, the upper surface 26a of the mask insulating film 26, and the upper surface 55a of the second element isolation insulating film 55 are coated with a coated insulating film (silicon oxide film ($SiO_2$ film)) using an SOG method so that the sidewall film 37 is covered, and then, heat treatment is performed to thereby make film quality of the silicon oxide film (coated insulating film) dense.

Further, when the silicon oxide film (coated insulating film) is formed using the SOG method, a coating liquid containing polysilazane is used. Further, the heat treatment may be performed in a steam atmosphere.

Next, polishing of the heat-treated silicon oxide film (coated insulating film) is performed using a CMP method until the upper surface 36a of the cap insulating film 36 is exposed. Accordingly, the interlayer insulating film 38 having the upper surface 38a substantially flush with the upper surface 36a of the cap insulating film 36 is formed.

Further, in a structure shown in FIG. 13, although not shown, a silicon oxide film ($SiO_2$ film) covering the upper surface 36a of the cap insulating film 36 and the upper surface 38a of the interlayer insulating film 38 may be formed using the CVD method after the silicon oxide film (coated insulating film) is polished.

Next, in a process shown in FIG. 14, the interlayer insulating film 38, the mask insulating film 26, the buried insulating film 24, and the gate insulating film 21 are anisotropically etched (specifically, dry etched) using an SAC (Self Aligned Contact) method to thereby form a contact hole 41, which exposes part of the upper surface 28a of the first impurity diffusion region 28.

In this case, dry etching is performed by a step of selectively etching the silicon oxide film (SiO$_2$ film) and a step of selectively etching the silicon nitride film (SiN film).

Next, a contact plug 42 having an upper surface 42a substantially flush with the upper surface 38a of the interlayer insulating film 38 and a lower end contacting the upper surface 28a of the first impurity diffusion region 28 is formed in the contact hole 41.

Specifically, a titanium nitride film (not shown) and a tungsten film (not shown) are sequentially stacked using a CVD method to bury the contact hole 41, and then unnecessary titanium nitride film and tungsten film formed on the upper surface 38a of the interlayer insulating film 38 are removed through polishing using a CMP method to thereby form the contact plug 42 consisting of the titanium nitride film and the tungsten film in the contact hole 41.

Next, a capacitive contact pad 44 contacting part of the upper surface 42a of the capacitive contact plug 42 is formed on the upper surface 38a of the interlayer insulating film 38.

Specifically, a metal film (not shown) that is a base material of the capacitive contact pad 44 is formed to cover the upper surface 36a of the cap insulating film 36, the upper surface 42a of the contact plug 42, and the upper surface 38a of the interlayer insulating film 38.

Next, photoresist (not shown) covering a surface corresponding to the forming region of the capacitive contact pad 44 of an upper surface of the metal film is formed using photolithography technology. An unnecessary metal film exposed from the photoresist is then removed by dry etching using the photoresist as a mask to thereby form the capacitive contact pad 44 consisting of the metal film. After the capacitive contact pad 44 is formed, the photoresist (not shown) is removed.

Next, a silicon nitride film 46 covering the capacitive contact pad 44 is formed on the upper surface 36a of the cap insulating film 36, the upper surface 42a of the contact plug 42, and the upper surface 38a of the interlayer insulating film 38.

Next, in a process shown in FIG. 15, a silicon oxide film (SiO$_2$ film) that is not shown and has a great thickness is formed on the silicon nitride film 46. The thickness of the silicon oxide film (SiO$_2$ film) may be, for example, 1500 nm.

Next, photoresist (not shown) patterned on the silicon oxide film (SiO$_2$ film) is formed using photolithography technology. A silicon oxide film (not shown) and the silicon nitride film 46 formed on the capacitive contact pad 44 are then etched by dry etching using the photoresist as a mask to thereby form a cylindrical hole (not shown) exposing the capacitive contact pad 44. The photoresist (not shown) is then removed.

Next, a conductive film (e.g., titanium nitride film) is formed on an inner surface of the cylindrical hole (not shown) and an upper surface of the capacitive contact pad 44 to thereby form a crown-shaped lower electrode 57 that consists of the conductive film.

Next, the silicon oxide film (not shown) is removed using wet etching to thereby expose the upper surface of the silicon nitride film 46. A capacitive insulating film 58 covering the upper surface of the silicon nitride film 46 and the lower electrode 57 is then formed.

Next, an upper electrode 59 is formed to cover the surface of the capacitive insulating film 58. In this case, the upper electrode 59 is formed so that an upper surface 59a of the upper electrode 59 is arranged upward from the capacitive insulating film 58. Accordingly, a capacitor 48 consisting of the lower electrode 57, the capacitive insulating film 58, and the upper electrode 59 is formed on each capacitive contact pad 44.

Thus, the semiconductor device 10 of the first embodiment is fabricated.

Further, in fact, an interlayer insulating film, a via, and a wiring that are not shown are formed on the upper surface 59a of the upper electrode 59.

According to the method of fabricating the semiconductor device of the first embodiment, the first impurity diffusion region 28 covering the upper portion 21A of the gate insulating film 21 arranged on the first side surface 18a is formed and the second impurity diffusion region 29 covering the entire gate insulating film 21 arranged on the second side surfaces 18b of the two gate electrode trenches 18 is formed in an entire portion of the semiconductor substrate 13 located between the two gate electrode trenches 18. Accordingly, when the first and second transistors 19-1 and 19-2 shown in FIG. 2 are operated, the channel region is formed only in the semiconductor substrate 13 contacting the lower portion of the gate insulating film 21 arranged on the first side surface 18a, and the semiconductor substrate 13 constituting the bottom 18c of the gate electrode trench 18, such that the channel region cannot be formed between the first and second transistors 19-1 and 19-2.

That is, when the first and second transistors 19-1 and 19-2 are in an on state, a channel region in which on current flows can be reduced in comparison with a conventional transistor. Accordingly, even in the miniaturized memory cell, the channel resistance can be reduced to increase on current.

Further, when one of the first and second transistors 19-1 and 19-2 operates, the other transistor can be suppressed from malfunctioning. Accordingly, even when the semiconductor device 10 is miniaturized and the gate electrode 22 is arranged with a small pitch, the first and second transistors 19-1 and 19-2 can be operated independently and stably.

Further, the gate electrode 22 is formed to bury the lower portion of respective gate electrode trench 18 via the gate insulating film, and then the buried insulating film 24 covering the upper surface 22a of the gate electrode 22 is formed to bury the gate electrode trench 18. Accordingly, the gate electrode 22 does not protrude upward from the surface 13a of the semiconductor substrate 13.

Accordingly, as in the present embodiment, when a DRAM is fabricated as the semiconductor device 10, the bit line 34 or the capacitor 48 formed after the gate electrode 22 is formed can be easily formed. Thus, it is possible to easily fabricate the semiconductor device 10.

Further, in the first embodiment, although the case in which the silicon oxide film (SiO$_2$ film) is used as the buried insulating film 24 and the silicon nitride film (SiN film) is used as the mask insulating film 26 has been described by way of example, the silicon nitride film (SiN film) may be used as the buried insulating film 24 and the silicon oxide film (SiO$_2$ film) may be used as the mask insulating film 26.

Accordingly, in a process shown in FIG. 14, when the contact hole 41 is formed, the silicon nitride film (SiN film), which is the buried insulating film 24, functions as an etching stopper. Thereby, since the contact hole 41 does not expose the upper surface 22a of the gate electrode 22, the capacitive contact pad 44 and the gate electrode 22 can be prevented from being conducted via the contact plug 42 formed in the contact hole 41.

Further, the bottom of the second impurity diffusion region 29 protrudes downward from the bottoms 18c of the two gate electrode trenches 18, such that a state in which "L" is accumulated in the lower electrode 57 electrically connected with the first transistor 19-1 and "H" is accumulated in the lower electrode 57 electrically connected with the first transistor 19-1 is obtained. In this state, when on/off of the gate electrode 22 (word line) corresponding to the first transistor 19-1 is repeated, electrons e− induced in the channel of the first transistor 19-1 (not shown) are trapped by the bottom of the second impurity diffusion region 29 containing the n-type impurities. Thus, electrons e− induced in the channel of the first transistor 19-1 can be suppressed from arriving at the second impurity diffusion region 29 (drain region) constituting the second transistor 19-2.

Accordingly, generation of a disturbance defect, in which an accumulation state of one cell is changed due to an operation state of the other adjacent cell, can be suppressed so that H information resulting from electrons e− induced in the channel of the first transistor 19-1 being accumulated in the lower electrode 57 electrically connected with the second transistor 19-2 is not destructed and the state is not changed into an L state.

Further, even in a DRAM in which an interval between the two gate electrodes 22 arranged to be adjacent to each other is equal to or less than 50 nm, the generation of the disturbance defect can be suppressed.

Second Embodiment

Figure 16:
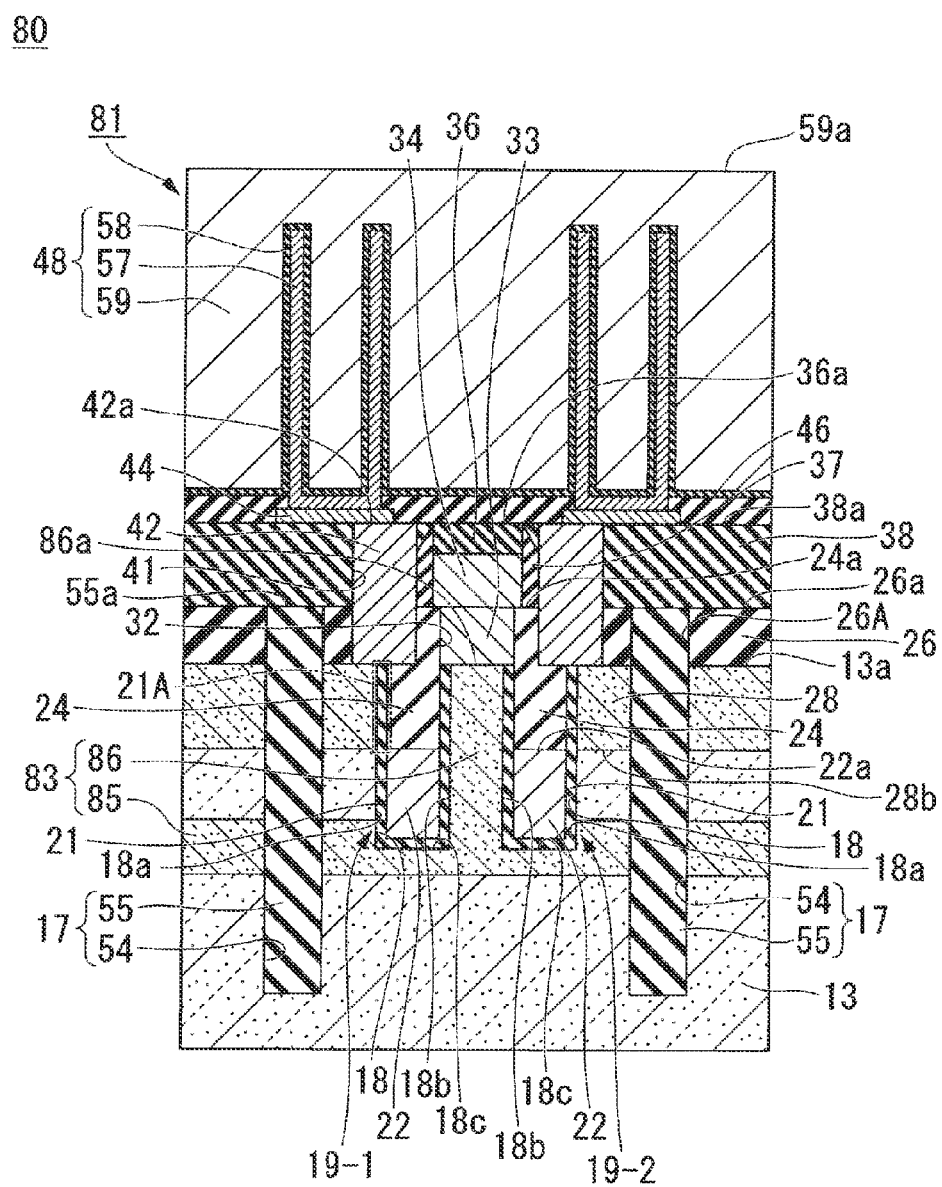
FIG. 16 is a fragmentary cross sectional elevation view, taken along an A-A' line of FIG. 1, of a semiconductor device in a second embodiment of the invention.

FIG. 16 is a cross-sectional view of a memory cell array provided in a semiconductor device according to a second embodiment of the present invention, and corresponds to a cross-section taken along a line A-A shown in FIG. 1.

In FIG. 16, a DRAM is described as an example of a semiconductor device 80 of the second embodiment. In FIG. 16, in fact, a bit line 34 extending in an X direction shown in FIG. 1 is schematically shown. Further, in FIG. 16, the same components as the semiconductor device 10 of the first embodiment shown in FIG. 2 are assigned the same reference numerals, and a description thereof will be omitted.

Referring to FIG. 16, the semiconductor device 80 of the second embodiment has the same configuration as the semiconductor device 10 except that the semiconductor device 80 includes a memory cell array 81 as an alternative to the memory cell array 11 provided in the semiconductor device 10 of the first embodiment.

The memory cell array 81 has the same configuration as the memory cell array 11 except that a second impurity diffusion region 83 is provided as an alternative to the second impurity diffusion region 29 provided in the memory cell array 11, which has been described in the first embodiment.

That is, the first and second transistors 19-1 and 19-2 provided in the semiconductor device 80 of the second embodiment include the second impurity diffusion region 83 as an alternative to the second impurity diffusion region 29, which has been described in the first embodiment.

The second impurity diffusion region 83 is a region formed by ion-implanting n-type impurities having a different conductivity type from the p-type silicon substrate, which is a semiconductor substrate 13, into the semiconductor substrate 13, and functions as a source/drain region (a drain region in the structure shown in FIG. 16).

The second impurity diffusion region 83 is an n-type impurity diffusion region that is common to the first and second transistors 19-1 and 19-2, and includes a first region 85 and a second region 86.

The first region 85 covers the gate insulating film 21 arranged on the bottom 18c of the gate electrode trench 18 and is formed in a layer shape inside the semiconductor substrate 13 along a horizontal plane including the bottom 18c. The first region 85 is divided into a plurality of regions by the first and second element isolation regions 14 and 17 formed to a deeper position than the first region 85.

The second region 86 is formed in an entire portion of the semiconductor substrate 13 sandwiched between the two gate electrode trenches 18 and has the same configuration as the second impurity diffusion region 29, which has been described in the first embodiment. The second region 86 reaches the first region 85 arranged downward from the second region 86 and is integrally formed with the first region 85. The upper surface 86a of the second region 86 coincides with the upper surface 13a of the semiconductor substrate 13 and contacts the lower end of the bit line contact plug 33. Accordingly, the second region 86 is electrically connected with the bit line 34 via the bit line contact plug 33.

That is, the second impurity diffusion region 83 is provided to cover the gate insulating film 21 formed on the second side surfaces 18b and the bottoms 18c of the two gate electrode trenches 18.

Accordingly, the semiconductor substrate 13 in a portion contiguous to the second side surface 18b of the gate electrode trench 18, as well as the semiconductor substrate 13 in a portion contiguous to the bottom 18c of the gate electrode trench 18, is not the channel regions of the first and second transistors 19-1 and 19-2.

Further, in the second embodiment, the case in which the n-type impurity diffusion region is used as the second impurity diffusion region 83 will be described by way of example.

According to the semiconductor device of the second embodiment, the second impurity diffusion region 83 is provided in the semiconductor substrate 13 to cover the gate insulating film 21 formed on the second side surfaces 18b and the bottoms 18c of the two gate electrode trenches 18, such that, when the first and second transistors 19-1 and 19-2 are operated, the channel region can be formed only in the semiconductor substrate 13 contacting the lower portion of the gate insulating film 21 arranged on the first side surface 18. That is, only one surface (the first side surface 18a) among the three surfaces of the gate electrode trench 18 (specifically, the first and second opposing side surfaces 18a and 18b and the bottom 18c) is the channel region, and the two other surfaces (the second side surfaces 18b and the bottom 18c) are not the channel region.

Accordingly, when the first and second transistors 19-1 and 19-2 are in an on state, the channel region in which on current flows can be reduced in comparison with a conventional transistor. Thus, even in the miniaturized memory cell, the channel resistance can be reduced to increase the on current.

Further, when one of the first and second transistors 19-1 and 19-2 operates, the other transistor can be suppressed from malfunctioning.

Accordingly, even when the semiconductor device 80 is miniaturized and the gate electrode 22 is arranged with a small pitch, the first and second transistors 19-1 and 19-2 can be operated independently and stably.

Further, the second impurity diffusion region 83 consists of the first region 85 covering the gate insulating film 21 arranged on the bottom 18c of the gate electrode trench 18, provided in a layer shape inside the semiconductor substrate 13 along a horizontal plane including the bottom 18c and divided into a plurality of regions by the first and second element isolation regions 14 and 17, and the second region 86 provided in an entire portion of the semiconductor substrate 13 sandwiched between the two gate electrode trenches 18, reaching the first region 85 arranged downward from the second region 86, and integrally formed with the first region 85. Accordingly, a state in which "L" is accumulated in the lower electrode 57 electrically connected with the first transistor 19-1 and "H" is accumulated in the lower electrode 57 electrically connected with the first transistor 19-1 is obtained. In this state, when on/off of the gate electrode 22 (word line) corresponding to the first transistor 19-1 is repeated, electrons e− induced in the channel of the first transistor 19-1 (not shown) are trapped by the first region 85 containing the n-type impurities. Thus, the electrons e− induced in the channel of the first transistor 19-1 can be prevented from reaching the second impurity diffusion region 83 (drain region) constituting the second transistor 19-2.

Accordingly, generation of a disturbance defect, in which an accumulation state of one cell is changed due to an operation state of the other adjacent cell, can be prevented so that H information resulting from electrons e− induced in the channel of the first transistor 19-1 being accumulated in the lower electrode 57 electrically connected with the second transistor 19-2 is not destructed and the state is not changed into an L state.

Further, even in a DRAM in which an interval between the two gate electrodes 22 arranged to be adjacent to each other is equal to or less than 50 nm, the generation of the disturbance defect can be prevented.

FIGS. 17A through 17C, FIGS. 18A through 18C, FIGS. 19A through 19C, FIGS. 20A through 20C, FIGS. 21A through 21C, FIGS. 22A through 22C, FIGS. 23A through 23C, FIGS. 24A through 24C, FIGS. 25A through 25C, FIGS. 26A through 26C, FIGS. 27A through 27C, FIGS. 28A through 28C, and FIG. 29 are views showing a process of fabricating a memory cell provided in a semiconductor device according to the second embodiment of the present invention.

Figure 17A:
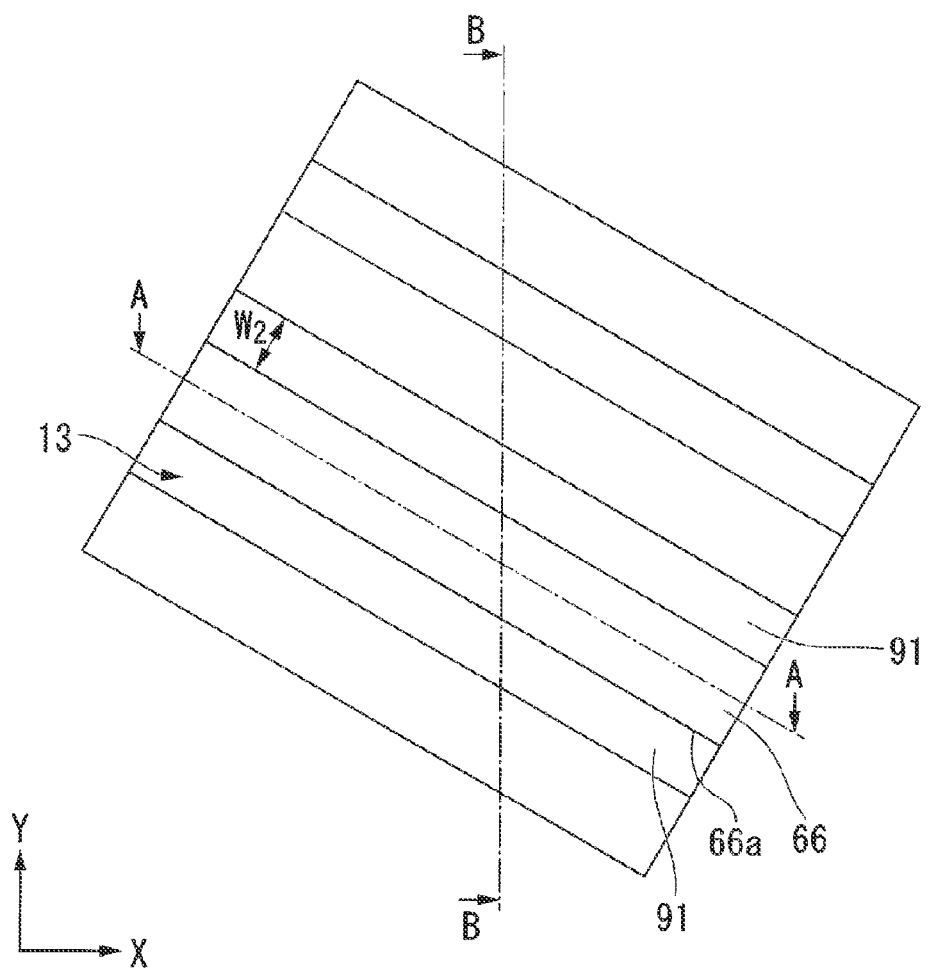
FIG. 17A is a fragmentary plan view of a memory cell array in a step involved in a method of forming the semiconductor device of FIG. 16.
Figure 17B:
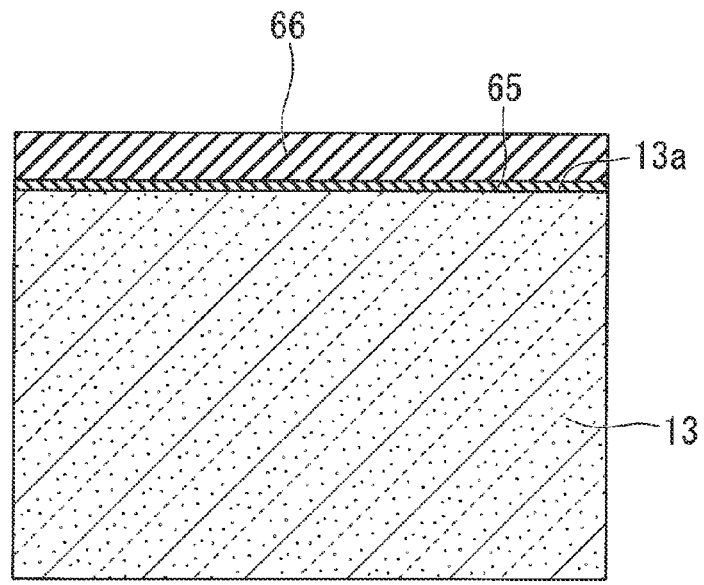
FIG. 17B is a fragmentary cross sectional elevation view, taken along an A-A' line, of a memory cell array in the step of FIG. 17A, involved in the method of forming the semiconductor device of FIG. 16.
Figure 17C:
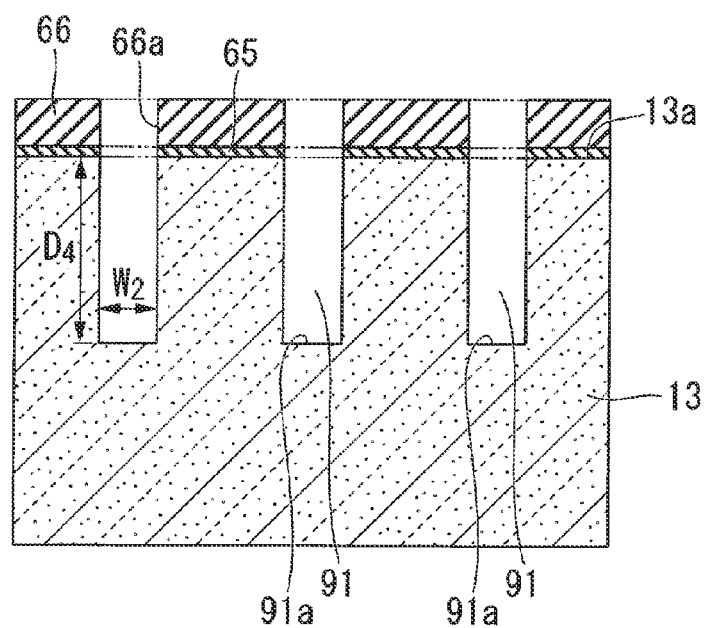
FIG. 17C is a fragmentary cross sectional elevation view, taken along a B-B' line, of the memory cell array in the step of FIG. 17A, involved in the method of forming the semiconductor device of FIG. 16.

FIG. 17A is a plan view of a region in which the memory cell array is formed, FIG. 17B is a cross-sectional view taken along a line A-A of a structure shown in FIG. 17A, and FIG. 17C is a cross-sectional view taken along a line B-B of the structure shown in FIG. 17A.

Figure 18A:
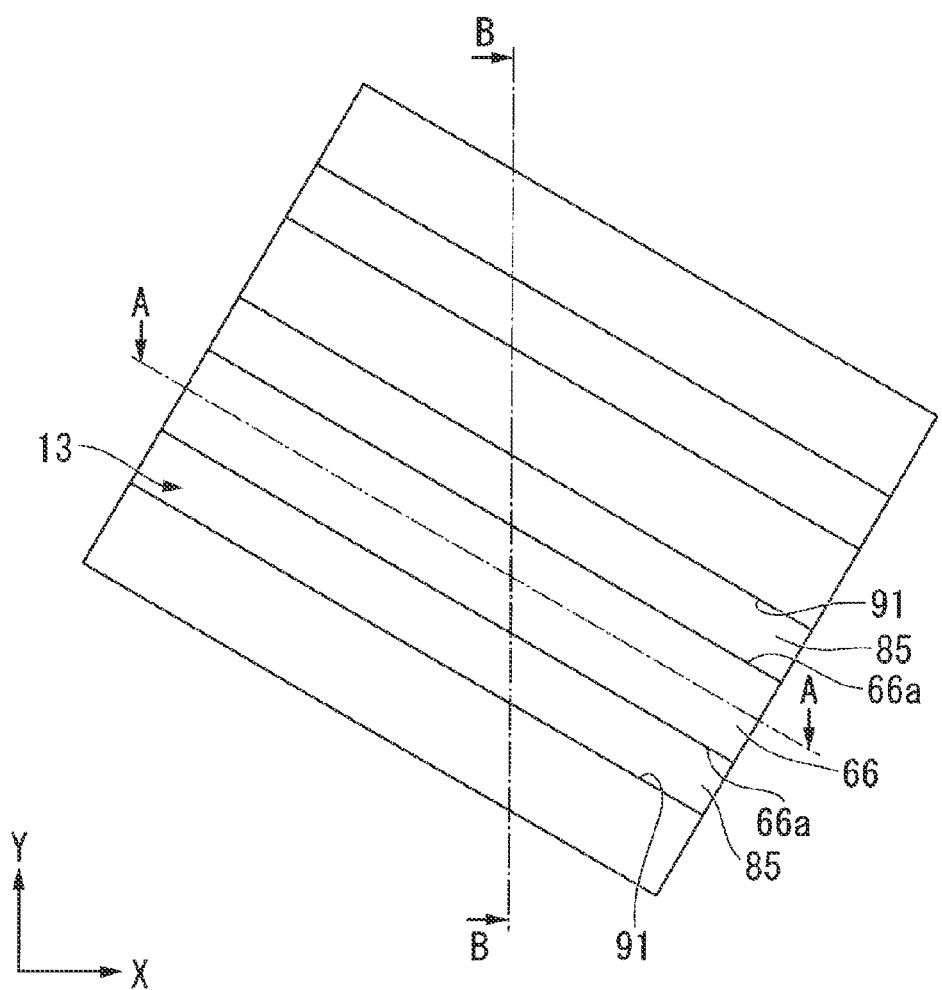
FIG. 18A is a fragmentary plan view of a memory cell array in a step, subsequent to the step of FIGS. 17A, 17B and 17C, involved in the method of forming the semiconductor device of FIG. 16.
Figure 18B:
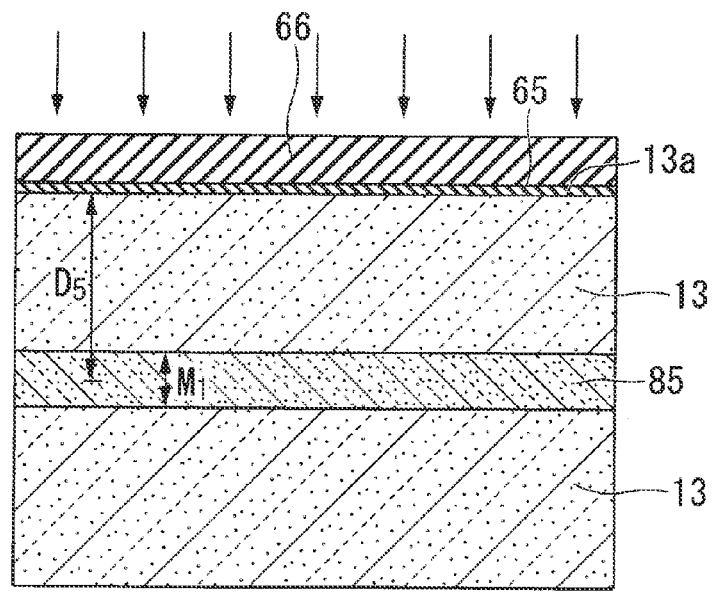
FIG. 18B is a fragmentary cross sectional elevation view, taken along an A-A' line, of a memory cell array in the step of FIG. 18A, involved in the method of forming the semiconductor device of FIG. 16.
Figure 18C:
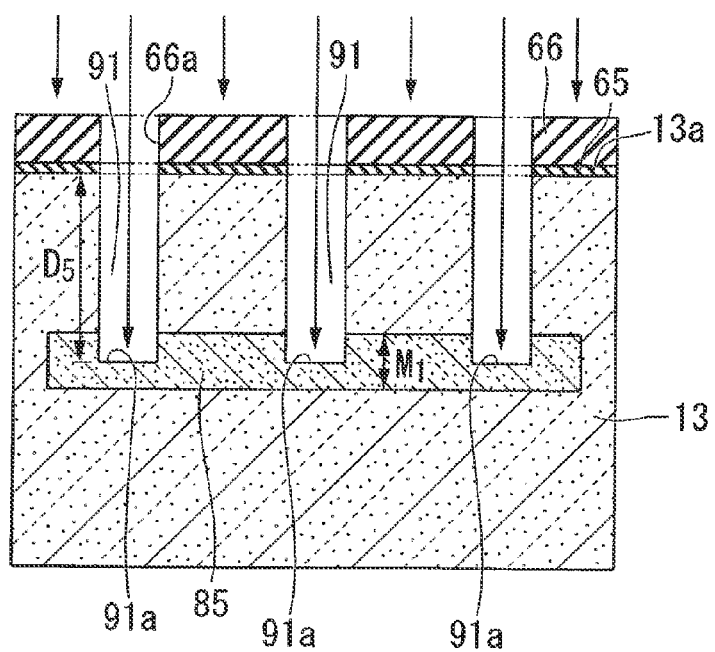
FIG. 18C is a fragmentary cross sectional elevation view, taken along a B-B' line, of the memory cell array in the step of FIG. 18A, involved in the method of forming the semiconductor device of FIG. 16.

FIG. 18A is a plan view of a region in which the memory cell array is formed, FIG. 18B is a cross-sectional view taken along a line A-A of a structure shown in FIG. 18A, and FIG. 18C is a cross-sectional view taken along a line B-B of the structure shown in FIG. 18A.

Figure 19A:
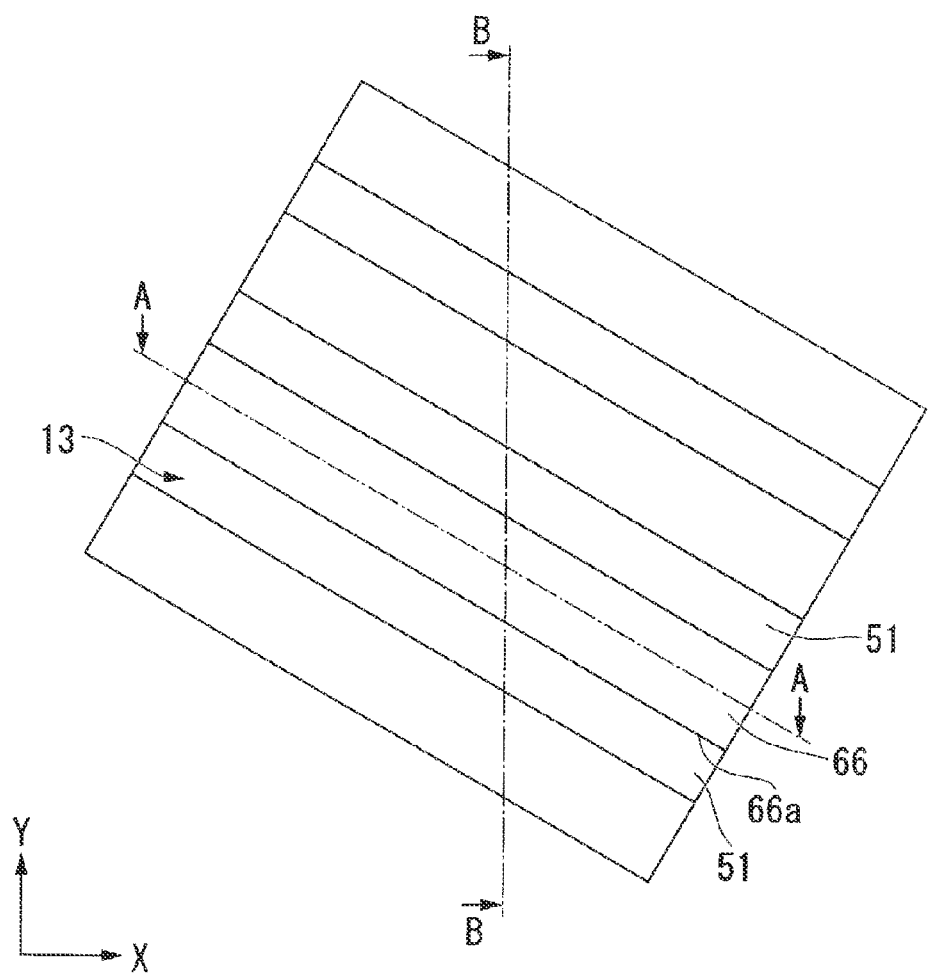
FIG. 19A is a fragmentary plan view of a memory cell array in a step, subsequent to the step of FIGS. 18A, 18B and 18C, involved in the method of forming the semiconductor device of FIG. 16.
Figure 19B:
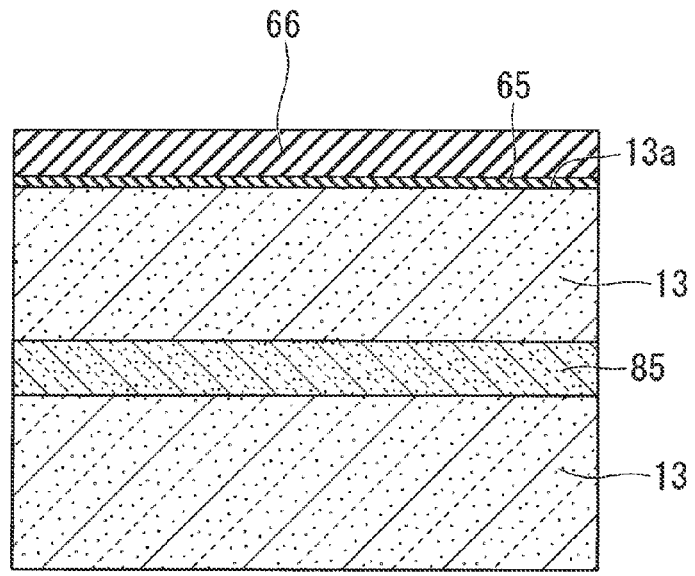
FIG. 19B is a fragmentary cross sectional elevation view, taken along an A-A' line, of a memory cell array in the step of FIG. 19A, involved in the method of forming the semiconductor device of FIG. 16.
Figure 19C:
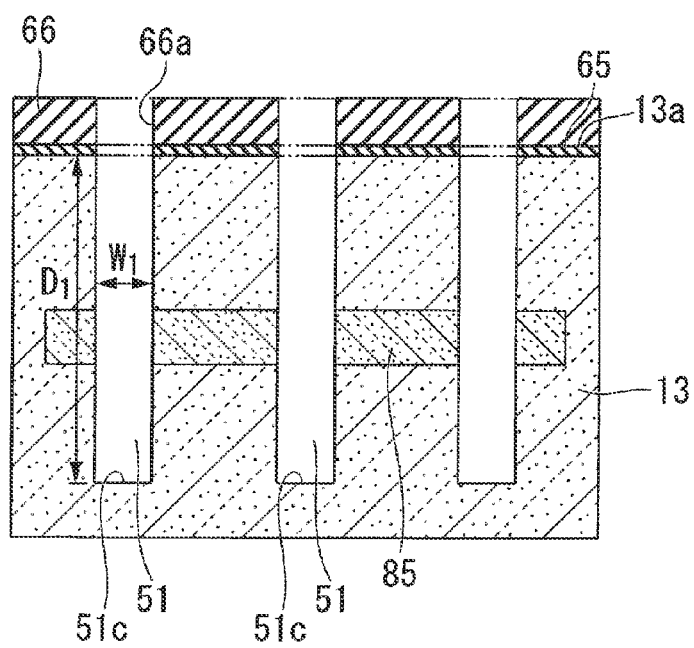
FIG. 19C is a fragmentary cross sectional elevation view, taken along a B-B' line, of the memory cell array in the step of FIG. 19A, involved in the method of forming the semiconductor device of FIG. 16.

FIG. 19A is a plan view of a region in which the memory cell array is formed, FIG. 19B is a cross-sectional view taken along a line A-A of a structure shown in FIG. 19A, and FIG. 19C is a cross-sectional view taken along a line B-B of the structure shown in FIG. 19A.

Figure 20A:
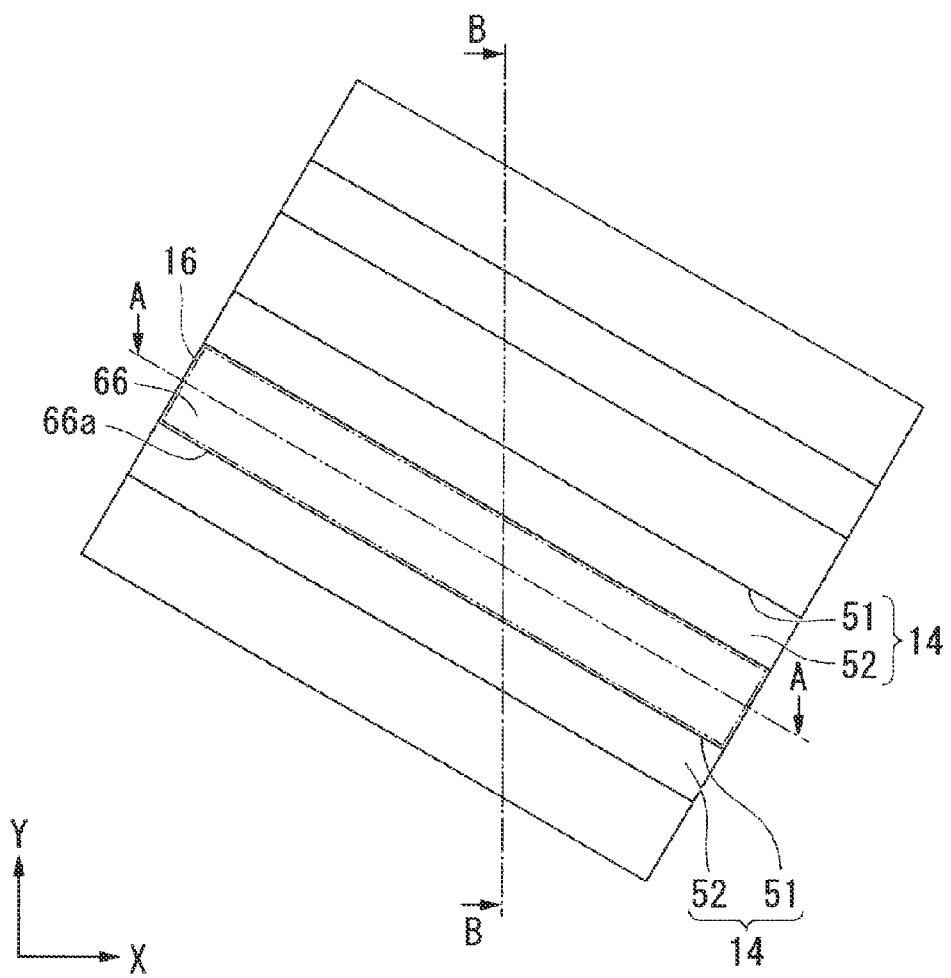
FIG. 20A is a fragmentary plan view of a memory cell array in a step, subsequent to the step of FIGS. 19A, 19B and 19C, involved in the method of forming the semiconductor device of FIG. 16.
Figure 20B:
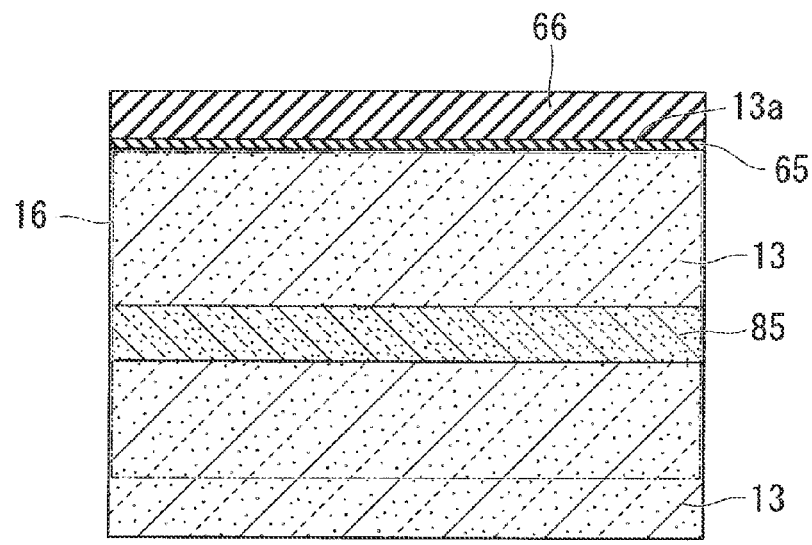
FIG. 20B is a fragmentary cross sectional elevation view, taken along an A-A' line, of a memory cell array in the step of FIG. 20A, involved in the method of forming the semiconductor device of FIG. 16.
Figure 20C:
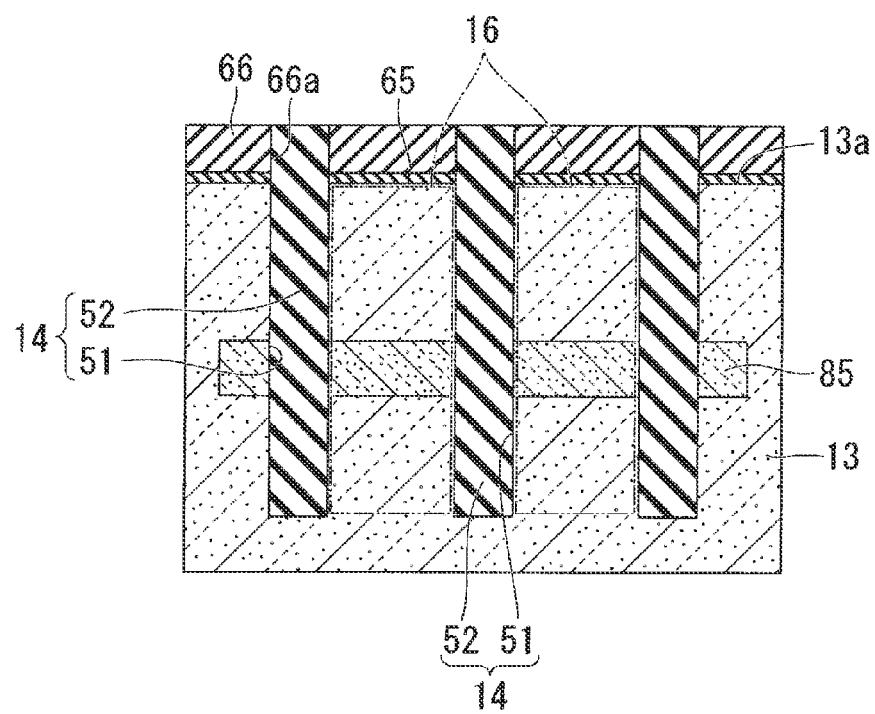
FIG. 20C is a fragmentary cross sectional elevation view, taken along a B-B' line, of the memory cell array in the step of FIG. 20A, involved in the method of forming the semiconductor device of FIG. 16.

FIG. 20A is a plan view of a region in which the memory cell array is formed, FIG. 20B is a cross-sectional view taken along a line A-A of a structure shown in FIG. 20A, and FIG. 20C is a cross-sectional view taken along a line B-B of the structure shown in FIG. 20A.

Figure 21A:
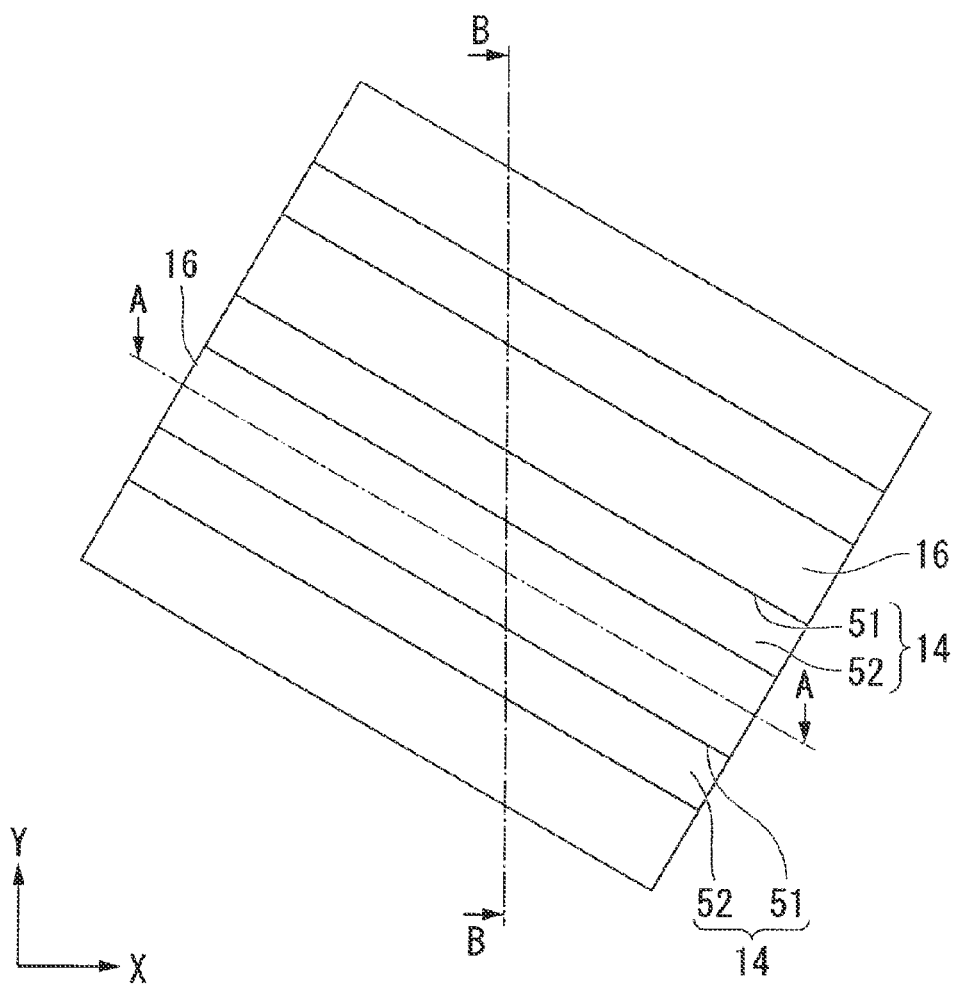
FIG. 21A is a fragmentary plan view of a memory cell array in a step, subsequent to the step of FIGS. 20A, 20B and 20C, involved in the method of forming the semiconductor device of FIG. 16.
Figure 21B:
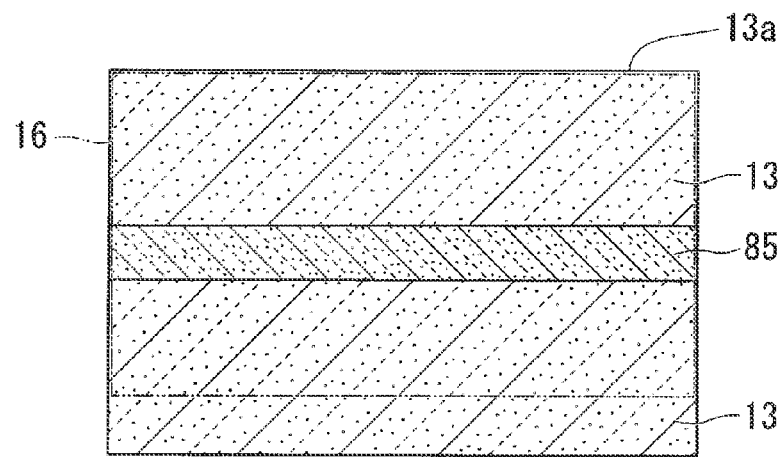
FIG. 21B is a fragmentary cross sectional elevation view, taken along an A-A' line, of a memory cell array in the step of FIG. 21A, involved in the method of forming the semiconductor device of FIG. 16.
Figure 21C:
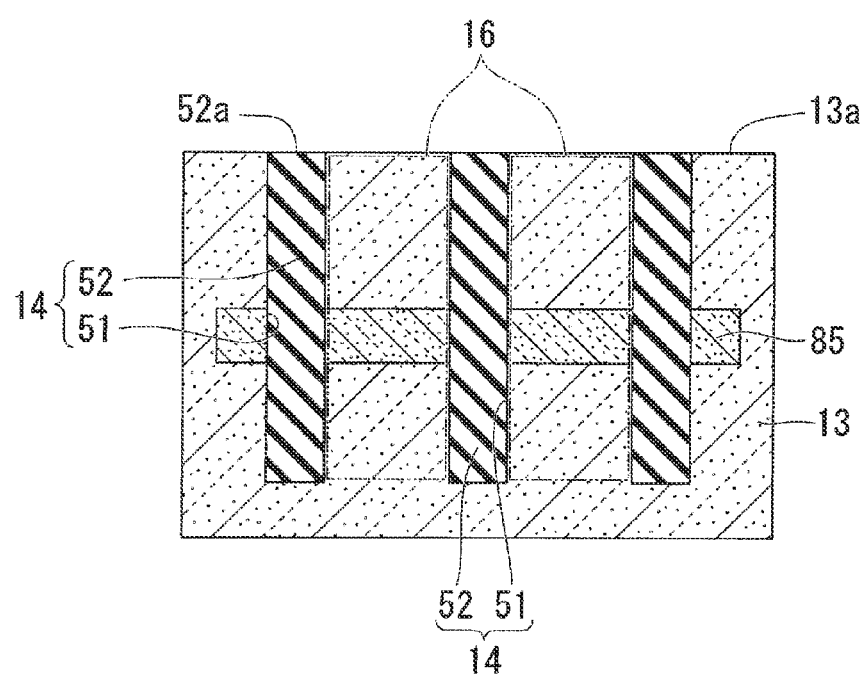
FIG. 21C is a fragmentary cross sectional elevation view, taken along a B-B' line, of the memory cell array in the step of FIG. 21A, involved in the method of forming the semiconductor device of FIG. 16.

FIG. 21A is a plan view of a region in which the memory cell array is formed, FIG. 21B is a cross-sectional view taken along a line A-A of a structure shown in FIG. 21A, and FIG. 21C is a cross-sectional view taken along a line B-B of the structure shown in FIG. 21A.

Figure 22A:
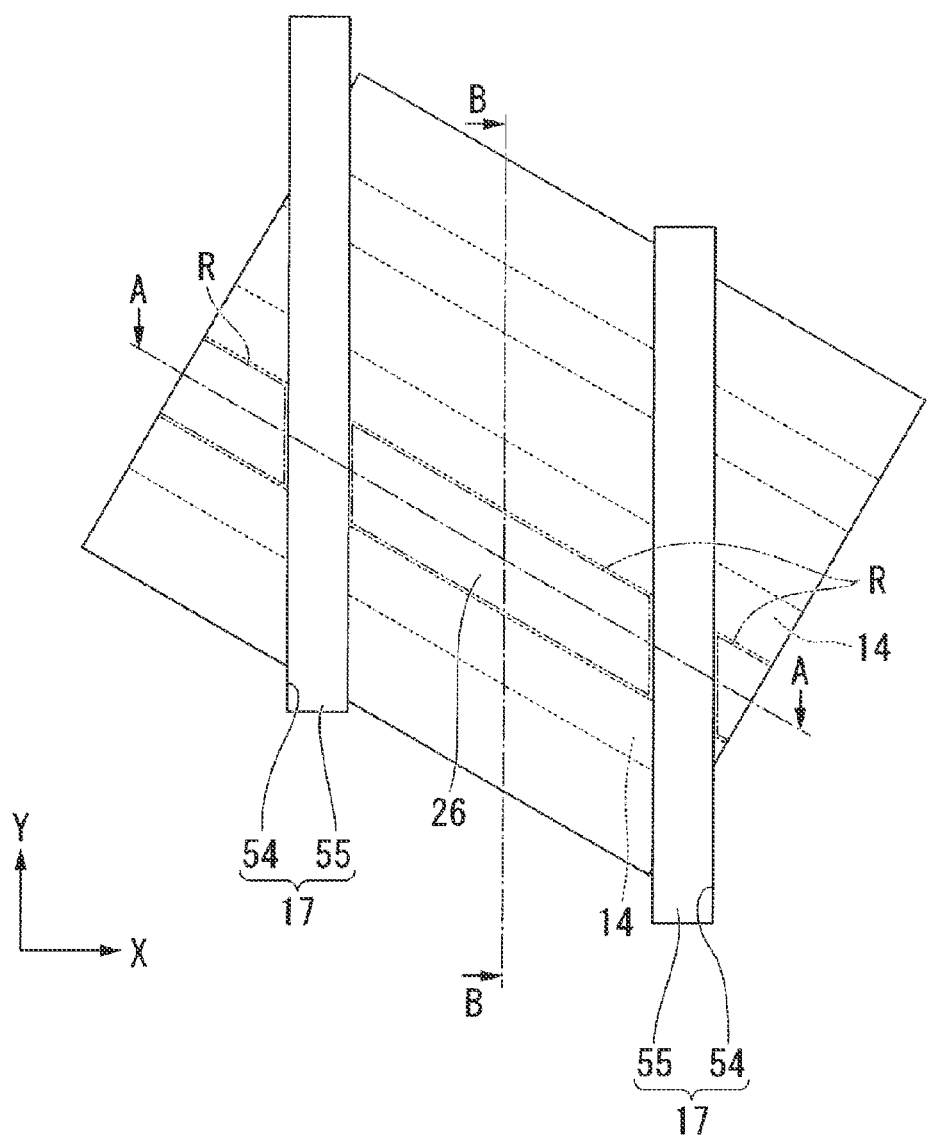
FIG. 22A is a fragmentary plan view of a memory cell array in a step, subsequent to the step of FIGS. 21A, 21B and 21C, involved in the method of forming the semiconductor device of FIG. 16.
Figure 22B:
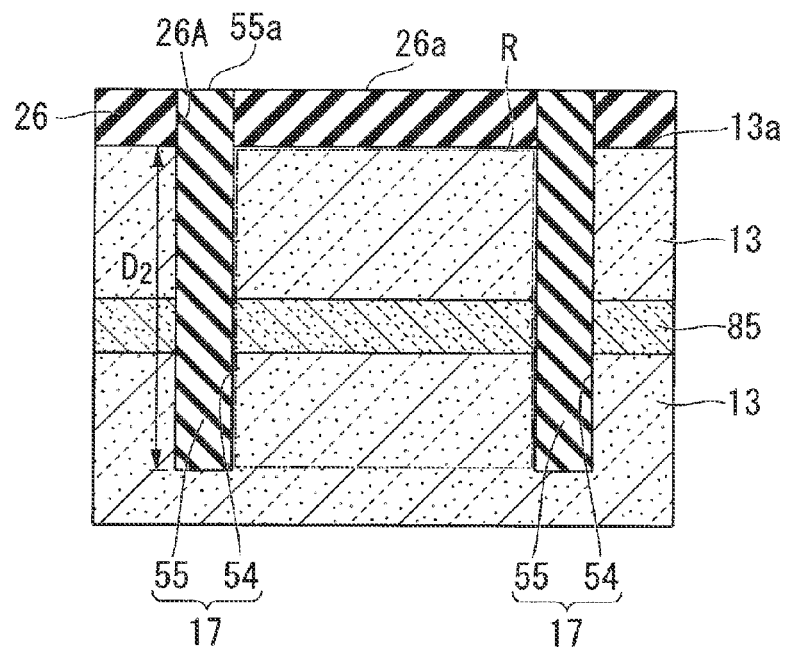
FIG. 22B is a fragmentary cross sectional elevation view, taken along an A-A' line, of a memory cell array in the step of FIG. 22A, involved in the method of forming the semiconductor device of FIG. 16.
Figure 22C:
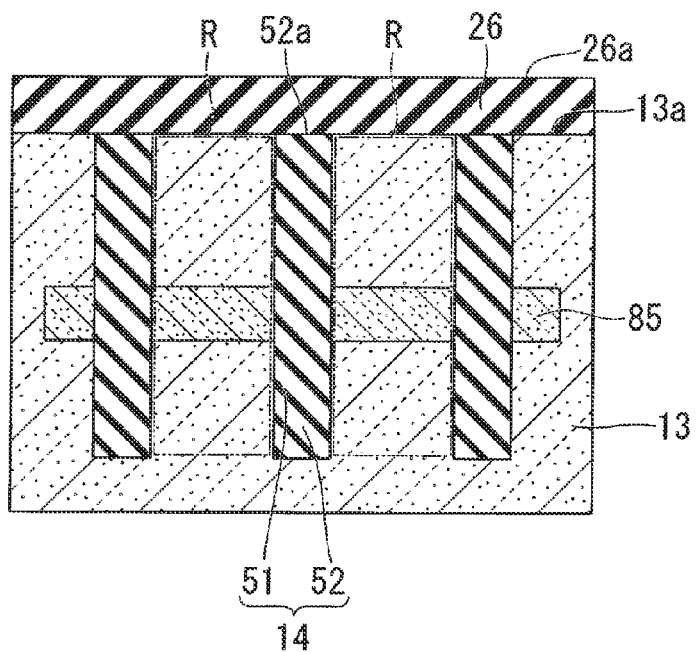
FIG. 22C is a fragmentary cross sectional elevation view, taken along a B-B' line, of the memory cell array in the step of FIG. 22A, involved in the method of forming the semiconductor device of FIG. 16.

FIG. 22A is a plan view of a region in which the memory cell array is formed, FIG. 22B is a cross-sectional view taken along a line A-A of a structure shown in FIG. 22A, and FIG. 22C is a cross-sectional view taken along a line B-B of the structure shown in FIG. 22A.

Figure 23A:
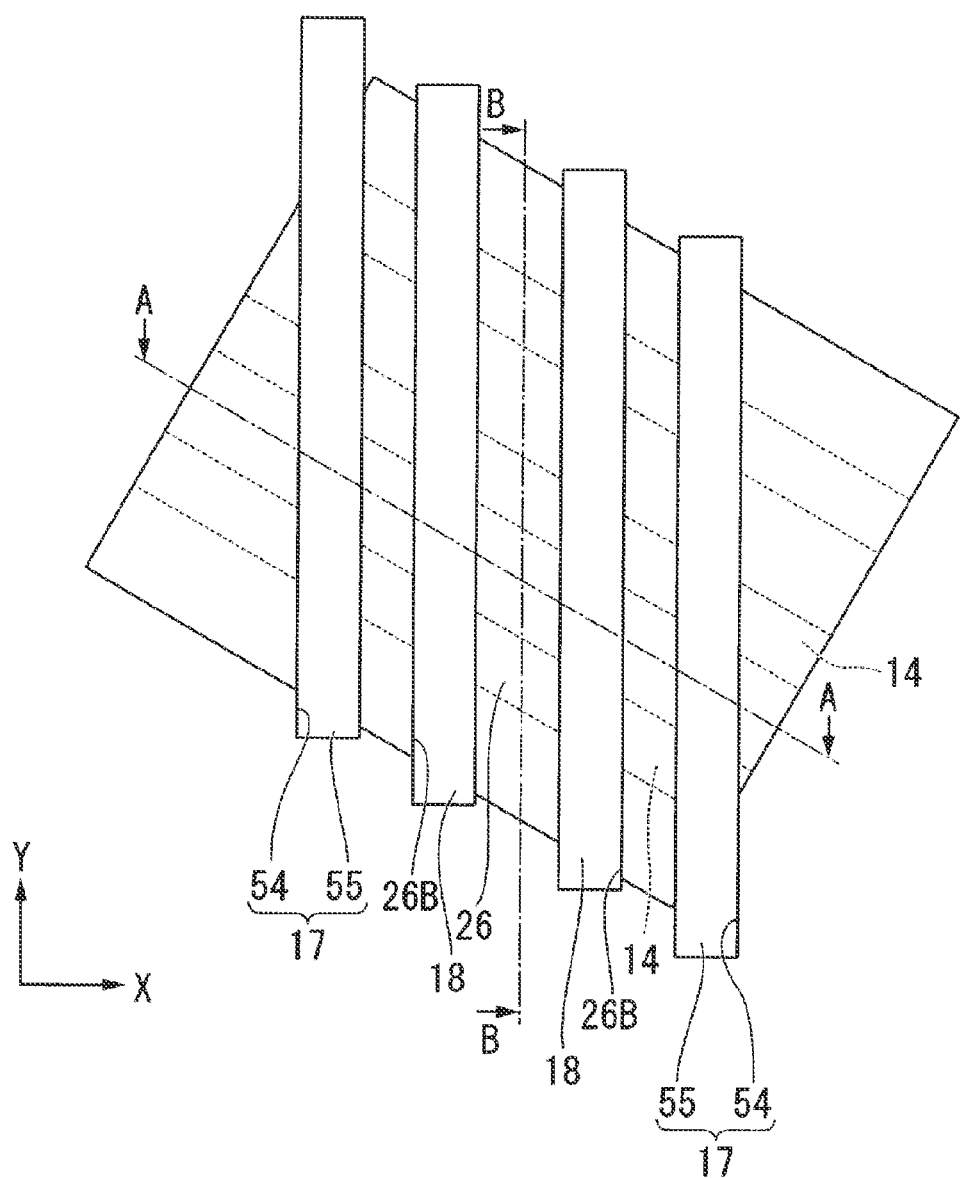
FIG. 23A is a fragmentary plan view of a memory cell array in a step, subsequent to the step of FIGS. 22A, 22B and 22C, involved in the method of forming the semiconductor device of FIG. 16.
Figure 23B:
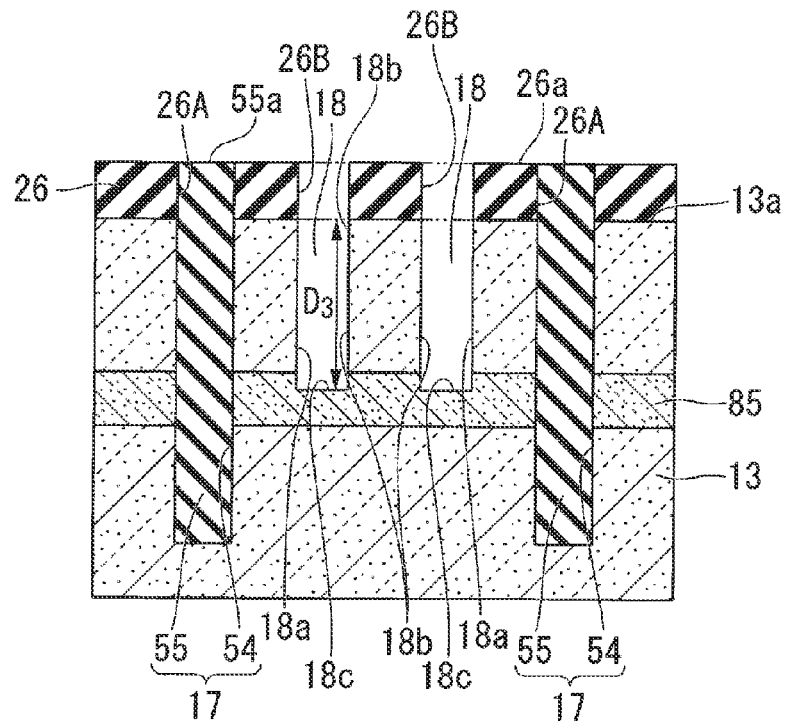
FIG. 23B is a fragmentary cross sectional elevation view, taken along an A-A' line, of a memory cell array in the step of FIG. 23A, involved in the method of forming the semiconductor device of FIG. 16.
Figure 23C:
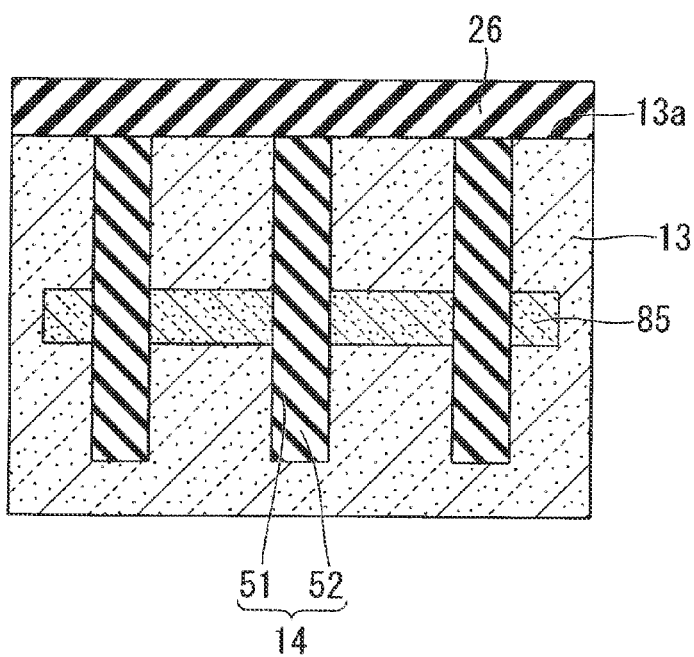
FIG. 23C is a fragmentary cross sectional elevation view, taken along a B-B' line, of the memory cell array in the step of FIG. 23A, involved in the method of forming the semiconductor device of FIG. 16.

FIG. 23A is a plan view of a region in which the memory cell array is formed, FIG. 23B is a cross-sectional view taken along a line A-A of a structure shown in FIG. 23A, and FIG. 23C is a cross-sectional view taken along a line B-B of the structure shown in FIG. 23A.

Figure 24A:
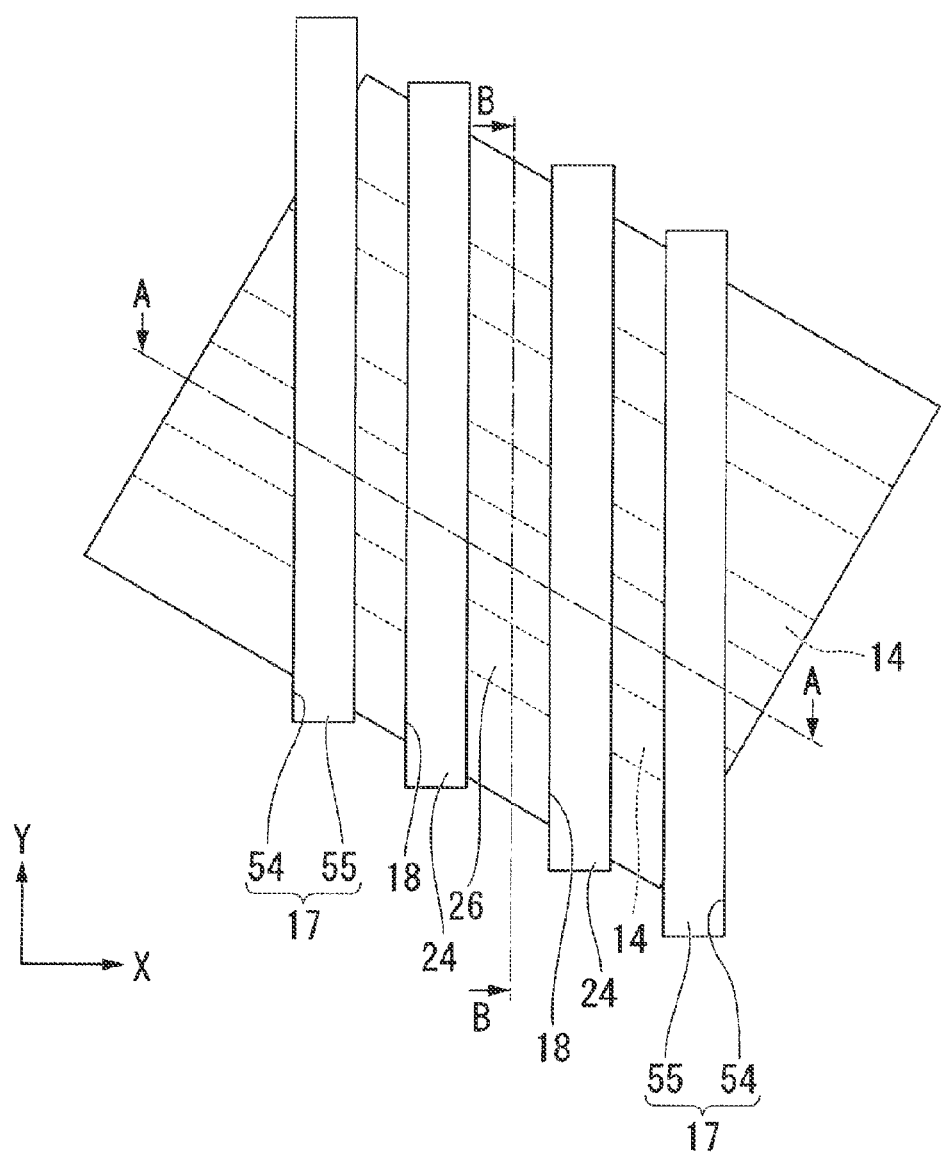
FIG. 24A is a fragmentary plan view of a memory cell array in a step, subsequent to the step of FIGS. 23A, 23B and 23C, involved in the method of forming the semiconductor device of FIG. 16.
Figure 24B:
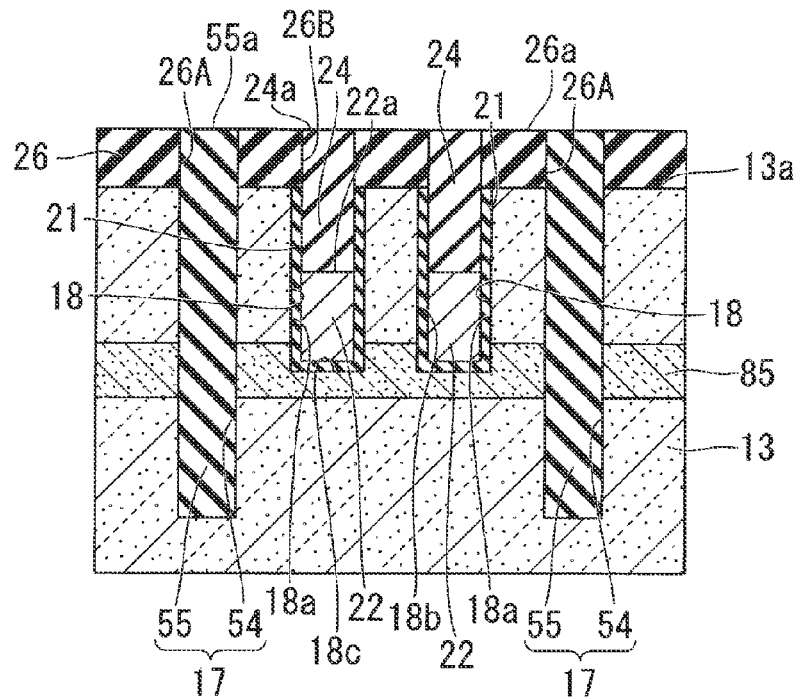
FIG. 24B is a fragmentary cross sectional elevation view, taken along an A-A' line, of a memory cell array in the step of FIG. 24A, involved in the method of forming the semiconductor device of FIG. 16.
Figure 24C:
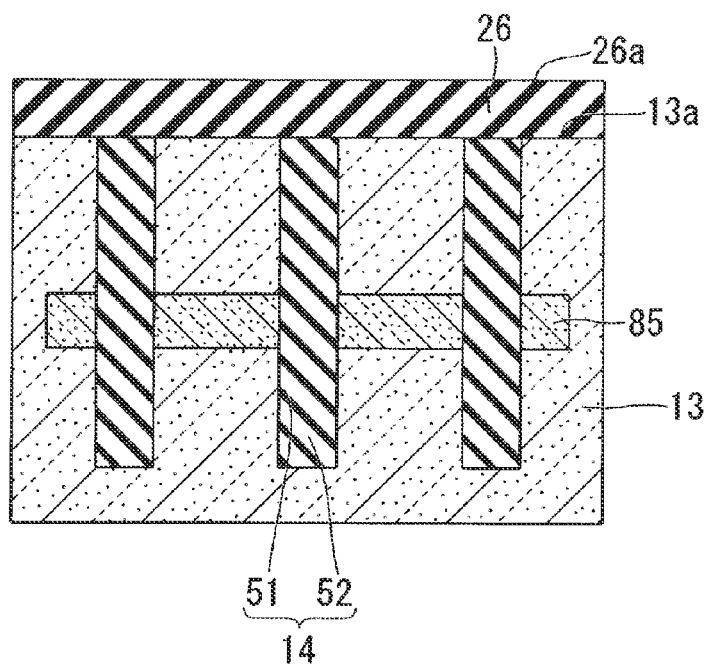
FIG. 24C is a fragmentary cross sectional elevation view, taken along a B-B' line, of the memory cell array in the step of FIG. 24A, involved in the method of forming the semiconductor device of FIG. 16.

FIG. 24A is a plan view of a region in which the memory cell array is formed, FIG. 24B is a cross-sectional view taken along a line A-A of a structure shown in FIG. 24A, and FIG. 24C is a cross-sectional view taken along a line B-B of the structure shown in FIG. 24A.

Figure 25A:
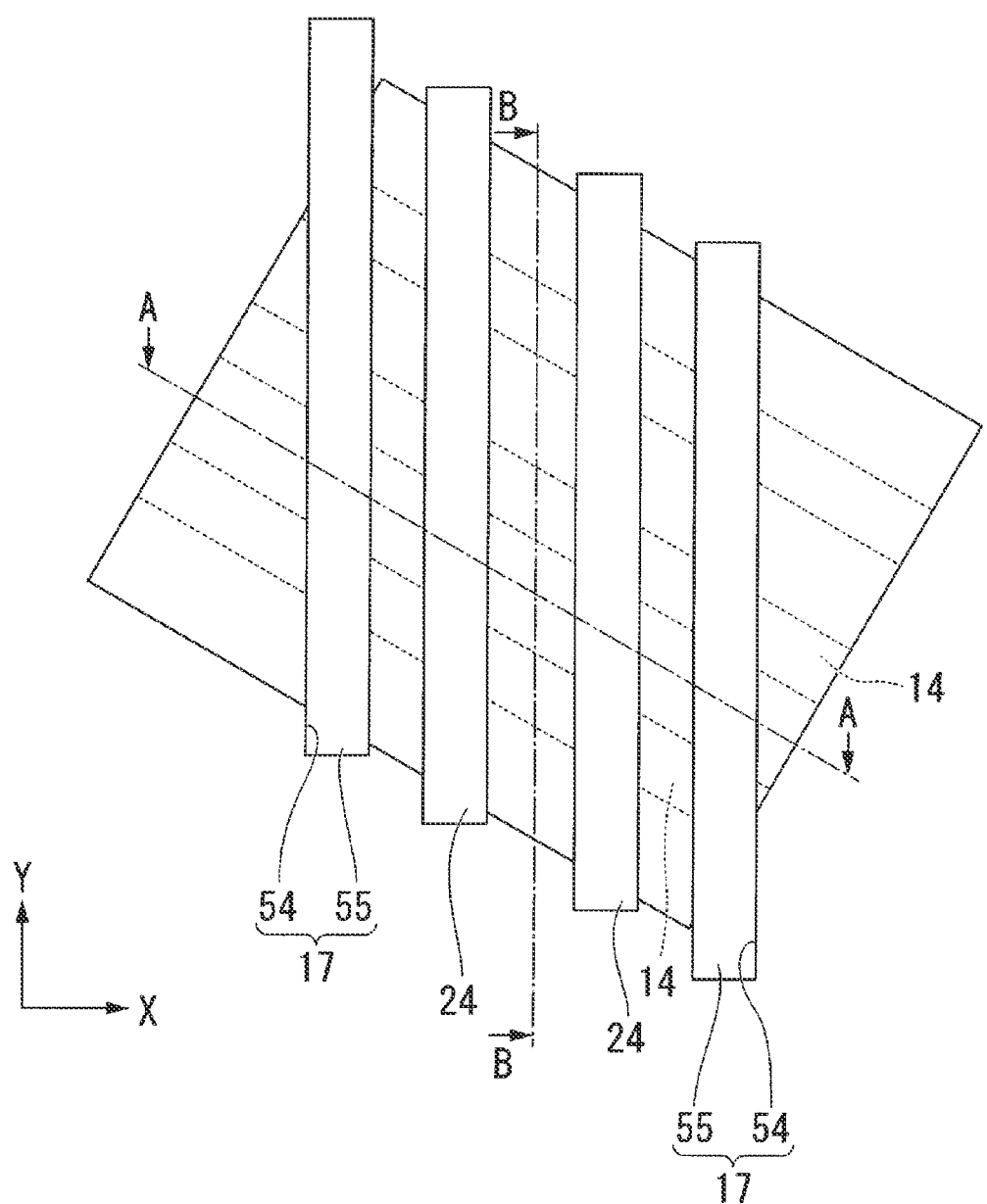
FIG. 25A is a fragmentary plan view of a memory cell array in a step, subsequent to the step of FIGS. 24A, 24B and 24C, involved in the method of forming the semiconductor device of FIG. 16.
Figure 25B:
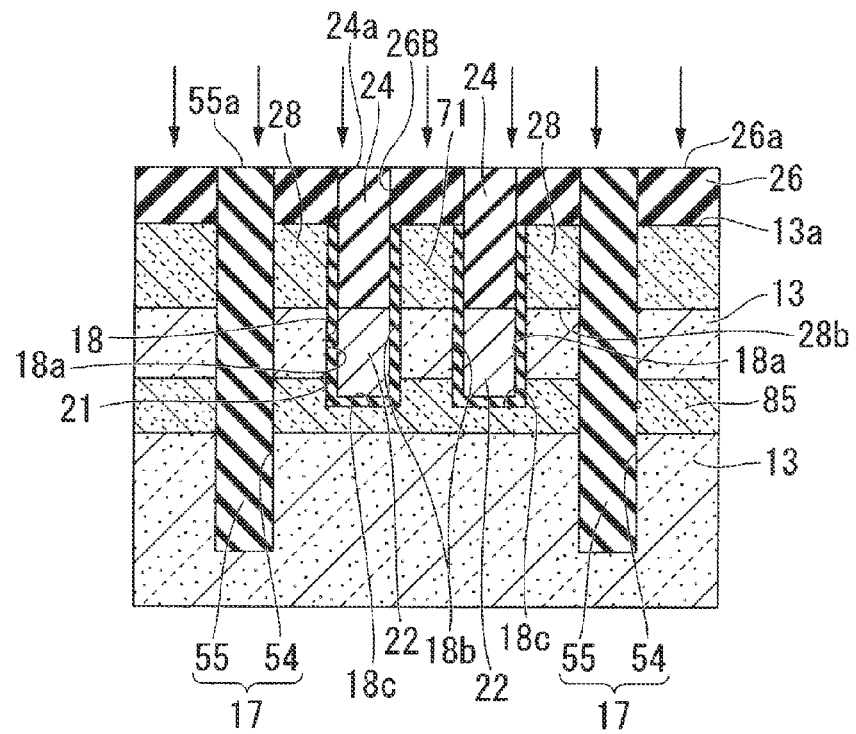
FIG. 25B is a fragmentary cross sectional elevation view, taken along an A-A' line, of a memory cell array in the step of FIG. 25A, involved in the method of forming the semiconductor device of FIG. 16.
Figure 25C:
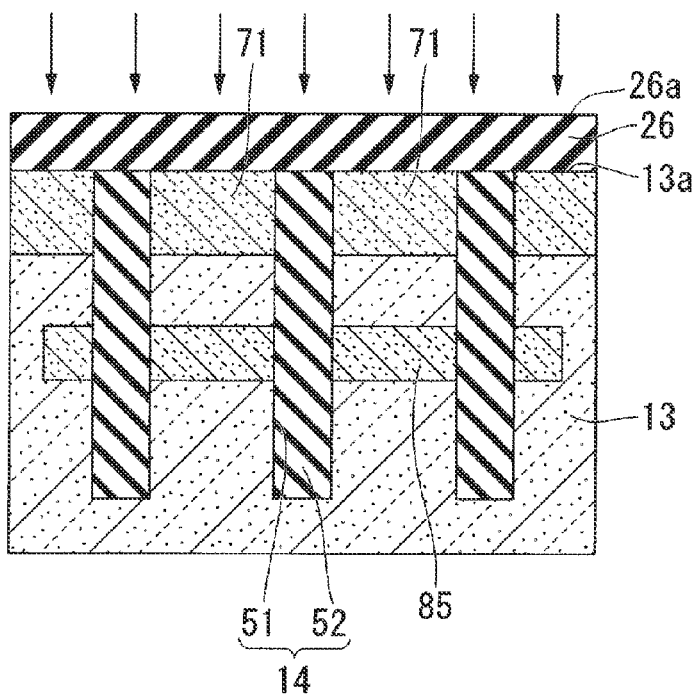
FIG. 25C is a fragmentary cross sectional elevation view, taken along a B-B' line, of the memory cell array in the step of FIG. 25A, involved in the method of forming the semiconductor device of FIG. 16.

FIG. 25A is a plan view of a region in which the memory cell array is formed, FIG. 25B is a cross-sectional view taken along a line A-A of a structure shown in FIG. 25A, and FIG. 25C is a cross-sectional view taken along a line B-B of the structure shown in FIG. 25A.

Figure 26A:
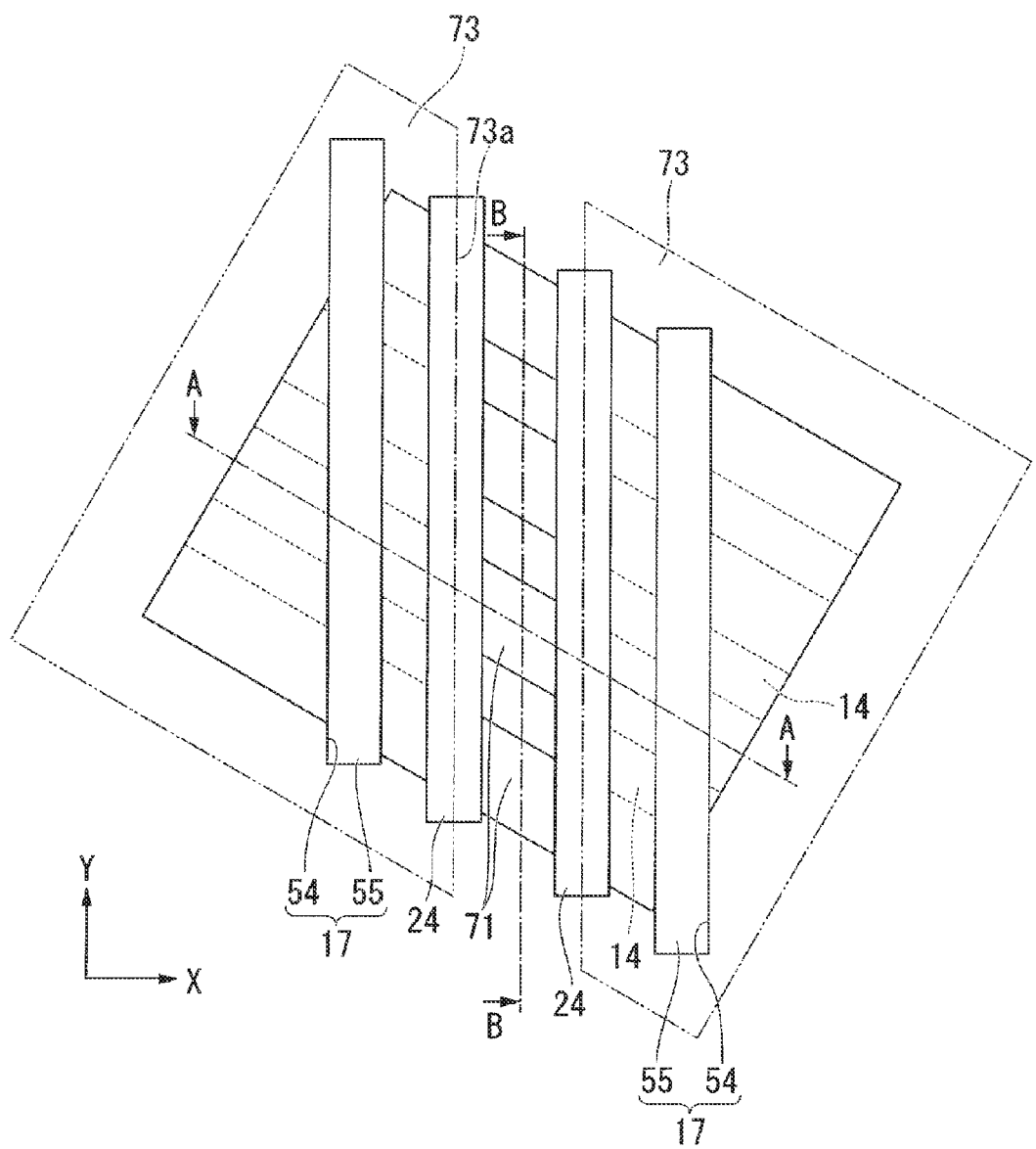
FIG. 26A is a fragmentary plan view of a memory cell array in a step, subsequent to the step of FIGS. 25A, 25B and 25C, involved in the method of forming the semiconductor device of FIG. 16.
Figure 26B:
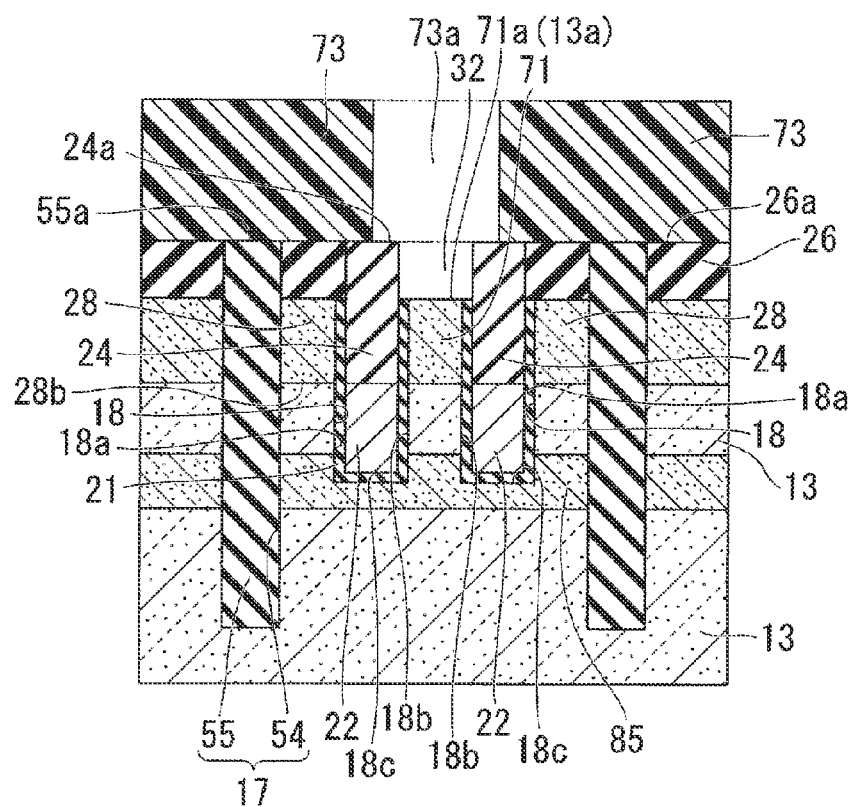
FIG. 26B is a fragmentary cross sectional elevation view, taken along an A-A' line, of a memory cell array in the step of FIG. 26A, involved in the method of forming the semiconductor device of FIG. 16.
Figure 26C:
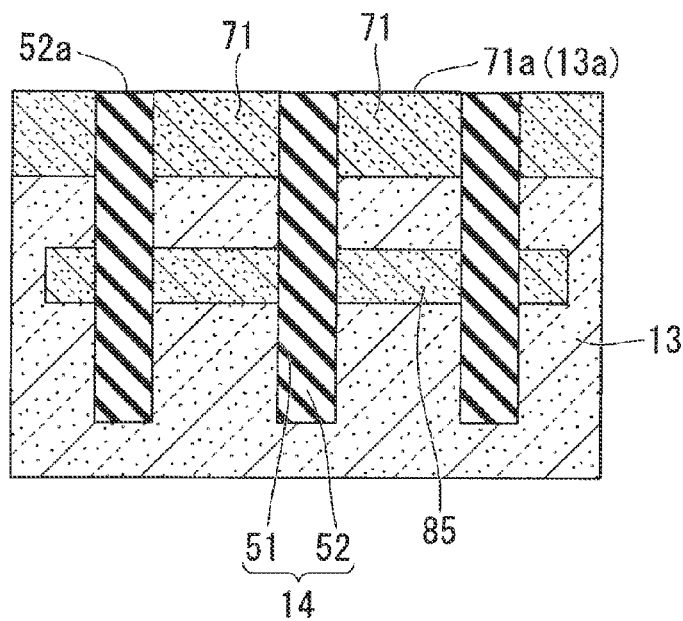
FIG. 26C is a fragmentary cross sectional elevation view, taken along a B-B' line, of the memory cell array in the step of FIG. 26A, involved in the method of forming the semiconductor device of FIG. 16.

FIG. 26A is a plan view of a region in which the memory cell array is formed, FIG. 26B is a cross-sectional view taken along a line A-A of a structure shown in FIG. 26A, and FIG. 26C is a cross-sectional view taken along a line B-B of the structure shown in FIG. 26A.

Figure 27A:
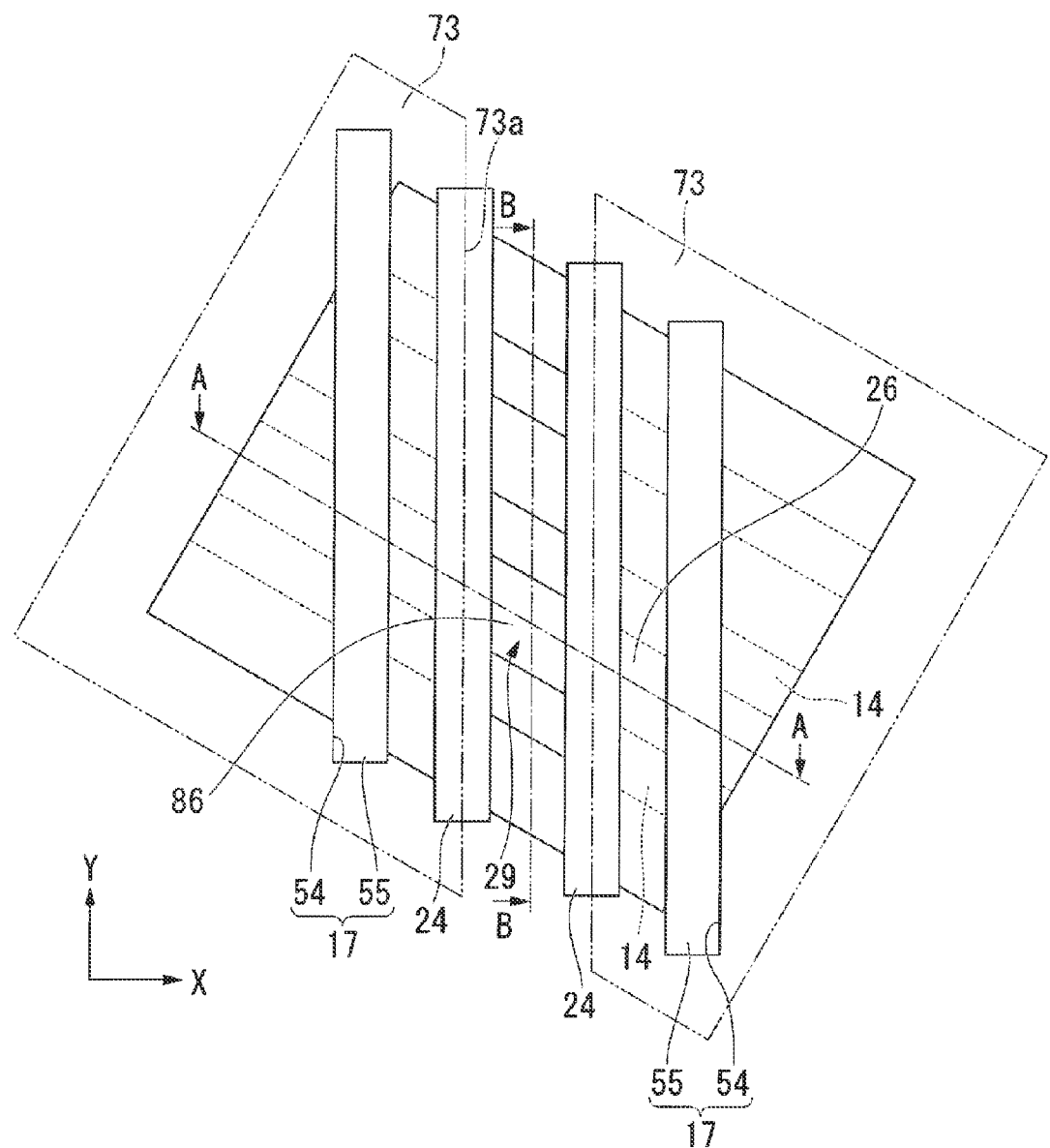
FIG. 27A is a fragmentary plan view of a memory cell array in a step, subsequent to the step of FIGS. 26A, 26B and 26C, involved in the method of forming the semiconductor device of FIG. 16.
Figure 27B:
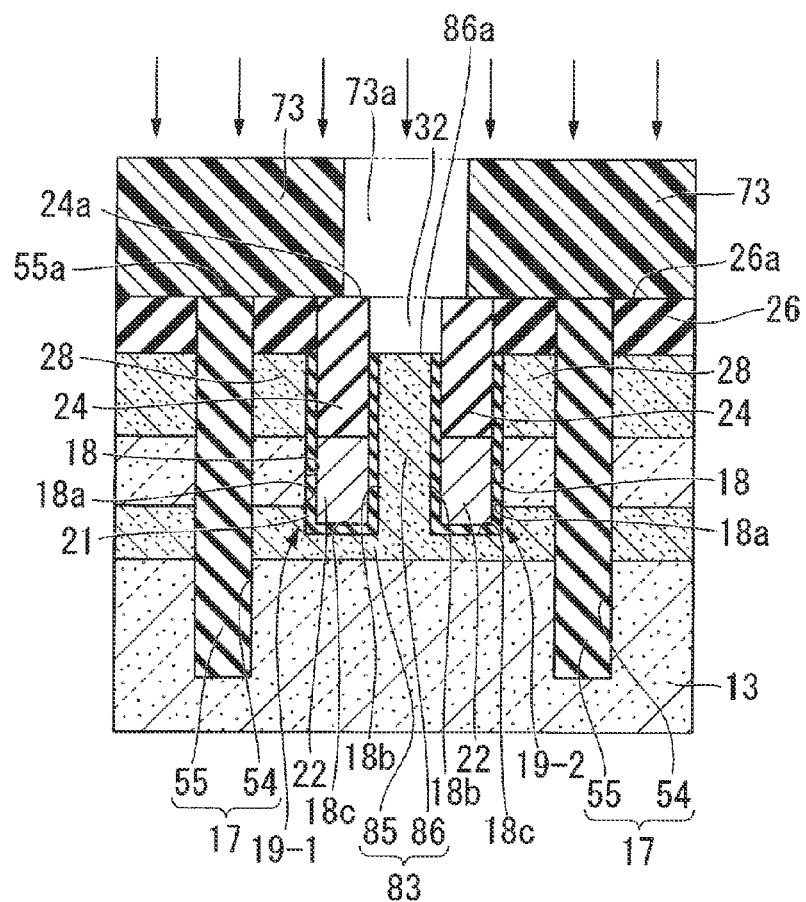
FIG. 27B is a fragmentary cross sectional elevation view, taken along an A-A' line, of a memory cell array in the step of FIG. 27A, involved in the method of forming the semiconductor device of FIG. 16.
Figure 27C:
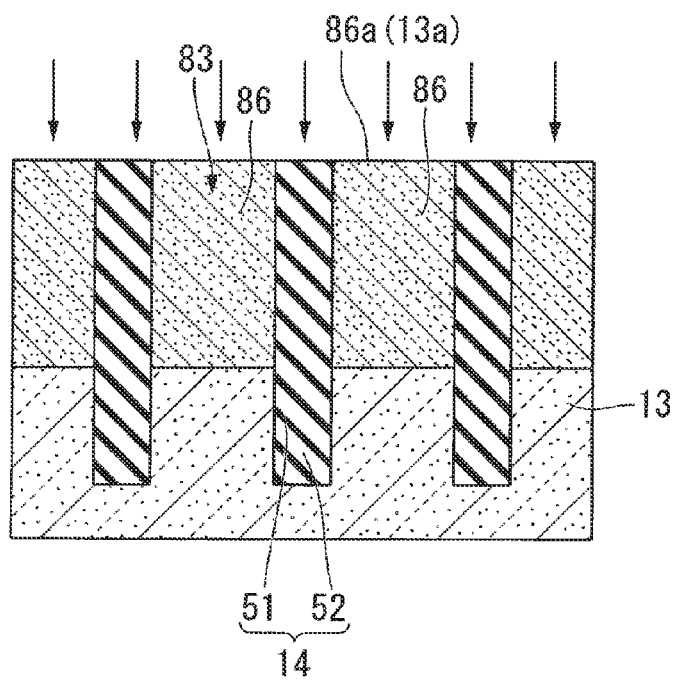
FIG. 27C is a fragmentary cross sectional elevation view, taken along a B-B' line, of the memory cell array in the step of FIG. 27A, involved in the method of forming the semiconductor device of FIG. 16.

FIG. 27A is a plan view of a region in which the memory cell array is formed, FIG. 27B is a cross-sectional view taken along a line A-A of a structure shown in FIG. 27A, and FIG. 27C is a cross-sectional view taken along a line B-B of the structure shown in FIG. 27A.

Figure 28A:
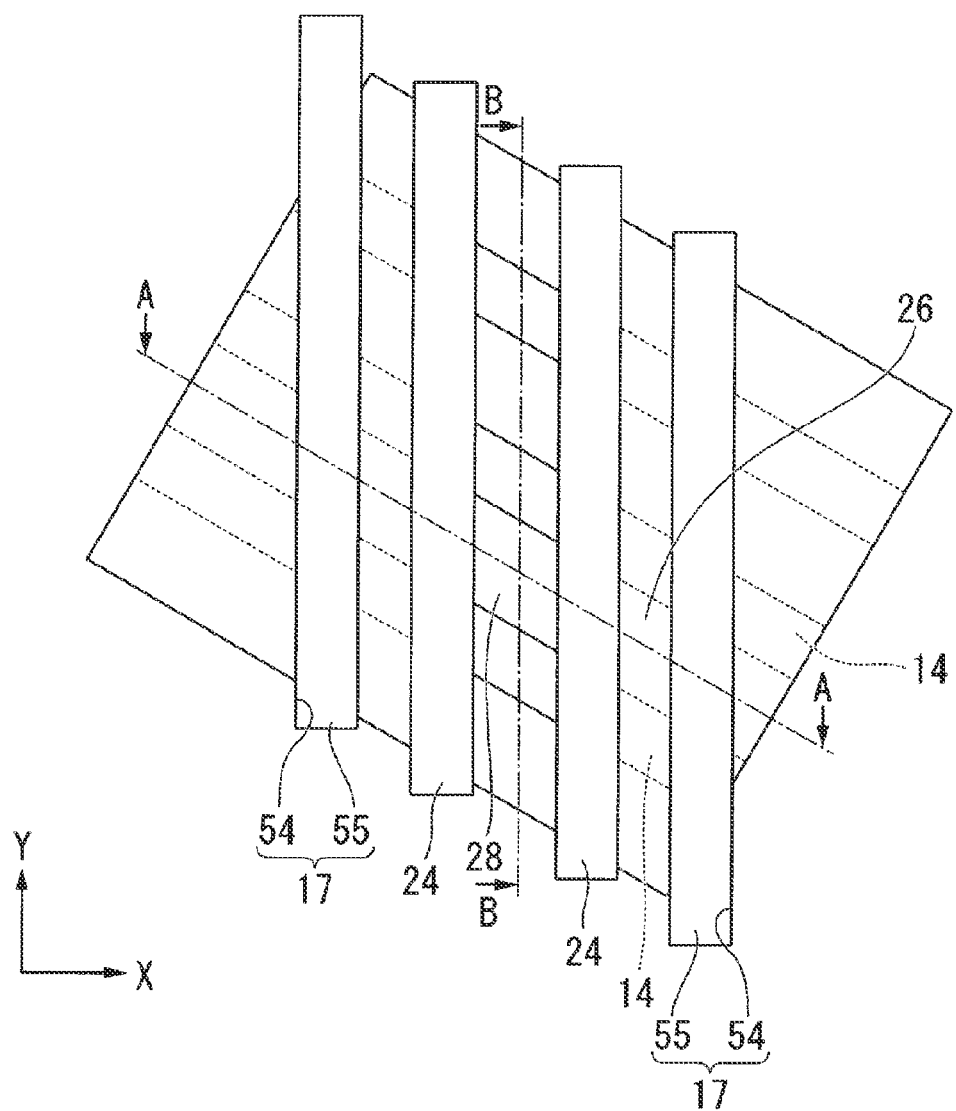
FIG. 28A is a fragmentary plan view of a memory cell array in a step, subsequent to the step of FIGS. 27A, 27B and 27C, involved in the method of forming the semiconductor device of FIG. 16.
Figure 28B:
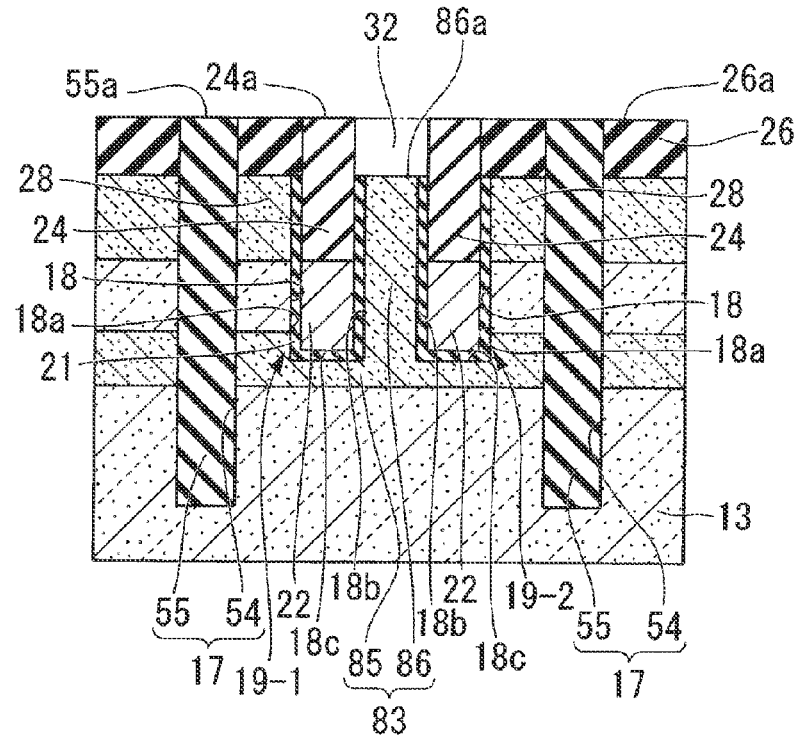
FIG. 28B is a fragmentary cross sectional elevation view, taken along an A-A' line, of a memory cell array in the step of FIG. 28A, involved in the method of forming the semiconductor device of FIG. 16.
Figure 28C:
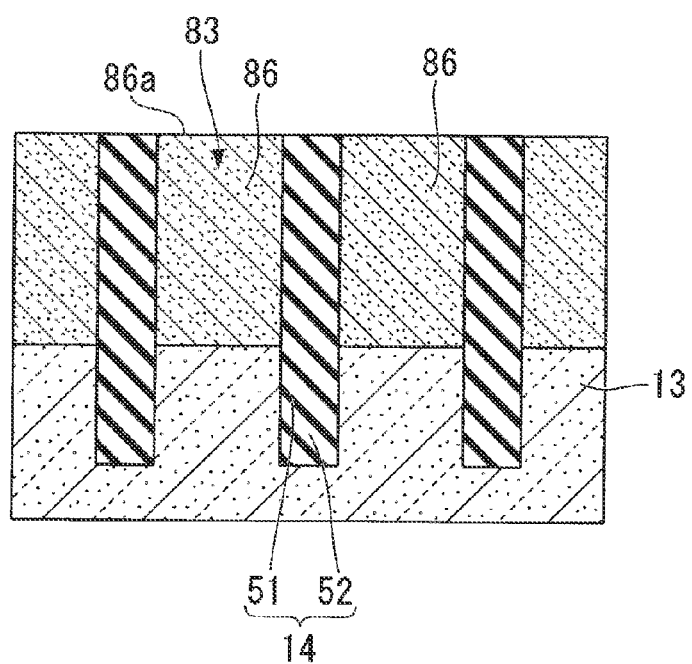
FIG. 28C is a fragmentary cross sectional elevation view, taken along a B-B' line, of the memory cell array in the step of FIG. 28A, involved in the method of forming the semiconductor device of FIG. 16.

FIG. 28A is a plan view of a region in which the memory cell array is formed, FIG. 28B is a cross-sectional view taken along a line A-A of a structure shown in FIG. 28A, and FIG. 28C is a cross-sectional view taken along a line B-B of the structure shown in FIG. 28A.

Figure 29:
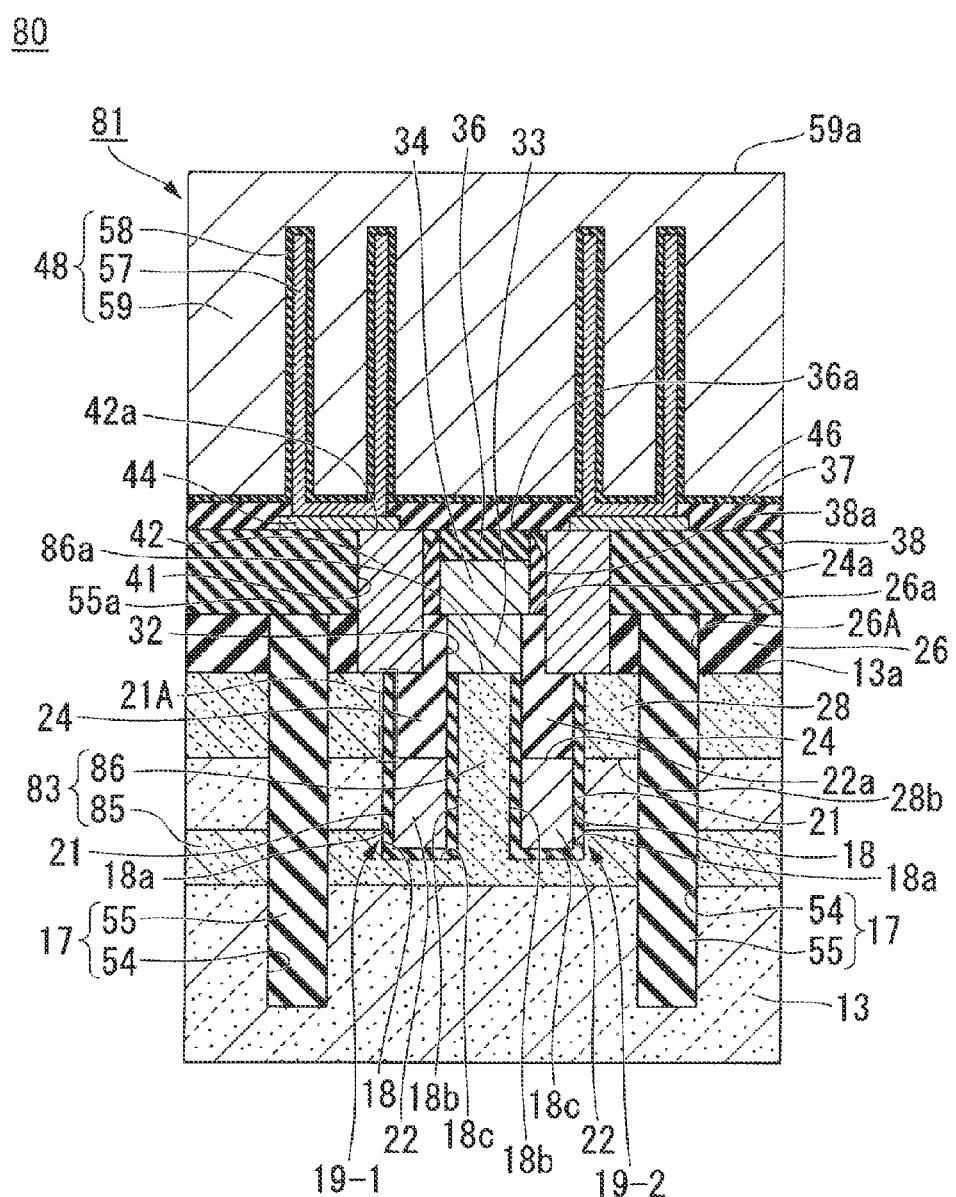
FIG. 29 is a fragmentary cross sectional elevation view with the same section as FIG. 16, of the memory cell array in a step, subsequent to the step of FIGS. 28A, 28B and 28C, involved in the method of forming the semiconductor device of FIG. 16.

Further, the semiconductor device 80 of the second embodiment shown in FIG. 29 corresponds to a cross-section of the semiconductor device 80 of the second embodiment shown in FIG. 16. Further, the line A-A shown in FIG. 17A, FIG. 18A, FIG. 19A, FIG. 20A, FIG. 21A, FIG. 22A, FIG. 23A, FIG. 24A, FIG. 25A, FIG. 26A, FIG. 27A, and FIG. 28A corresponds to a cross-section of the semiconductor device 80 of the second embodiment shown in FIG. 16, which has been previously described.

A method of fabricating the semiconductor device 80 (specifically, memory cell array 81) according to the second embodiment will be described with reference to FIGS. 17A through 17C, FIGS. 18A through 18C, FIGS. 19A through 19Ch, FIGS. 20A through 20C, FIGS. 21A through 21C, FIGS. 22A through 22C, FIGS. 23A through 23C, FIGS. 24A through 24C, FIGS. 25A through 25C, FIGS. 26A through 26C, FIGS. 27A through 27C, FIGS. 28A through 28C, and FIG. 29.

First, in a process shown in FIGS. 17A through 17C, using the same technique as the process shown in FIGS. 3A through 3C, which has been described in the first embodiment, the pad oxide film 65, the trench-shaped silicon nitride film 66 having the apertures 66a, and the trench 91 are sequentially formed (see FIGS. 3A through 3C).

In this case, the apertures 66a are formed to expose the pad oxide film 65 corresponding to the forming region of the trench 91.

Further, the trench 91 is part of the first element isolation trench 51 (see FIG. 1). The trench 91 has substantially the same depth as the gate electrode trench 18 shown in FIG. 16.

If the depth of the gate electrode trench 18 is 150 nm, a depth $D_4$ of the trench 91 (a depth from the main surface 13a of the semiconductor substrate 13) may be, for example, 150 nm. Further, a width W2 of the trench 91 may be, for example, 43 nm.

Next, in a process shown in FIGS. 18A through 18C, impurities having a different conductivity type from the semiconductor substrate 13 are selectively ion-implanted into the bottom 91a of the trench 91 to thereby form the first region 85, which is a layered impurity diffusion region, inside the semiconductor substrate 13.

Specifically, phosphorus (P), which is impurities having a different conductivity type from the n-type impurities (a p-type silicon substrate that is a semiconductor substrate 13e), is selectively ion-implanted into the bottom 91a of the trench 91 using the silicon nitride film 66 having the aperture 66a as a mask under conditions in which energy is 10 KeV and a dose amount is 1E14 atoms/cm², to thereby form the first region 85 having a thickness $M_1$ of 60 nm in a position at which a depth $D_5$ (a depth of a center position of the first region 85 from the main surface 13a of the semiconductor substrate 13) is 150 nm.

Next, in a process shown in FIGS. 19A through 19C, the semiconductor substrate 13 located downward from the trench 91 shown in FIGS. 18A through 18C is etched by anisotropic etching (specifically, dry etching) using the silicon nitride film 66 having the apertures 66a as a mask to thereby form a plurality of first element isolation trenches 51.

Accordingly, the plurality of first element isolation trenches 51 pass through the first layer region 85, with the bottoms 51c of first element isolation trenches 51 arranged downward from the first region 85.

The depth $D_1$ of the first element isolation trench 51 (a depth from the main surface 13a of the semiconductor substrate 13) may be, for example, 250 nm.

Next, in a process shown in FIGS. 20A through 20C, the first element isolation insulating film 52 burying the first element isolation trench 51 is formed using the same technique as the process shown in FIGS. 4A through 4C, which has been described in the first embodiment (see FIGS. 4A through 4C).

Accordingly, a plurality of first element isolation regions 14 consisting of the first element isolation trench 51 and the first element isolation insulating film 52 and that are deeper than the first region 85 are formed and the band-shaped active region 16 extending in the second direction is partitioned by the first element isolation region 14.

Next, in a process shown in FIGS. 21A through 21C, the silicon nitride film 66 and the pad oxide film 65 are sequentially removed using the same technique as the process shown in FIGS. 5A through 5C, which has been described in the first embodiment, and then the first element isolation insulating film 52 protruding from the main surface 13a of the semiconductor substrate 13 is removed to thereby make an upper surface 52a of the first element isolation insulating film 52 flush with the main surface 13a of the semiconductor substrate 13 (see FIGS. 5A through 5C).

Next, in a process shown in FIGS. 22A through 22C, the mask insulating film 26 having the trench-shaped aperture 26A, the second element isolation trench 54 deeper than the first region 85, and the second element isolation insulating film 55 having an upper surface 55a flush with the upper surface 26a of the silicon nitride film 26 and burying the second element isolation trench 54 are sequentially formed using the same technique as the process shown in FIGS. 6A through 6C, which has been described in the first embodiment (see FIGS. 6A through 6C).

Accordingly, the second element isolation region 17 consisting of the second element isolation trench 54 and the second element isolation insulating film 55, partitioning the band-shaped active region 16 shown in FIGS. 21A through 21C into a plurality of element forming regions R, and passing through the first region 85 is formed.

The depth $D_2$ of the second element isolation trench 54 (a depth from the main surface 13a of the semiconductor substrate 13) may be, for example, 250 nm.

Thus, after the first element isolation region 14 consisting of the first element isolation trench 51 formed in the semiconductor substrate 13 and the first element isolation insulating film 52 burying the first element isolation trench 51 and partitioning the band-shaped active region 16 is formed, the second element isolation region 17 consisting of the second element isolation trench 54 formed in the semiconductor substrate 13 and the second element isolation insulating film 55 burying the second element isolation trench 54 and partitioning the plurality of element forming regions R is formed. Accordingly, the first and second transistors 19-1 and 19-2 can be easily turned on and a data retention characteristic of the memory cell array 81 can be improved so that a potential of the dummy gate electrode does not adversely affect the first and second transistors 19-1 and 19-2 (see FIG. 16), in comparison with a case in which a dummy gate electrode (not shown) to which a negative potential is applied through the gate insulating film 21 is provided in the second element isolation trench 54 to partition a plurality of element forming regions R.

Next, in a process shown in FIGS. 23A through 23C, using the same technique as the process shown in FIGS. 7A through 7C, which has been described in the first embodiment, the trench-shaped aperture 26B is formed in the mask insulating film 26 and then two gate electrode trenches 18 are formed so that second side surfaces 18b face each other (see FIGS. 7A through 7C).

In this case, the two gate electrode trenches 18 are formed so that bottoms 18c of the gate electrode trenches 18 reach the first region 85 (expose the first region 85). Accordingly, the bottoms 18c of the two gate electrode trenches 18 are covered with the first region 85.

A depth $D_3$ of the two gate electrode trenches 18 (a depth from the main surface 13a of the semiconductor substrate 13) is smaller than the depths $D_1$ and $D_2$ of the first and second element isolation trenches 51 and 54. When the depths $D_1$ and $D_2$ of the first and second element isolation trenches 51 and 54 are 250 nm, the depth $D_3$ of the gate electrode trench 18 may be, for example, 150 nm.

Next, in a process shown in FIGS. 24A through 24C, the gate insulating film 21, the gate electrode 22, and a buried insulating film 24 having an upper surface 24a flush with the upper surface 26a of the mask insulating film 26 are sequentially formed using the same technique as the process shown in FIGS. 8A through 8C, which has been described in the first embodiment (see FIGS. 8A through 8C).

Accordingly, since the gate insulating film 21 formed on the bottom 18c of the gate electrode trench 18 is covered with the first region 85, the semiconductor substrate 13 constituting the bottom 18c of the gate electrode trench 18 does not function as a channel when the first and second transistors 19-1 and 19-2 shown in FIG. 16 operate.

Next, in a process shown in FIGS. 25A through 25C, phosphorus (P), which is impurities having a different conductivity type from the n-type impurities (a p-type silicon substrate that is a semiconductor substrate 13), is ion-implanted into an entire upper surface of the structure shown in FIGS. 24A through 24C using the same technique as the process shown in FIGS. 9A through 9C, which has been described in the first embodiment under conditions in which energy is 100 KeV and a dose amount is 1E14 atoms/cm$^2$.

Accordingly, the first impurity diffusion region 28 is formed at a side of the main surface 13*a* of the semiconductor substrate 13 located between the gate electrode trench 18 and the first element isolation region 17, and the second impurity diffusion region 83 that is part of the impurity diffusion region 71 is formed in the semiconductor substrate 13 located between the two gate electrode trenches 18 (see FIGS. 9A through 9C).

In this case, the first impurity diffusion region 28 and the impurity diffusion region 71 are formed not to contact the first region 85. Further, a thickness of the mask insulating film 26 in this step may be, for example, 50 nm.

Next, in a process shown in FIGS. 26A through 26C, photoresist 73 having a trench-shaped aperture 73*a* and an aperture 32 exposing the upper surface 71*a* of the impurity diffusion region 71 are sequentially formed using the same technique as the process shown in FIGS. 10A through 10C, which has been described in the first embodiment (FIGS. 10A through 10C see).

Next, in a process shown in FIGS. 27A through 27C, phosphorus (P), which is impurities having a different conductivity type from the n-type impurities (a p-type silicon substrate that is a semiconductor substrate 13), is selectively ion-implanted into the semiconductor substrate 13 that is exposed from the photoresist 73 and in which the impurity diffusion region 71 has been formed (in other words, the semiconductor substrate 13 located between the two gate electrode trenches 18) under conditions in which energy is 100 KeV and a dose amount is 1E14 atoms/cm$^2$.

Accordingly, the second region 86 (the region that is part of the second impurity diffusion region 83) contacting the first region 85 and covering the gate insulating film 21 arranged in the second side surfaces 18*b* of the two gate electrode trenches 18 is formed in the entire semiconductor substrate 13 located between the two gate electrode trenches 18.

Accordingly, the second impurity diffusion region 83 consisting of the first and second regions 85 and 86 and covering the gate insulating film 21 arranged in the second side surfaces 18*b* and bottoms 18*c* of the two gate electrode trenches 18 is formed, and the first and second transistors 19-1 and 19-2 each including the gate insulating film 21, the gate electrode 22, the buried insulating film 24, the first impurity diffusion region 28, and the second impurity diffusion region 83 are formed.

Thus, the second impurity diffusion region 83 is formed in the semiconductor substrate 13 to cover the gate insulating film 21 arranged on the second side surfaces 18*b* and bottoms 18*c* of the two gate electrode trenches 18, thereby enabling only one surface (the first side surface 18*a*) among three surfaces of the gate electrode trench 18 (specifically, the first and second opposing side surfaces 18*a* and 18*b*, and the bottom 18*c*) to be used as a channel region.

Accordingly, when the first and second transistors 19-1 and 19-2 (see FIG. 16) enter an on state, a channel region in which on current flows can be reduced in comparison with a conventional transistor. Thus, even in the miniaturized memory cell, the channel resistance can be reduced to increase on current.

Further, when one of the first and second transistors 19-1 and 19-2 operates, the other transistor can be suppressed from malfunctioning. Accordingly, even when the semiconductor device 80 is miniaturized and the gate electrode 22 is arranged with a small pitch, the first and second transistors 19-1 and 19-2 can be operated independently and stably.

Next, in a process shown in FIGS. 28A through 28C, the photoresist 73 shown in FIGS. 27A and 27B is removed.

Next, in a process shown in FIG. 29, using the same technique as the process shown in FIG. 13, which has been described in the first embodiment, the contact plug 33 burying the aperture 32 and contacting the upper surface 86*a* of the second region 86, the bit line 34, and the cap insulating film 36 are formed en bloc, and then the sidewall film 37 and the interlayer insulating film 38 are sequentially formed (see FIG. 13).

Further, the sidewall film 37 may be formed by sequentially stacking a silicon nitride film (SiN film) and a silicon oxide film (SiO$_2$ film).

Accordingly, when a coated insulating film (specifically, silicon oxide film (SiO$_2$ film)) formed as an interlayer insulating film 38 by an SOG method is formed, wettability of the silicon oxide film (coated insulating film) is enhanced. Thus, generation of voids in the silicon oxide film (coated insulating film) can be suppressed.

Next, using the same technique as the process shown in FIG. 14, which has been described in the first embodiment, the contact hole 41, the capacitive contact plug 42 contacting the upper surface 28*a* of the first impurity diffusion region 28, the capacitive contact pad 44, the silicon nitride film 46, and the capacitor 48 consisting of the lower electrode 57, the capacitive insulating film 58, and the upper electrode 59 are sequentially formed.

Then, an interlayer insulating film, a via, and a wiring, which are not shown, are formed on the upper surface 59*a* of the upper electrode 59 to thereby fabricate the semiconductor device 80 of the second embodiment.

According to the method of fabricating a semiconductor device of the second embodiment, n-type impurities having a different conductivity type from the semiconductor substrate 13 (p-type silicon substrate) are selectively ion-implanted to form the first layered region 85, and then n-type impurities are selectively ion-implanted into an entire portion of the semiconductor substrate 13 arranged between the two gate electrode trenches 18 to form the second region 86 contacting the first layered region 85, resulting in the second impurity diffusion region 83 consisting of the first and second regions 85 and 86 and covering the gate insulating film 21 formed on the second side surfaces 18*b* and the bottoms 18*c* of the two gate electrode trenches 18. Accordingly, when the first and second transistors 19-1 and 19-2 are operated, a channel region can be formed only in the semiconductor substrate 13 contacting a lower portion of the gate insulating film 21 arranged on the first side surface 18.

Accordingly, when the first and second transistors 19-1 and 19-2 (see FIG. 16) enter an on state, a channel region in which on current flows can be reduced in comparison with a conventional transistor. Thus, even in the miniaturized memory cell, the channel resistance can be reduced to increase on current.

Further, when one of the first and second transistors 19-1 and 19-2 operates, the other transistor can be suppressed from malfunctioning. Thus, even when the semiconductor device 80 is miniaturized and the gate electrode 22 is arranged with a small pitch, the first and second transistors 19-1 and 19-2 can be operated independently and stably.

Further, the first region 85 covering the gate insulating film 21 arranged on the bottom 18*c* of the gate electrode trench 18, provided in a layer shape inside the semiconductor substrate 13 along a horizontal plane including the bottom 18*c* and divided into a plurality of regions by the first and second element isolation regions 14 and 17 is formed, and then the second region 86 reaching the first region 85 arranged downward from the second region 86 is formed in an entire portion of the semiconductor substrate 13 sandwiched between the two gate electrode trenches 18 to thereby form the second impurity diffusion region 83 consisting of the first and second regions 85 and 86. Accordingly, a state in which "L" is accumulated in the lower electrode 57 electrically connected with the first transistor 19-1 and "H" is accumulated in the lower electrode 57 electrically connected with the first transistor 19-1 is obtained. In this state, when on/off of the gate electrode 22 (word line) corresponding to the first transistor 19-1 is repeated, the electrons e− induced in the channel of the first transistor 19-1 (not shown) are trapped by the first region 85 containing n-type impurities. Thus, the electrons e− induced in the channel of the first transistor 19-1 can be prevented from reaching the second impurity diffusion region 83 (drain region) constituting the second transistor 19-2.

Accordingly, generation of a disturbance defect, in which an accumulation state of one cell is changed due to an operation state of the other adjacent cell, can be prevented so that H information resulting from electrons e− induced in the channel of the first transistor 19-1 being accumulated in the lower electrode 57 electrically connected with the second transistor 19-2 is not destructed and the state is not changed into an L state.

Further, even in a DRAM in which an interval between the two gate electrodes 22 arranged to be adjacent to each other is equal to or less than 50 nm, the generation of the disturbance defect can be prevented.

Figure 30A:
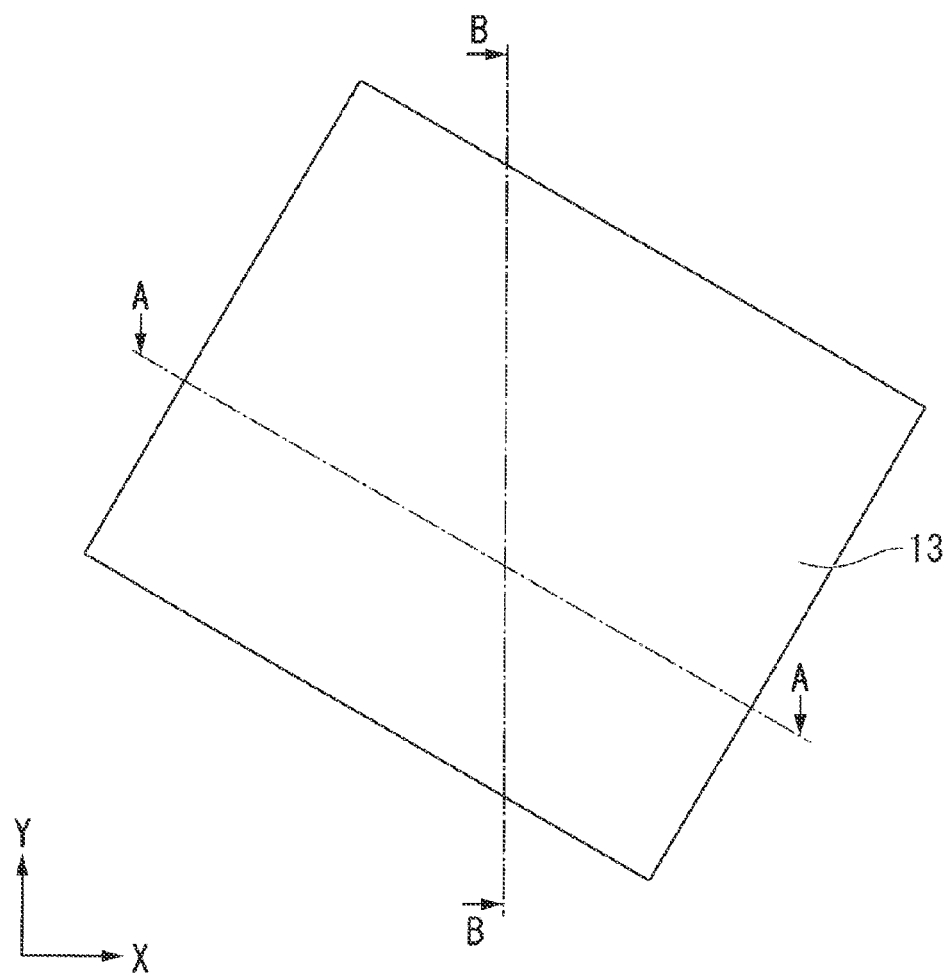
FIG. 30A is a fragmentary plan view of a memory cell array in a step involved in a method of forming the semiconductor device of FIG. 16 in a modified example of the second embodiment of the invention.
Figure 30B:
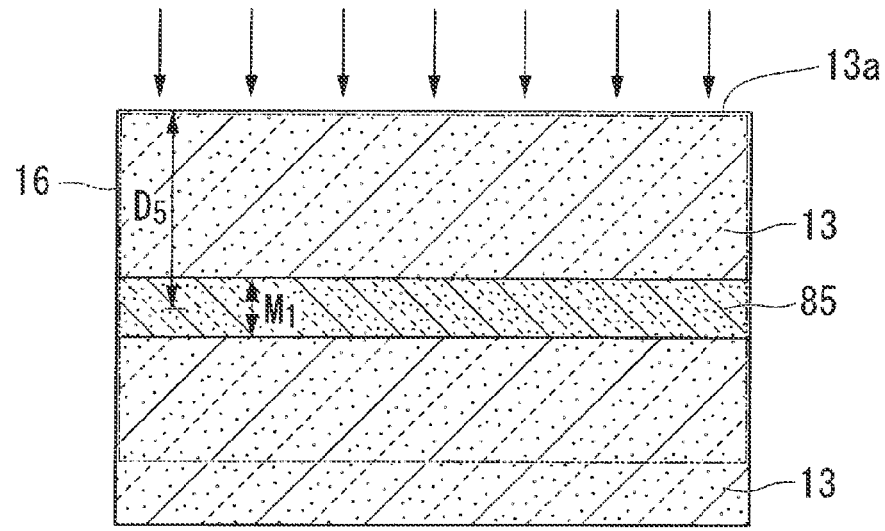
FIG. 30B is a fragmentary cross sectional elevation view, taken along an A-A' line, of a memory cell array in the step of FIG. 30A, involved in the method of forming the semiconductor device of FIG. 16.
Figure 30C:
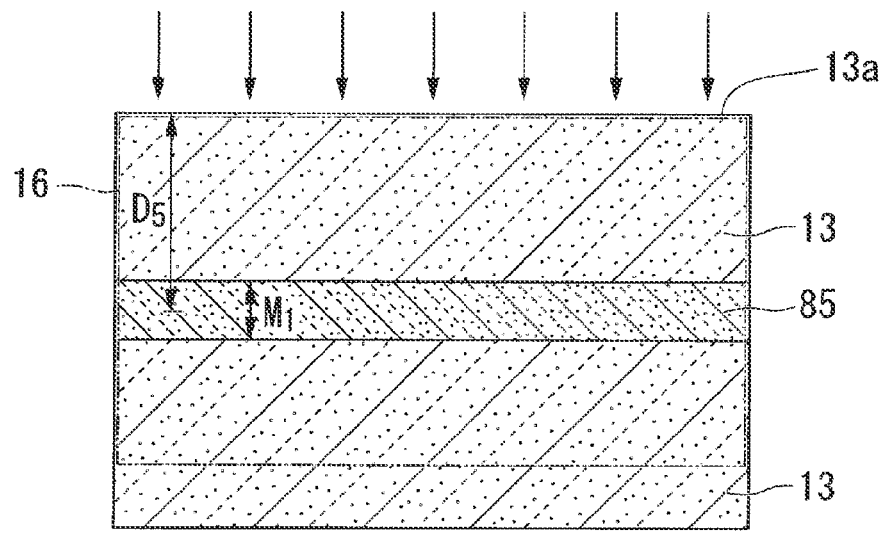
FIG. 30C is a fragmentary cross sectional elevation view, taken along a B-B' line, of the memory cell array in the step of FIG. 30A, involved in the method of forming the semiconductor device of FIG. 16.

FIGS. 30A through 30C are views showing a variant of a process of fabricating the memory cell array provided in the semiconductor device according to the second embodiment of the present invention.

FIG. 30A is a plan view of a region in which the memory cell array is formed, FIG. 30B is a cross-sectional view taken along a line A-A of a structure shown in FIG. 30A, and FIG. 30C is a cross-sectional view taken along a line B-B of the structure shown in FIG. 30A. Further, the line A-A shown in FIG. 30A corresponds to a cross-section of the semiconductor device 80 of the second embodiment shown in FIG. 16, which has been previously described.

Next, a method of fabricating a variant of the memory cell array 81 provided in the semiconductor device 80 according to the second embodiment will be described with main reference to FIGS. 30A through 30C.

First, in a process shown in FIGS. 30A through 30C, impurities having a different conductivity type from the semiconductor substrate 13 are selectively ion-implanted into the entire main surface 13a of the semiconductor substrate 13 to thereby form the first region 85, which is a layered impurity diffusion region, inside the semiconductor substrate 13.

Specifically, phosphorus (P), which is impurities having a different conductivity type from the n-type impurities (a p-type silicon substrate that is a semiconductor substrate 13), is ion-implanted into the entire main surface 13a of the semiconductor substrate 13 under conditions in which energy is 120 KeV and a dose amount is 1E14 atoms/cm$^2$, to thereby form the first region 101 having a thickness $M_1$ of 60 nm in a position of depth $D_5$ (a depth of a center position of the first region 101 from the main surface 13a of the semiconductor substrate 13) of 150 nm.

Next, the same process as the process shown in FIGS. 3A through 3C, which has been described in the first embodiment, is performed to thereby form a structure shown in FIGS. 19A through 19C, which has been described in the second embodiment.

Then, the processes from the process shown in FIGS. 20A through 20C to the process shown in FIG. 29, which have been described in the second embodiment, are sequentially performed to thereby fabricate the semiconductor device 80 of the second embodiment shown in FIG. 16.

Thus, the first region 85 that is part of the second impurity diffusion region 96 may be first formed, and with the method of fabricating a variant of the semiconductor device 80, the same effects as those of the method of fabricating the semiconductor device 80 of the second embodiment can be obtained.

Third Embodiment

Figure 31:
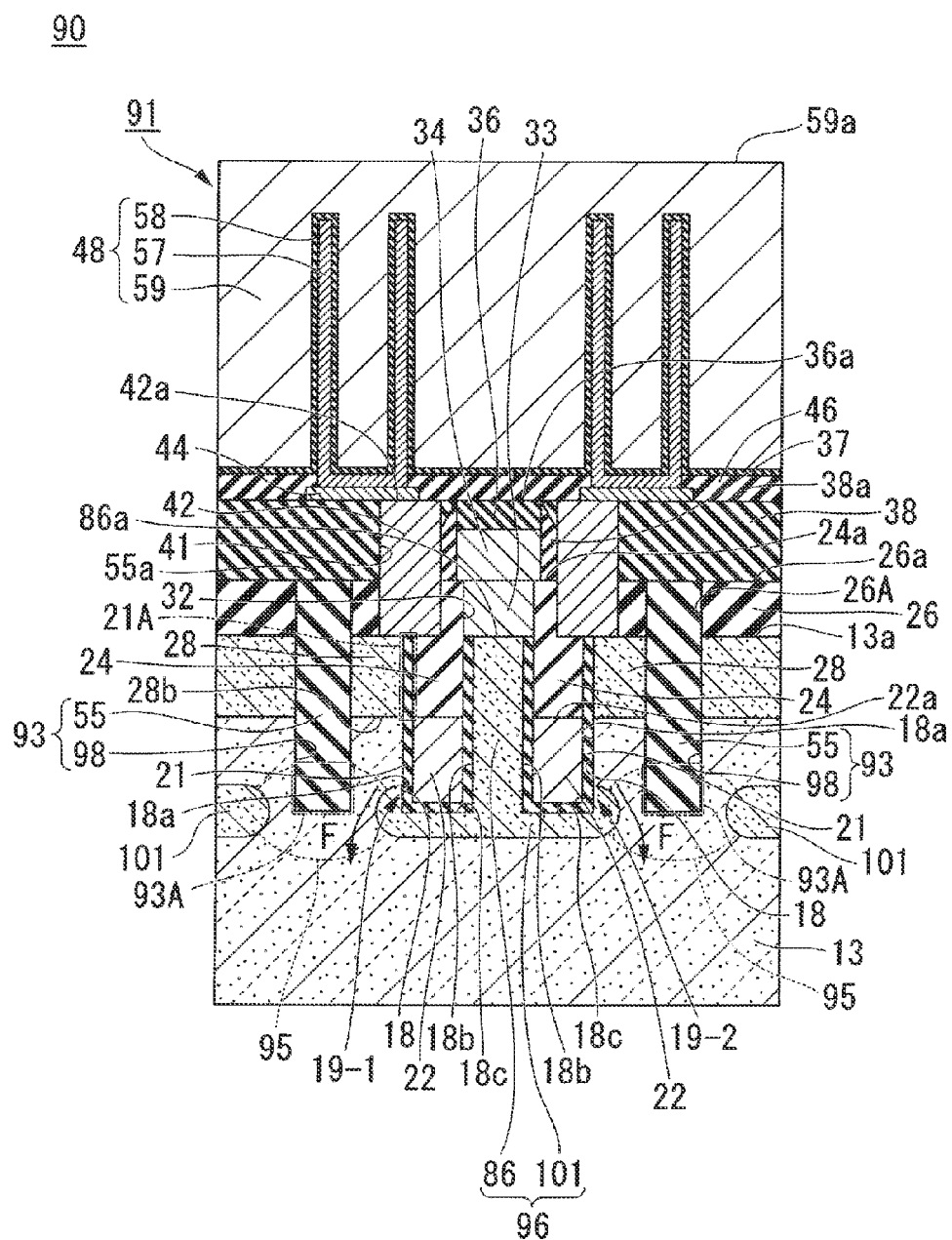
FIG. 31 is a fragmentary cross sectional elevation view, taken along an A-A' line of FIG. 1, of a semiconductor device in a third embodiment of the invention.

FIG. 31 is a cross-sectional view of the memory cell array provided in the semiconductor device according to the third embodiment of the present invention, and corresponds to a cross-section taken along a line A-A shown in FIG. 1.

In FIG. 31, a DRAM is described as an example of a semiconductor device 90 of the third embodiment. Further, in FIG. 31, in fact, a bit line 34 extending in an X direction shown in FIG. 1 is schematically shown. Further, in FIG. 31, the same components as those of the semiconductor device 80 of the second embodiment shown in FIG. 16 are assigned the same reference numerals.

Referring to FIG. 31, the semiconductor device 90 of the third embodiment has the same configuration as the semiconductor device 80 except that the semiconductor device 90 includes a memory cell array 91 as an alternative to the memory cell array 81 provided in the semiconductor device 80 of the second embodiment.

The memory cell 91 has the same configuration as the memory cell array 81 except that a second element isolation region 93 and a second impurity diffusion region 96 are provided as an alternative to the second element isolation region 17 and the second impurity diffusion region 83 provided in the memory cell array 81 described in the second embodiment, and a third impurity diffusion region 95 is provided.

The second element isolation region 93 is formed by burying the second element isolation trench 98 having substantially the same depth as the gate electrode trench 18 with the second element isolation insulating film 55. The upper surface 55a of the second element isolation insulating film 55 constituting the second element isolation region 93 is flush with the upper surface 26a of the mask insulating film 26.

If the depth of the gate electrode trench 18 is 150 nm, the depth of the second element isolation trench 98 may be, for example, 150 nm.

The third impurity diffusion region 95 is a region that is formed by ion-implanting p-type impurities having the same conductivity type as the semiconductor substrate 13 (p-type silicon substrate) into the semiconductor substrate 13 at a high concentration. That is, a p-type impurity concentration of the third impurity diffusion region 95 is higher than that of the semiconductor substrate 13. When the p-type impurity concentration of the semiconductor substrate 13 is 1E16 atoms/cm$^2$, the p-type impurity concentration of the third impurity diffusion region 95 may be, for example, 1E19 atoms/cm$^2$.

The third impurity diffusion region 95 is arranged to surround the bottom 93A of the second element isolation region 93 and contacts the second adjacent impurity diffusion region 96 (specifically, the first region 101). The third impurity diffusion region 95 is an impurity diffusion region for preventing the first region 101, which will be described later, constituting the second impurity diffusion region 96 from contacting the second element isolation region 93.

The second impurity diffusion region 96 has the same configuration as the second impurity diffusion region 83 except that a first layered region 101 is provided as an alternative to the first layered region 85 provided in the second impurity diffusion region 83 described in the second embodiment.

The first region 101 is formed with the same depth as the third impurity diffusion region 95 and is integrally formed with the second region 86. An n-type impurity diffusion region may be used as the second impurity diffusion region 96 including the first region 101.

The first region 101 covers the gate insulating film 21 formed in the bottoms 18c of the two gate electrode trenches 18. The first region 101 is formed by partitioning the second layered region 86 described in the second embodiment into element forming regions by the third impurity diffusion region 95.

The first region 101 contacts the third impurity diffusion region 95 without contact with the second element isolation region 93. Accordingly, the third impurity diffusion region 95 is formed between the first region 101 and the second element isolation region 93.

According to the semiconductor device of the third embodiment, the second element isolation region 93 has substantially the same depth as the two gate electrode trenches 18, and the third impurity diffusion region 95 containing p-type impurities having the same conductivity type as the semiconductor substrate (p-type silicon substrate) at a higher concentration than the semiconductor substrate, provided in the semiconductor substrate 13 to surround the bottom 93A of the second element isolation region 93, and contacting the first region 101 is provided. Accordingly, a path for releasing extra charges accumulated in the semiconductor substrate 13 located between the gate electrode 22 and the second element isolation region 93 (a path for releasing charges in the semiconductor substrate 13 located downward from the third impurity diffusion region 95) can be formed between the bottom 93A of the second element isolation region 93 and the first region 101. Thus, the first and second transistors 19-1 and 19-2 can be operated independently and stably.

Further, the second impurity diffusion region 96 consisting of the first region 101 covering the gate insulating film 21 formed on the bottoms 18c of the two gate electrode trenches 18 and divided into element forming regions by the third impurity diffusion region 95, and the second region 86 provided in an entire portion of the semiconductor substrate 13 sandwiched between the two gate electrode trenches 18, reaching the first region 101 arranged downward from the second region 86 and integrally formed with the first region 101 is provided. Accordingly, a state in which "L" is accumulated in the lower electrode 57 electrically connected with the first transistor 19-1 and "H" is accumulated in the lower electrode 57 electrically connected with the first transistor 19-1 is obtained. In this state, when on/off of the gate electrode 22 (word line) corresponding to the first transistor 19-1 is repeated, electrons e– induced in the channel of the first transistor 19-1 (not shown) are trapped by the first region 101 containing n-type impurities. Thus, the electrons e– induced in the channel of the first transistor 19-1 can be suppressed from reaching the second impurity diffusion region 96 (drain region) constituting the second transistor 19-2.

Accordingly, generation of a disturbance defect, in which an accumulation state of one cell is changed due to an operation state of the other adjacent cell, can be suppressed so that H information resulting from electrons e– induced in the channel of the first transistor 19-1 being accumulated in the lower electrode 57 electrically connected with the second transistor 19-2 is not destructed and the state is not changed into an L state.

Further, even in a DRAM in which an interval between the two gate electrodes 22 arranged to be adjacent to each other is equal to or less than 50 nm, the generation of the disturbance defect can be suppressed.

Further, with the semiconductor device 90 of the third embodiment, the same effects as those of the semiconductor device 80 of the second embodiment can be obtained.

FIG. 32A through 32C, FIGS. 33A through 33C, FIG. 34A through 34C, FIGS. 35A through 35C, FIGS. 36A through 36C, FIGS. 37A through 37C, FIG. 38A through 38C, FIG. 39A through 39C, and FIG. 40 are views showing a process of fabricating a memory cell provided in a semiconductor device according to the third embodiment of the present invention.

Figure 32A:
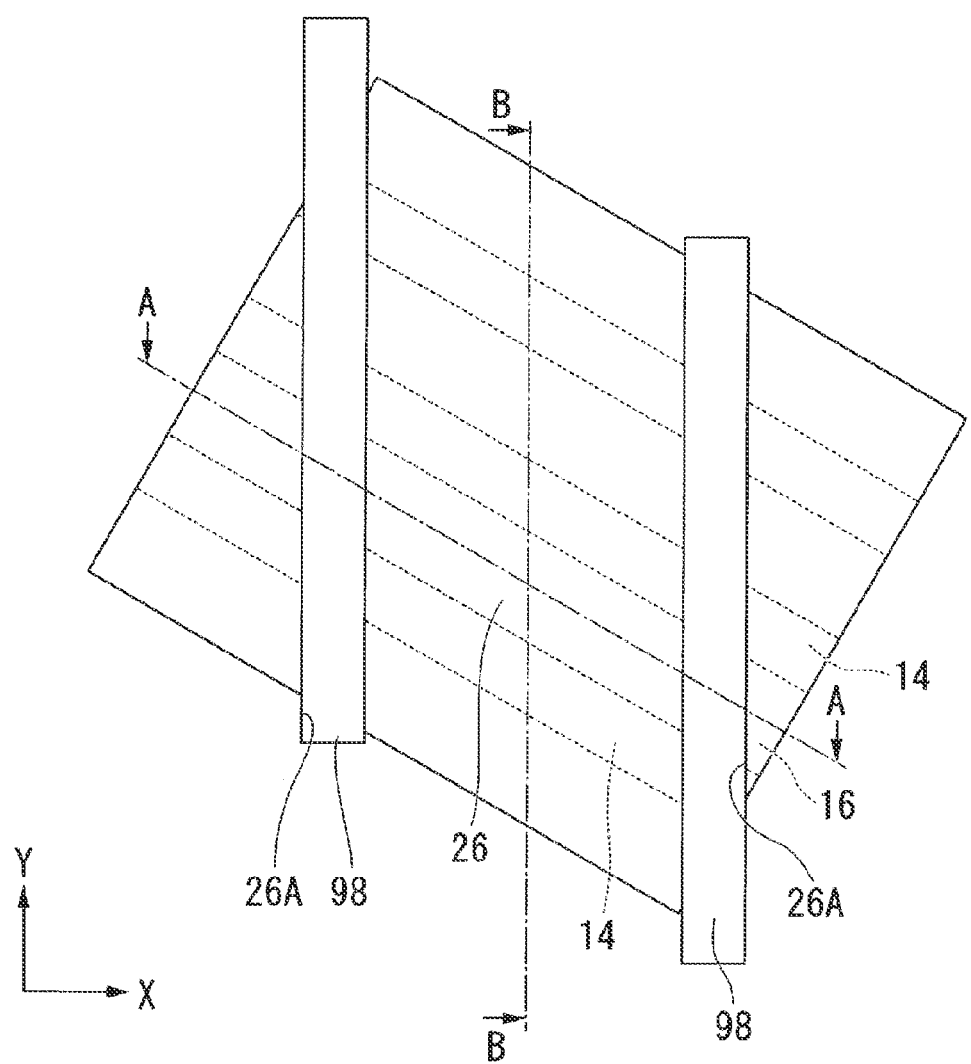
FIG. 32A is a fragmentary plan view of a memory cell array in a step involved in a method of forming the semiconductor device of FIG. 31.
Figure 32B:
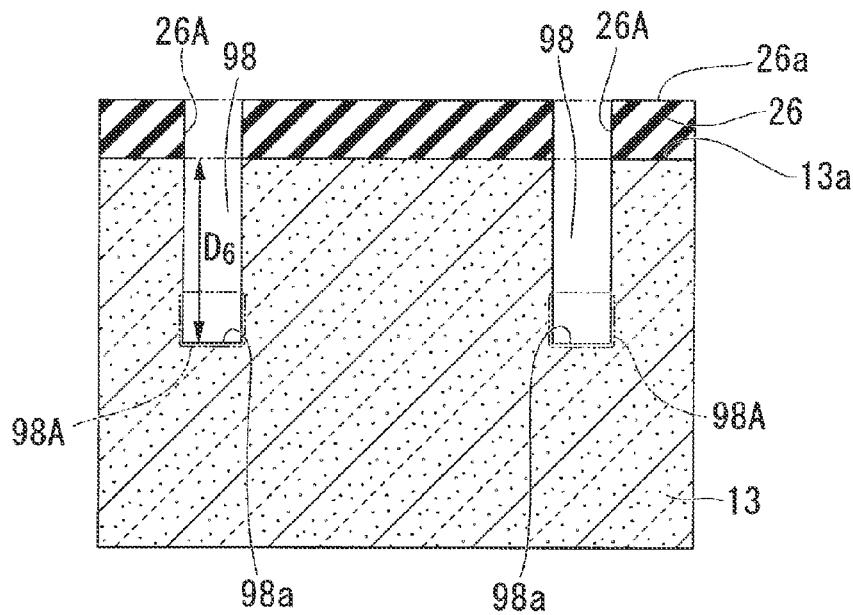
FIG. 32B is a fragmentary cross sectional elevation view, taken along an A-A' line, of a memory cell array in the step of FIG. 17A, involved in the method of forming the semiconductor device of FIG. 31.
Figure 32C:
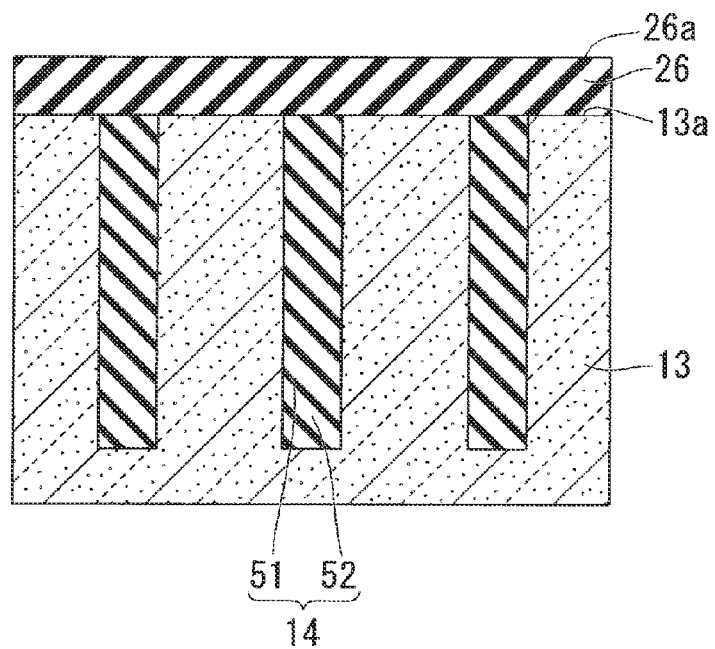
FIG. 32C is a fragmentary cross sectional elevation view, taken along a B-B' line, of the memory cell array in the step of FIG. 32A, involved in the method of forming the semiconductor device of FIG. 31.

FIG. 32A is a plan view of a region in which the memory cell array is formed, FIG. 32B is a cross-sectional view taken along a line A-A of a structure shown in FIG. 32A, and FIG. 32C is a cross-sectional view taken along a line B-B of the structure shown in FIG. 32A.

Figure 33A:
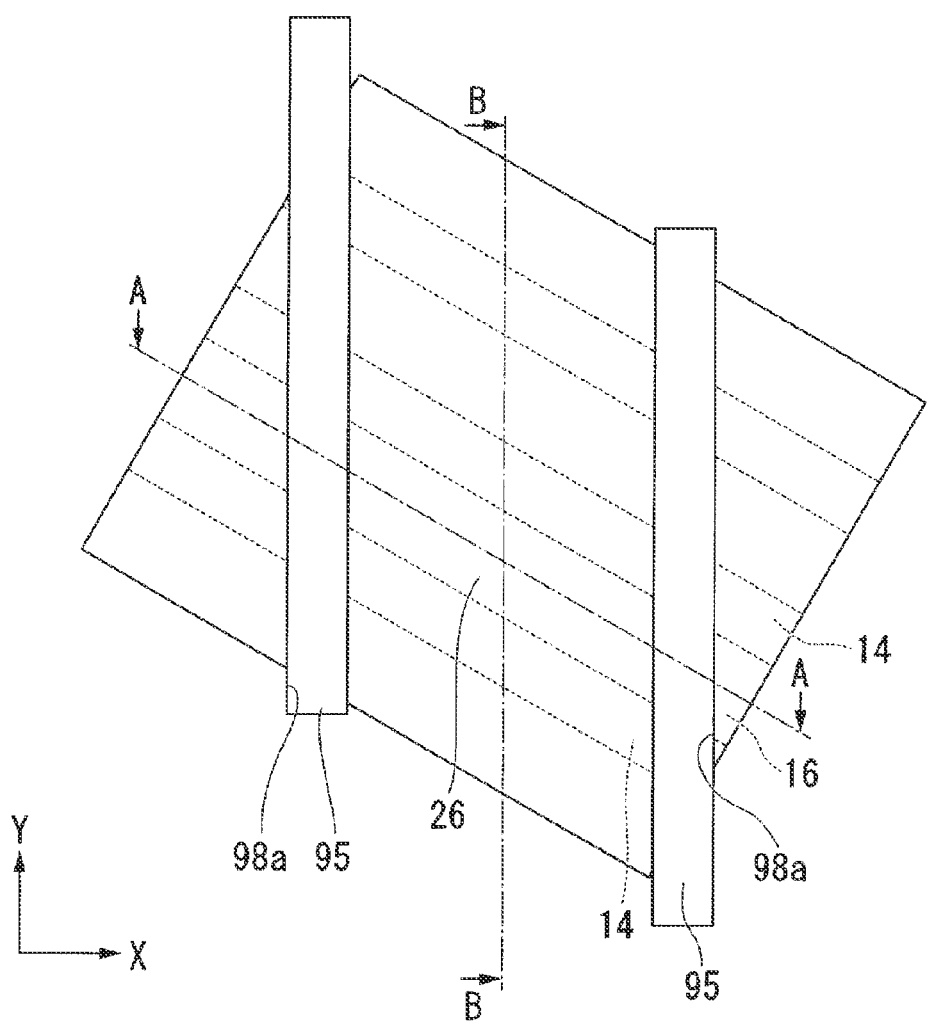
FIG. 33A is a fragmentary plan view of a memory cell array in a step, subsequent to the step of FIGS. 32A, 32B and 32C, involved in the method of forming the semiconductor device of FIG. 31.
Figure 33B:
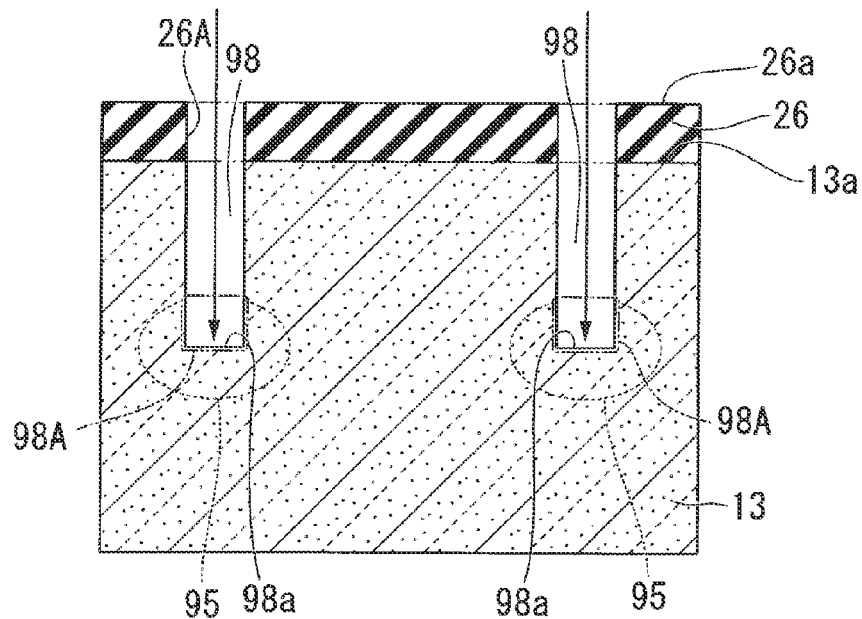
FIG. 33B is a fragmentary cross sectional elevation view, taken along an A-A' line, of a memory cell array in the step of FIG. 32A, involved in the method of forming the semiconductor device of FIG. 31.
Figure 33C:
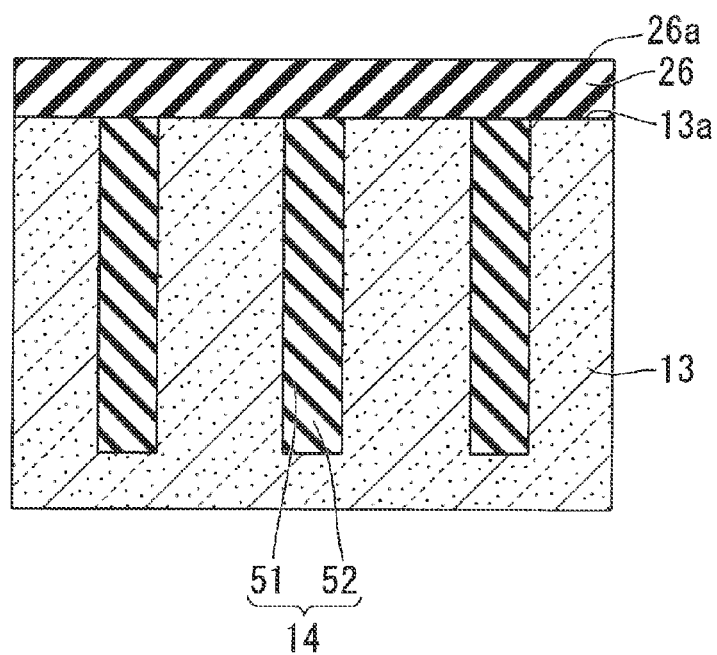
FIG. 33C is a fragmentary cross sectional elevation view, taken along a B-B' line, of the memory cell array in the step of FIG. 32A, involved in the method of forming the semiconductor device of FIG. 31.

FIG. 33A is a plan view of a region in which the memory cell array is formed, FIG. 33B is a cross-sectional view taken along a line A-A of a structure shown in FIG. 33A, and FIG. 33C is a cross-sectional view taken along a line B-B of the structure shown in FIG. 33A.

Figure 34A:
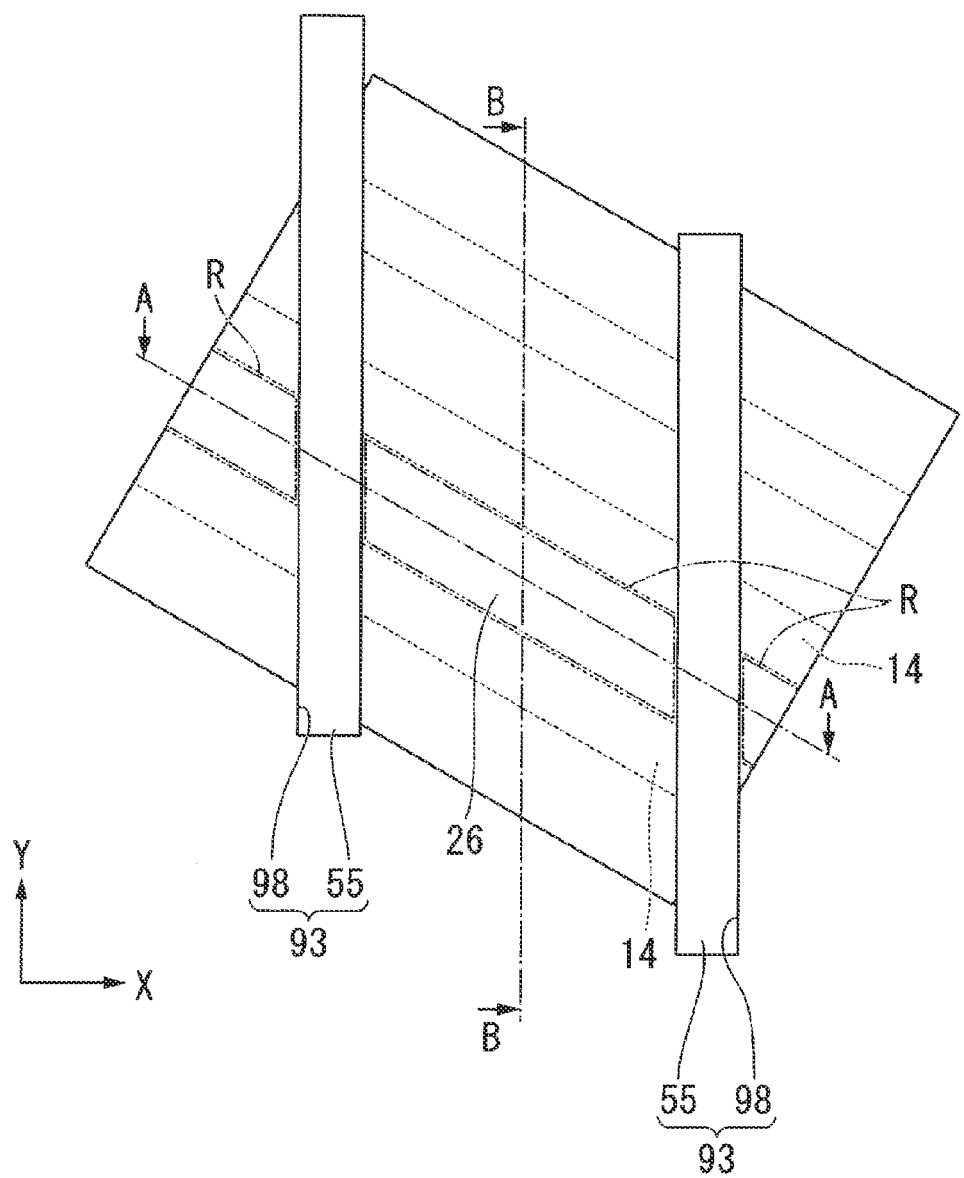
FIG. 34A is a fragmentary plan view of a memory cell array in a step, subsequent to the step of FIGS. 33A, 33B and 33C, involved in the method of forming the semiconductor device of FIG. 31.
Figure 34B:
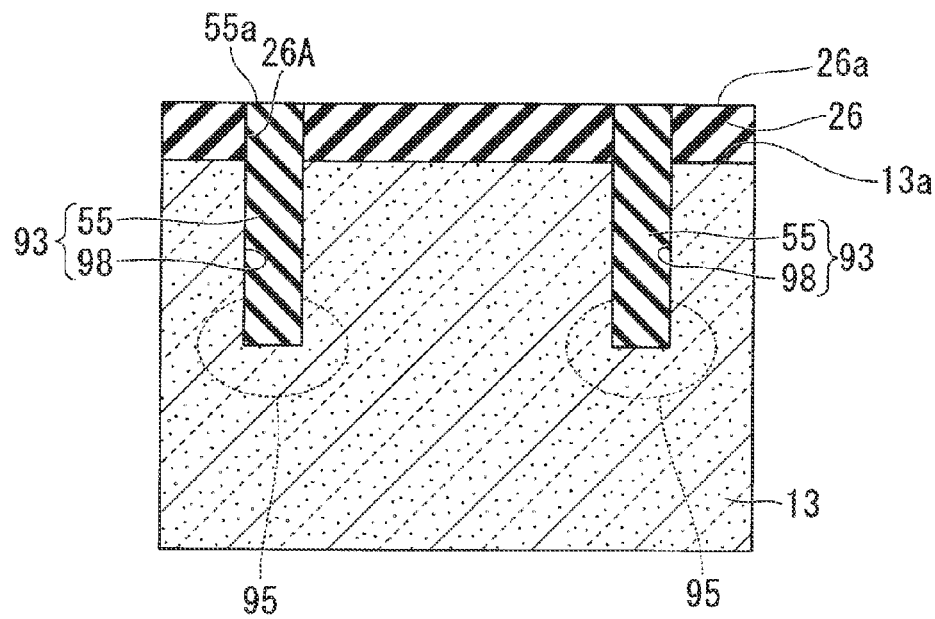
FIG. 34B is a fragmentary cross sectional elevation view, taken along an A-A' line, of a memory cell array in the step of FIG. 34A, involved in the method of forming the semiconductor device of FIG. 31.
Figure 34C:
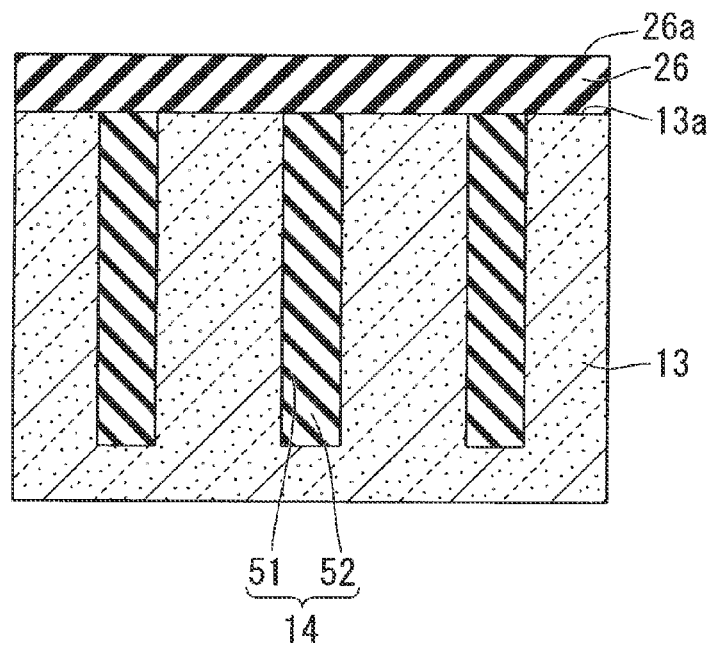
FIG. 34C is a fragmentary cross sectional elevation view, taken along a B-B' line, of the memory cell array in the step of FIG. 34A, involved in the method of forming the semiconductor device of FIG. 31.

FIG. 34A is a plan view of a region in which the memory cell array is formed, FIG. 34B is a cross-sectional view taken along a line A-A of a structure shown in FIG. 34A, and FIG. 34C is a cross-sectional view taken along a line B-B of the structure shown in FIG. 34A.

Figure 35A:
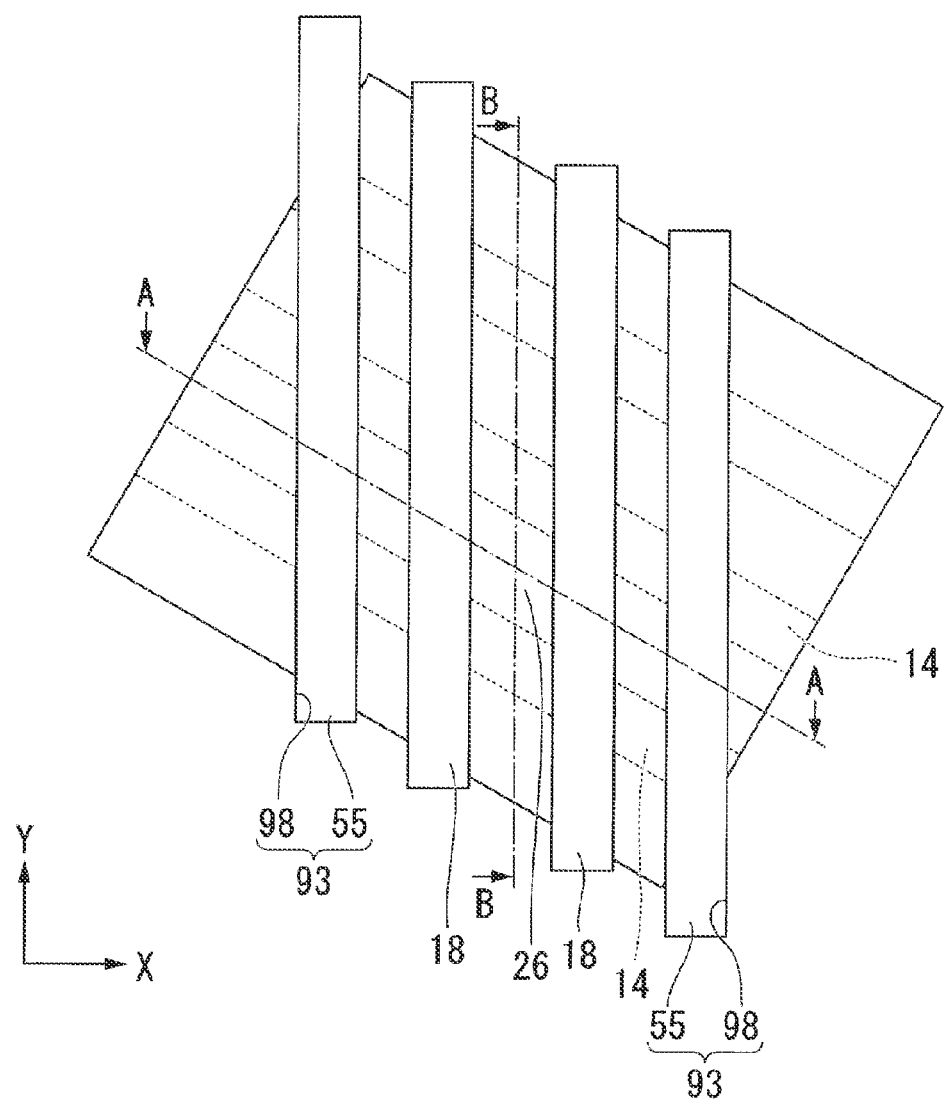
FIG. 35A is a fragmentary plan view of a memory cell array in a step, subsequent to the step of FIGS. 34A, 34B and 34C, involved in the method of forming the semiconductor device of FIG. 31.
Figure 35B:
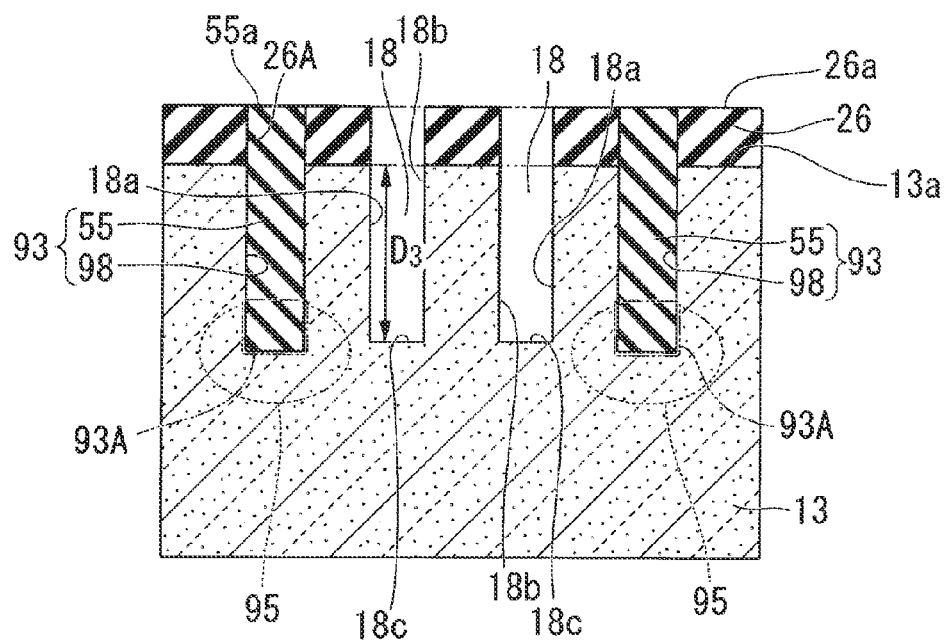
FIG. 35B is a fragmentary cross sectional elevation view, taken along an A-A' line, of a memory cell array in the step of FIG. 35A, involved in the method of forming the semiconductor device of FIG. 31.
Figure 35C:
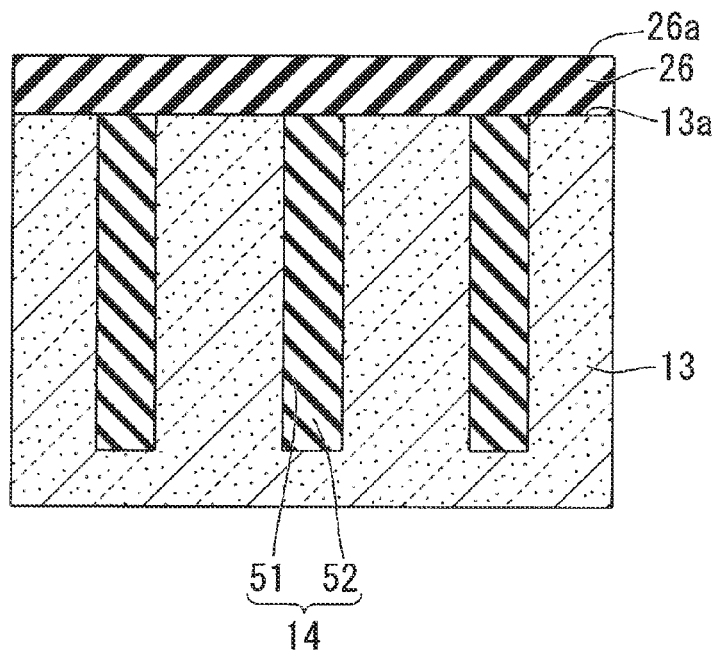
FIG. 35C is a fragmentary cross sectional elevation view, taken along a B-B' line, of the memory cell array in the step of FIG. 35A, involved in the method of forming the semiconductor device of FIG. 31.

FIG. 35A is a plan view of a region in which the memory cell array is formed, FIG. 35B is a cross-sectional view taken along a line A-A of a structure shown in FIG. 35A, and FIG. 35C is a cross-sectional view taken along a line B-B of the structure shown in FIG. 35A.

Figure 36A:
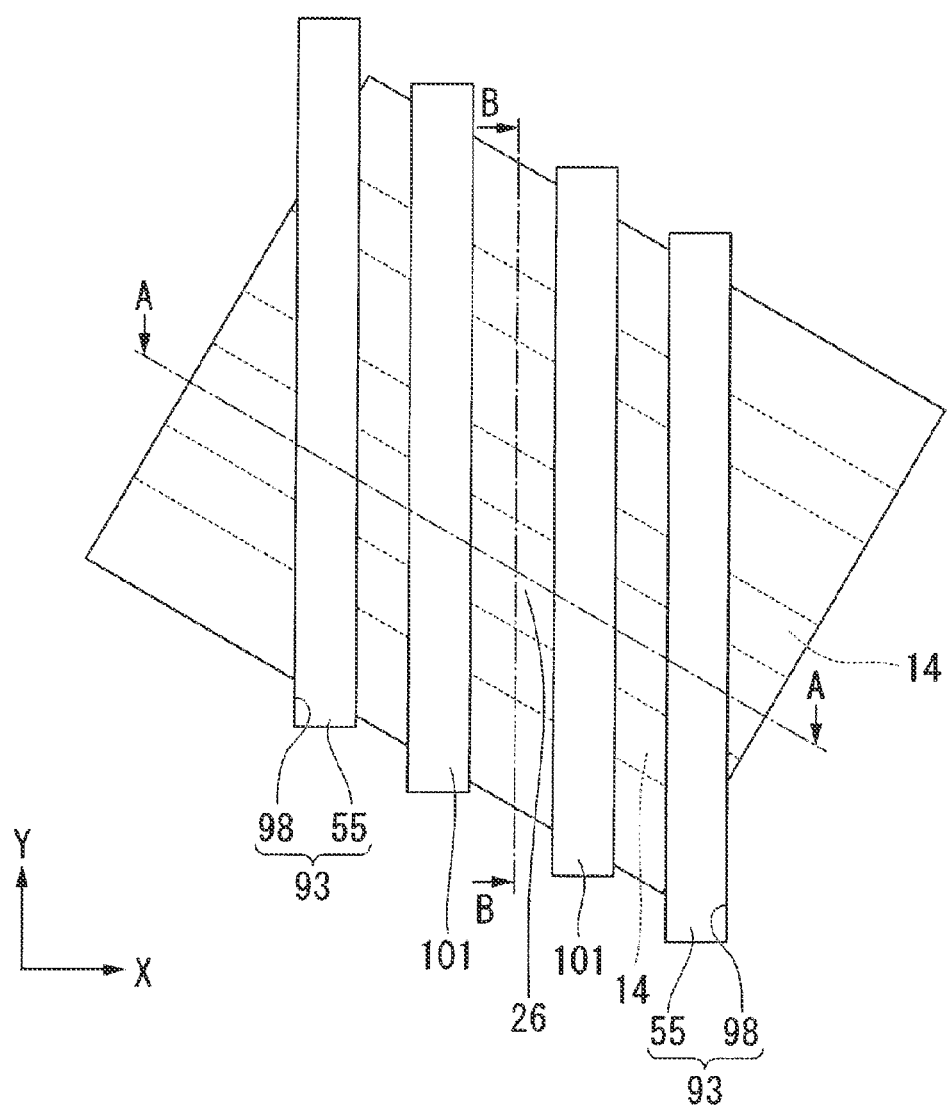
FIG. 36A is a fragmentary plan view of a memory cell array in a step, subsequent to the step of FIGS. 35A, 35B and 35C, involved in the method of forming the semiconductor device of FIG. 31.
Figure 36B:
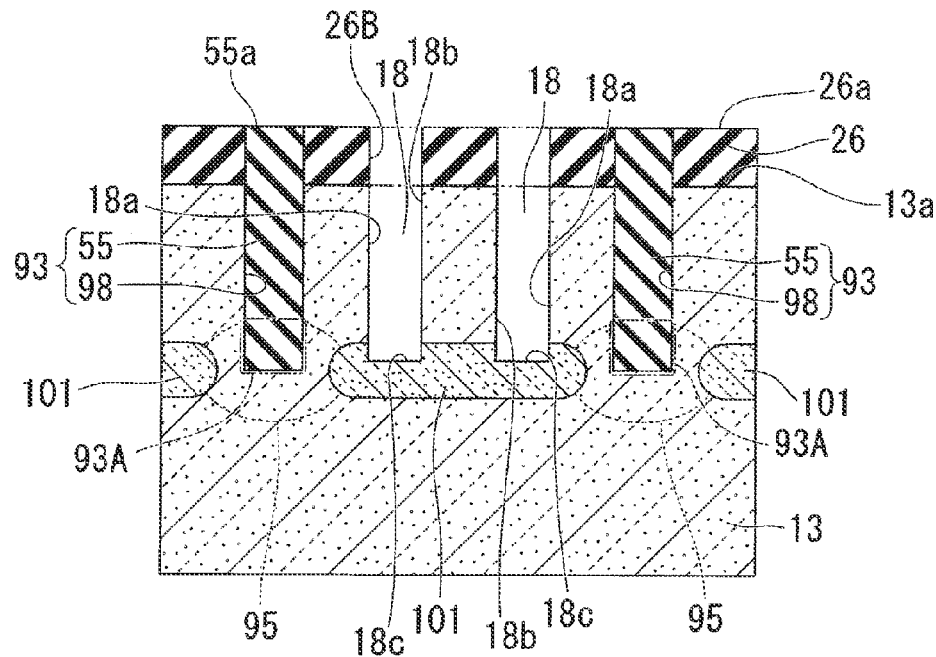
FIG. 36B is a fragmentary cross sectional elevation view, taken along an A-A' line, of a memory cell array in the step of FIG. 36A, involved in the method of forming the semiconductor device of FIG. 31.
Figure 36C:
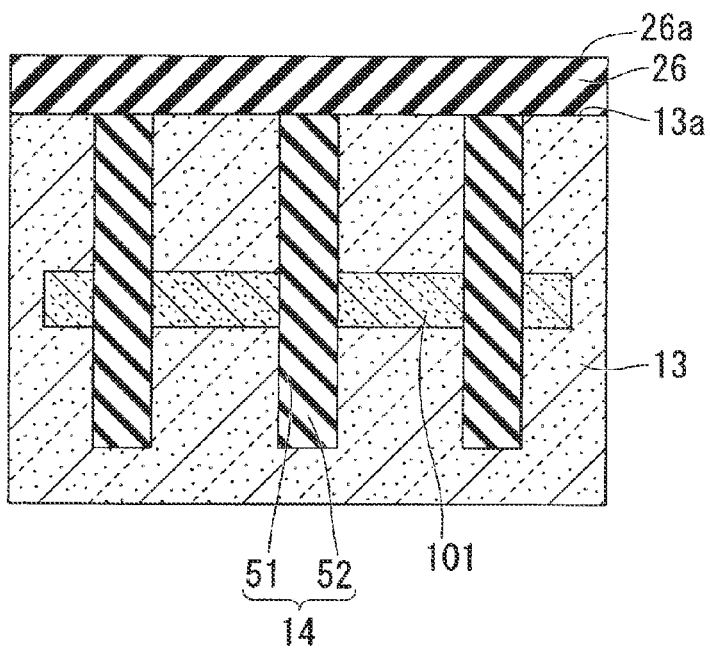
FIG. 36C is a fragmentary cross sectional elevation view, taken along a B-B' line, of the memory cell array in the step of FIG. 36A, involved in the method of forming the semiconductor device of FIG. 31.

FIG. 36A is a plan view of a region in which the memory cell array is formed, FIG. 36B is a cross-sectional view taken along a line A-A of a structure shown in FIG. 36A, and FIG. 36C is a cross-sectional view taken along a line B-B of the structure shown in FIG. 36A.

Figure 37A:
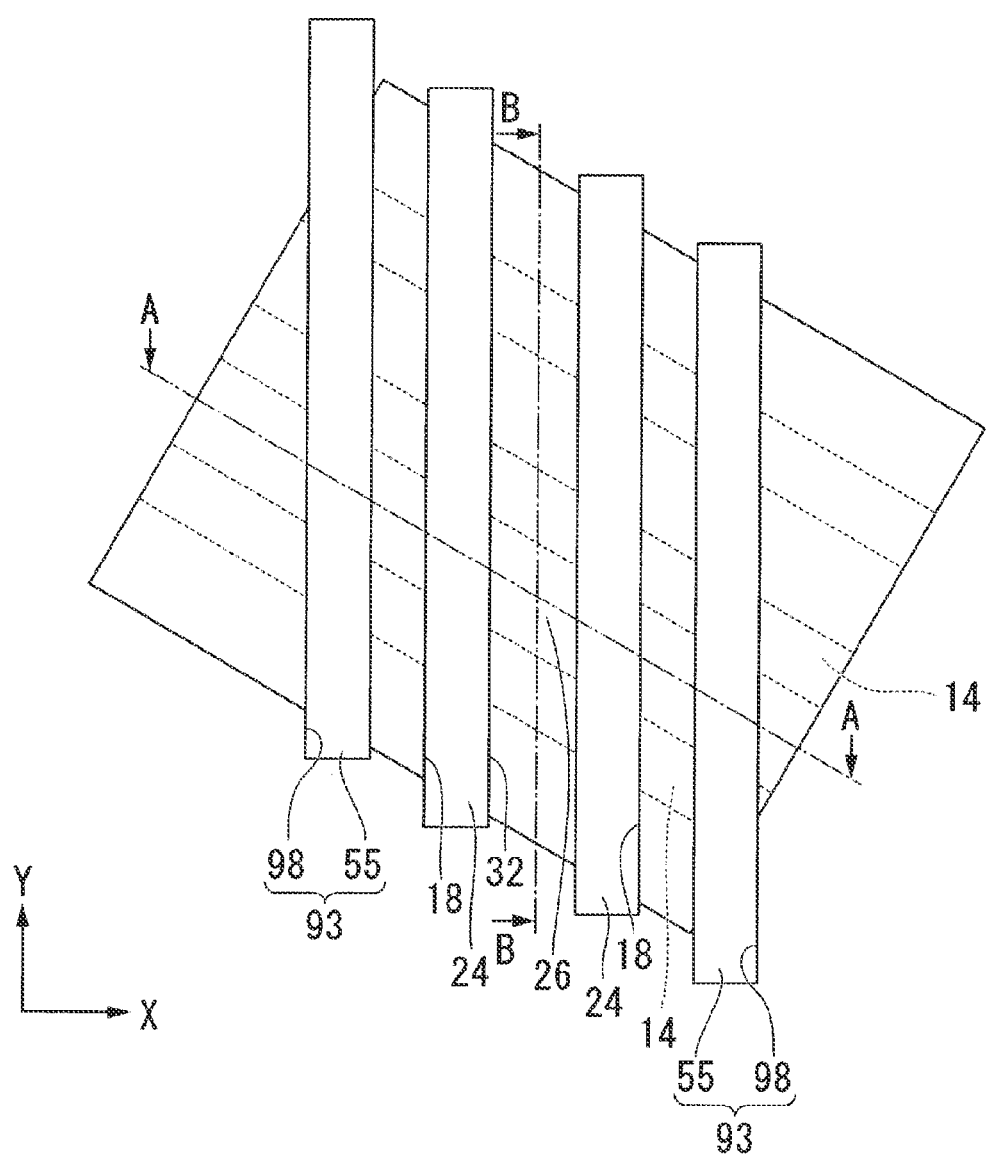
FIG. 37A is a fragmentary plan view of a memory cell array in a step, subsequent to the step of FIGS. 36A, 36B and 36C, involved in the method of forming the semiconductor device of FIG. 31.
Figure 37B:
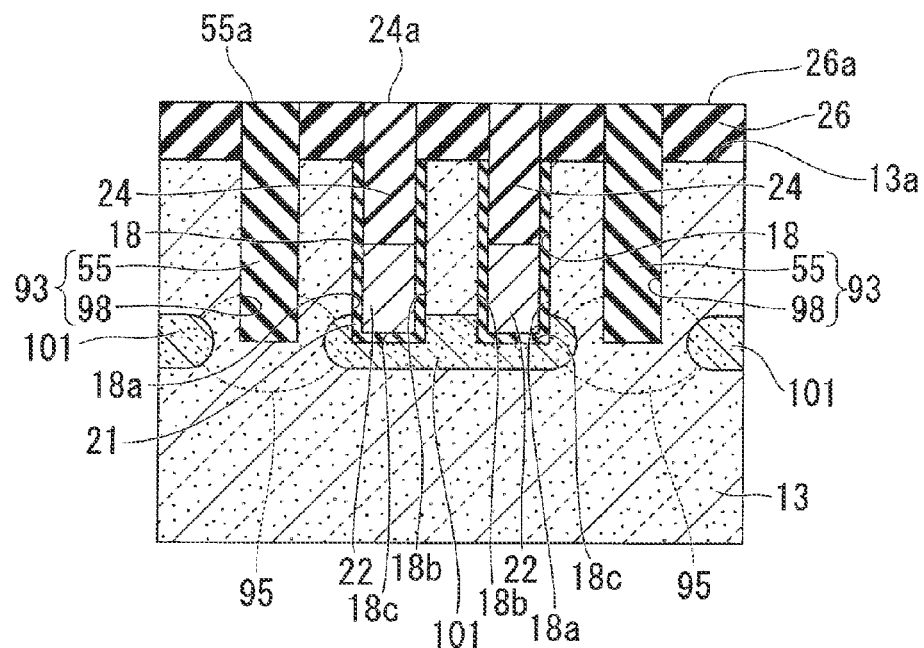
FIG. 37B is a fragmentary cross sectional elevation view, taken along an A-A' line, of a memory cell array in the step of FIG. 37A, involved in the method of forming the semiconductor device of FIG. 31.
Figure 37C:
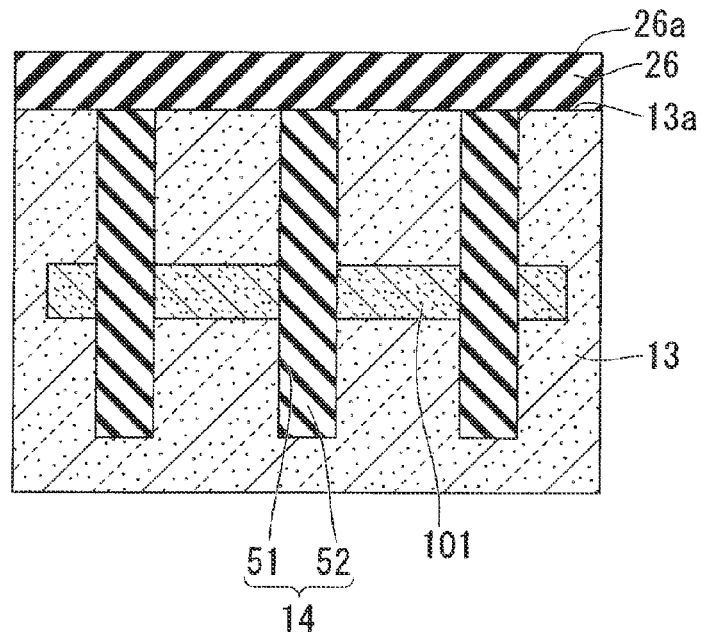
FIG. 37C is a fragmentary cross sectional elevation view, taken along a B-B' line, of the memory cell array in the step of FIG. 37A, involved in the method of forming the semiconductor device of FIG. 31.

FIG. 37A is a plan view of a region in which the memory cell array is formed, FIG. 37B is a cross-sectional view taken along a line A-A of a structure shown in FIG. 37A, and FIG. 37C is a cross-sectional view taken along a line B-B of the structure shown in FIG. 37A.

Figure 38A:
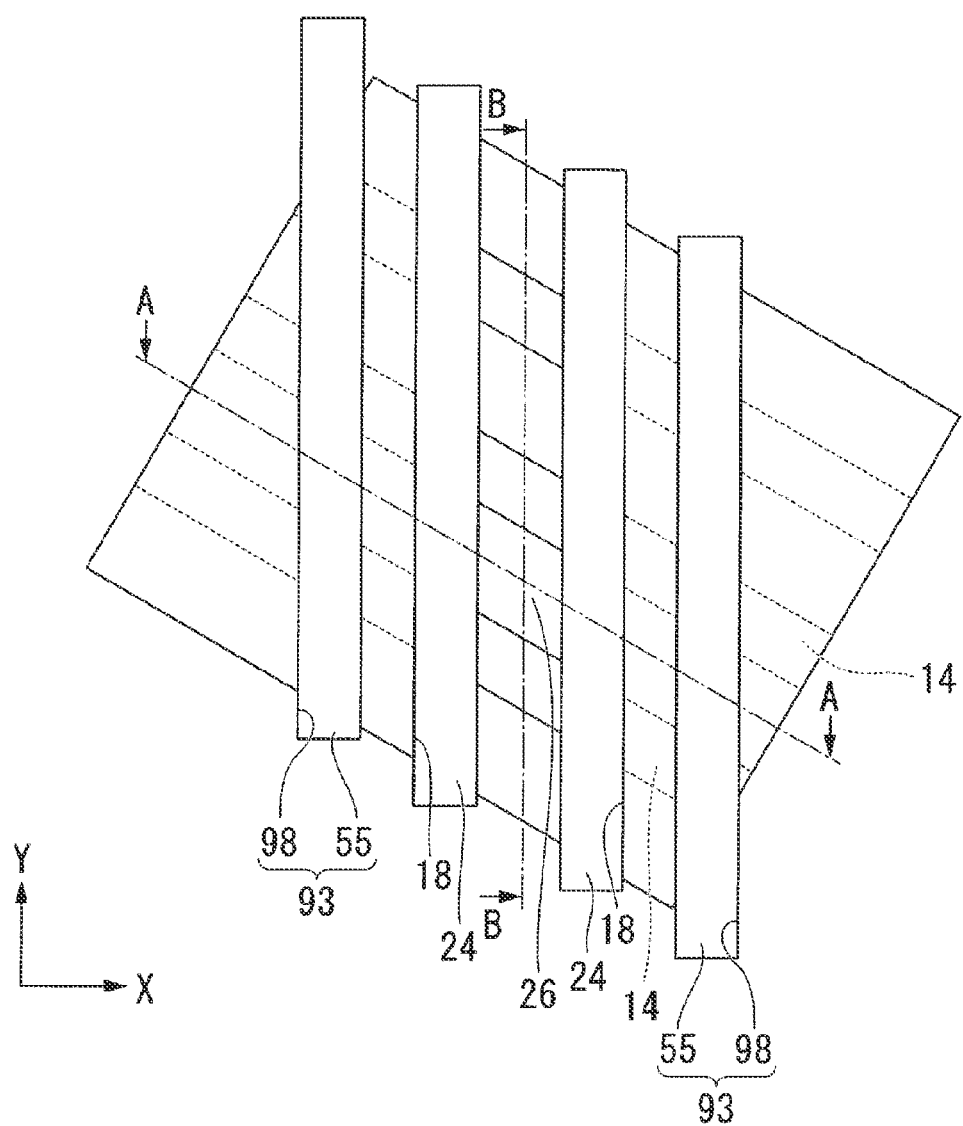
FIG. 38A is a fragmentary plan view of a memory cell array in a step, subsequent to the step of FIGS. 37A, 37B and 37C, involved in the method of forming the semiconductor device of FIG. 31.
Figure 38B:
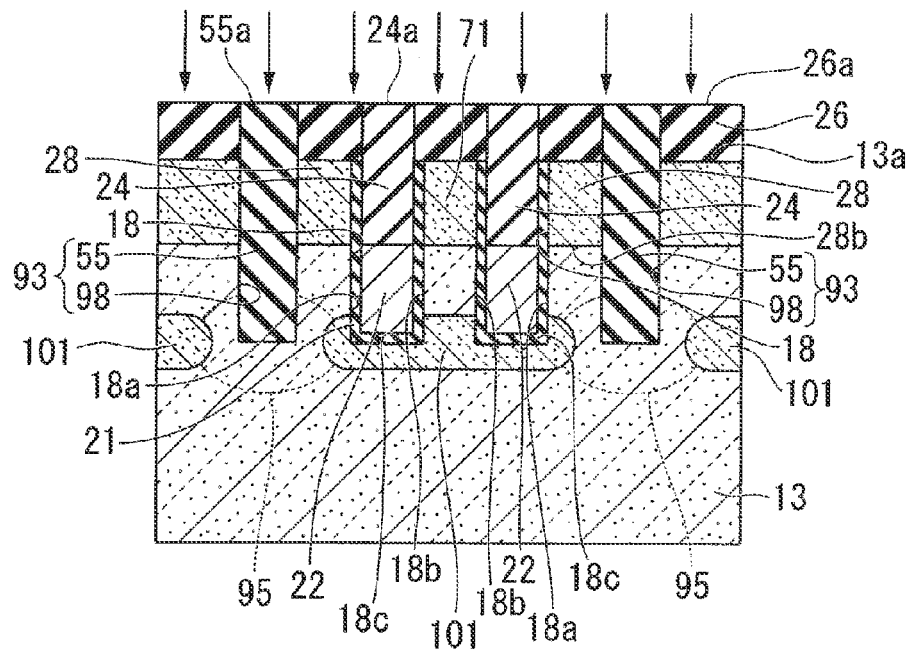
FIG. 38B is a fragmentary cross sectional elevation view, taken along an A-A' line, of a memory cell array in the step of FIG. 38A, involved in the method of forming the semiconductor device of FIG. 31.
Figure 38C:
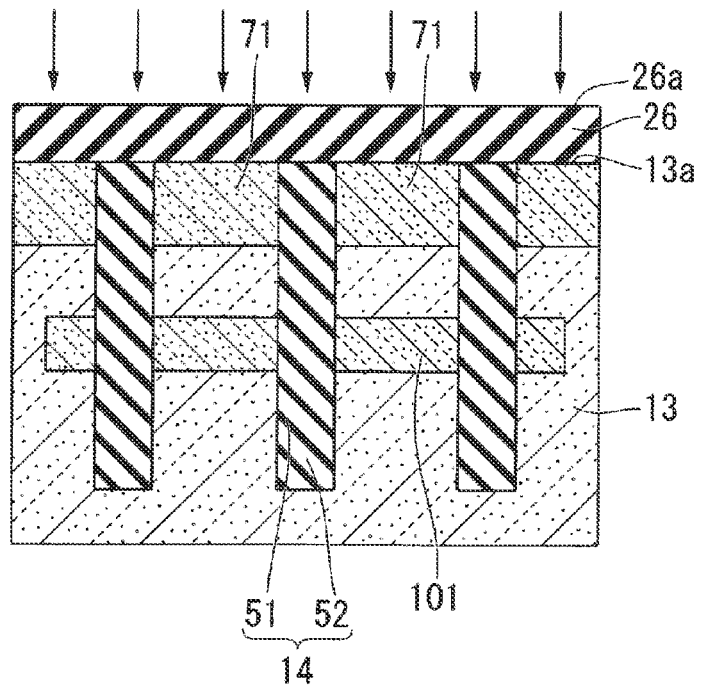
FIG. 38C is a fragmentary cross sectional elevation view, taken along a B-B' line, of the memory cell array in the step of FIG. 38A, involved in the method of forming the semiconductor device of FIG. 31.

FIG. 38A is a plan view of a region in which the memory cell array is formed, FIG. 38B is a cross-sectional view taken along a line A-A of a structure shown in FIG. 38A, and FIG. 38C is a cross-sectional view taken along a line B-B of the structure shown in FIG. 38A.

Figure 39A:
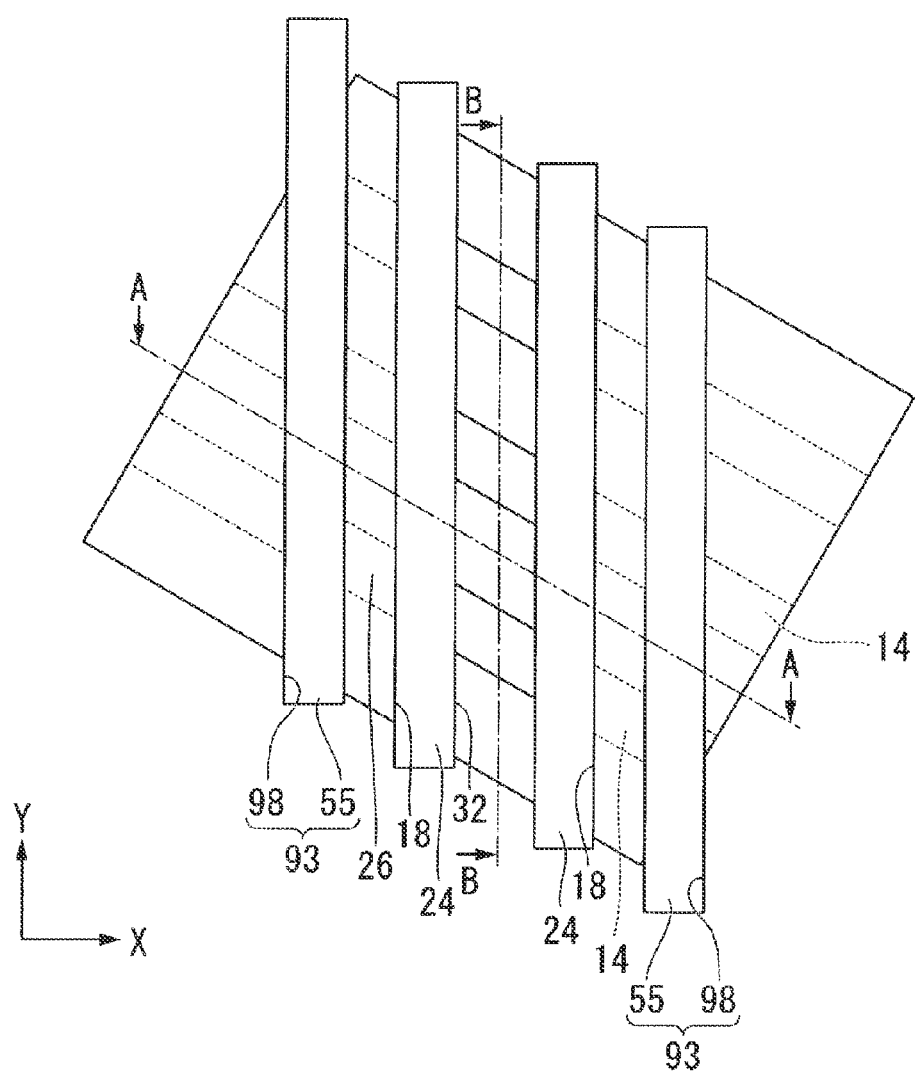
FIG. 39A is a fragmentary plan view of a memory cell array in a step, subsequent to the step of FIGS. 38A, 38B and 38C, involved in the method of forming the semiconductor device of FIG. 31.
Figure 39B:
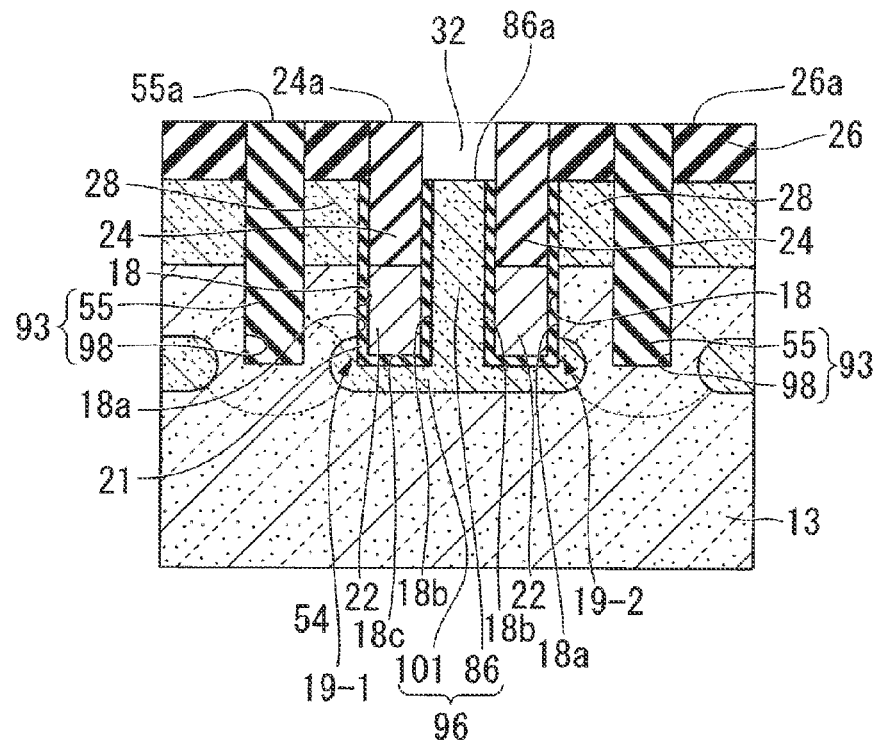
FIG. 39B is a fragmentary cross sectional elevation view, taken along an A-A' line, of a memory cell array in the step of FIG. 39A, involved in the method of forming the semiconductor device of FIG. 31.
Figure 39C:
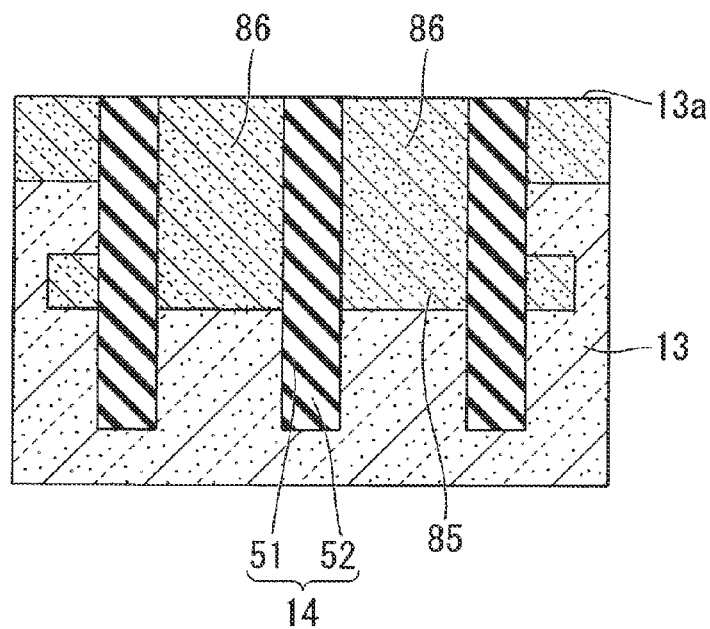
FIG. 39C is a fragmentary cross sectional elevation view, taken along a B-B' line, of the memory cell array in the step of FIG. 39A, involved in the method of forming the semiconductor device of FIG. 31.

FIG. 39A is a plan view of a region in which the memory cell array is formed, FIG. 39B is a cross-sectional view taken along a line A-A of a structure shown in FIG. 39A, and FIG. 39C is a cross-sectional view taken along a line B-B of the structure shown in FIG. 39A.

Figure 40:
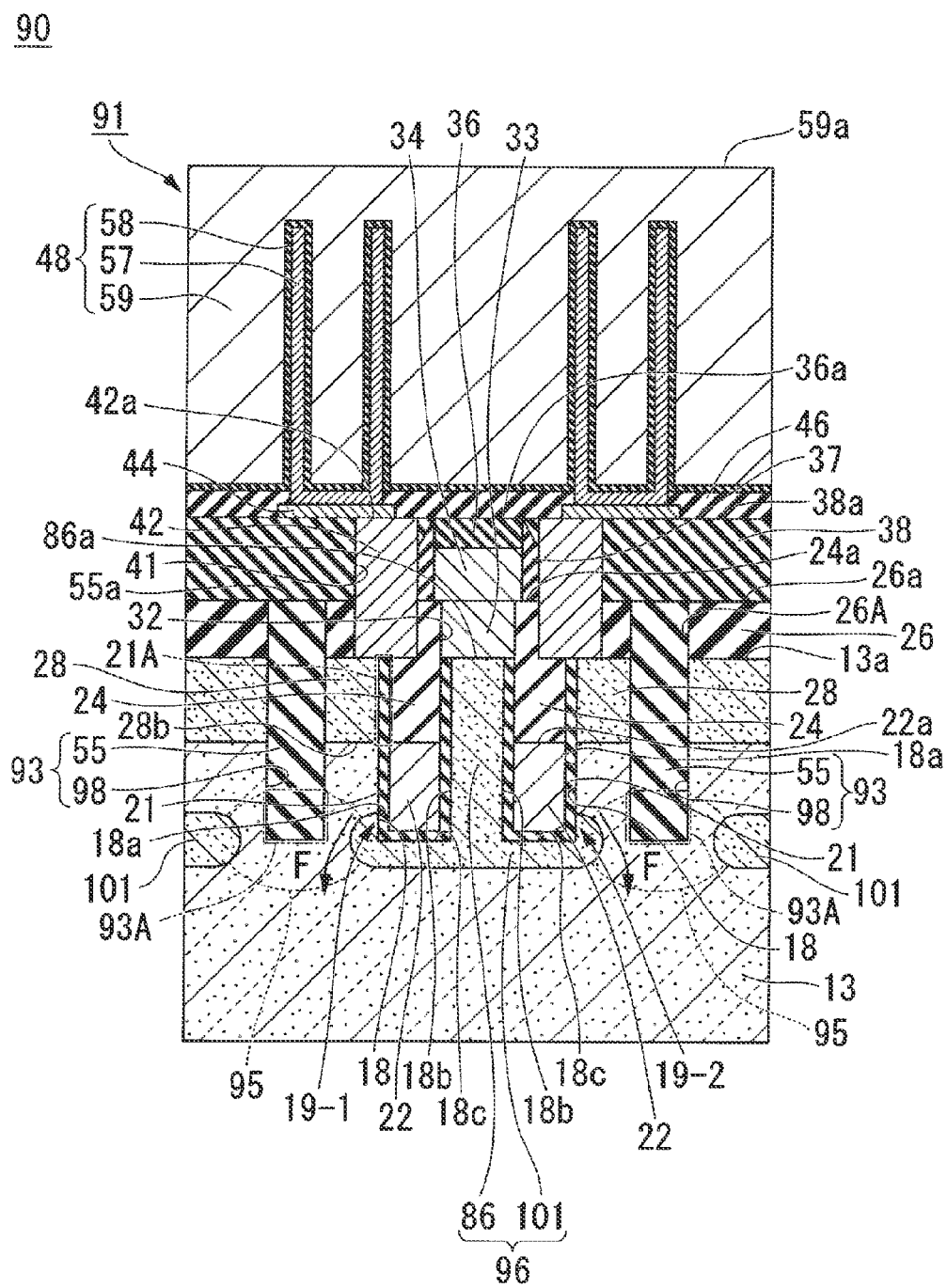
FIG. 40 is a fragmentary cross sectional elevation view with the same section as FIG. 16, of the memory cell array in a step, subsequent to the step of FIGS. 39A, 39B and 39C, involved in the method of forming the semiconductor device of FIG. 31.

FIG. 40 corresponds to a cross-section of the semiconductor device 90 of the third embodiment shown in FIG. 31. Further, a cross-section taken along the line A-A shown in FIG. 32A, FIG. 33A, FIG. 34A, FIG. 35A, FIG. 36A, FIG. 37A, FIG. 38A, and FIG. 39A corresponds to the cross-section of the semiconductor device 90 of the third embodiment shown in FIG. 31, which has been previously described.

A method of fabricating the semiconductor device 90 (specifically, memory cell 91) according to the third embodiment of the present invention will be described with reference to FIGS. 32A through 32C, FIGS. 33A through 33C, FIGS. 34A through 34C, FIGS. 35A through 35C, FIGS. 36A through 36C, FIGS. 37A through 37C, FIG. 38A through 38C, FIG. 39A through 39C, and FIG. 40.

In a process shown in FIGS. 32A through 32C, the processes from the process shown in FIGS. 3A through 3C to the process shown in FIGS. 5A through 5C, which has been described in the first embodiment, is performed to thereby form the structure shown in FIGS. 5A through 5C.

Next, a mask insulating film 26 having an aperture 26A and a second element isolation trench 98 (formed by etching the semiconductor substrate 13) are sequentially formed on the main surface 13a of the semiconductor substrate 13 using the same technique as the process shown in FIGS. 6A through 6C of the first embodiment. A depth $D_6$ of the second element isolation trench 98 (a depth from the main surface 13a of the semiconductor substrate 13) may be, for example, 150 nm.

Next, in a process shown in FIGS. 33A through 33C, impurities having the same conductivity type as the semiconductor substrate 13 are ion-implanted at a higher concentration than the semiconductor substrate 13 into the bottom 98a of the second element isolation trench 98, and a third impurity diffusion region 95 surrounding the bottom 98A of the second element isolation trench 98 is formed.

Specifically, boron (B), which is p-type impurities (impurities having the same conductivity type as the semiconductor substrate 13), is ion-implanted into the bottom 98a of the second element isolation trench 98 to thereby form the third impurity diffusion region 95 that is a p-type impurity diffusion region having a higher concentration than the p-type impurities of the semiconductor substrate 13 to surround the bottom 98A of the second element isolation trench 98.

If the p-type impurity concentration of the semiconductor substrate 13 is 1E16 atoms/cm$^2$, the p-type impurity concentration of the third impurity diffusion region 95 may be, for example, 1E19 atoms/cm$^2$.

Next, in a process shown in FIGS. 34A through 34C, the second element isolation insulating film 55 burying the second element isolation trench 98 and having an upper surface 55a flush with the upper surface 26a of the mask insulating film 26 is formed using the same technique as the method described with reference to FIGS. 6A through 6C of the first embodiment (see FIGS. 6A through 6C).

Accordingly, the second element isolation region 93 consisting of the second element isolation trench 98 and the second element isolation insulating film 55 and partitioning the band-shaped active region 16 shown in FIG. 33A into a plurality of element forming regions R is formed.

Next, in a process shown in FIGS. 35A through 35C, a trench-shaped aperture 26B and two gate electrode trenches 18 having first opposing side surfaces 18a are sequentially formed in the mask insulating film 26 using the same technique as the method described with reference to FIGS. 7A through 7C of the first embodiment.

In this case, a depth $D_3$ of the gate electrode trench 18 (a depth from the main surface 13a of the semiconductor substrate 13) is substantially the same as that of the second element isolation trench 98. If the depth of the second element isolation trench 98 is 150 nm, the depth $D_3$ of the gate electrode trench 18 may be, for example, 150 nm.

Next, in a process shown in FIGS. 36A through 36C, n-type impurities having a different conductivity type from the semiconductor substrate 13 (p-type silicon substrate) are ion-implanted into the bottom 18c of the gate electrode trench 18 to thereby form the first region 101, which is part of the second impurity diffusion region 96, with the same depth as the third impurity diffusion region 95.

Specifically, phosphorus (P), which is n-type impurities (impurities having a different conductivity type from the p-type silicon substrate that is a semiconductor substrate 13), is selectively ion-implanted into the bottom 18c of the gate electrode trench 18 under conditions in which energy is 100 KeV and a dose amount is 1E14 atoms/cm$^2$, to thereby form the first region 101 to the same depth as the third impurity diffusion region 95.

In this case, the first region 101 tries to spread in a direction (lateral direction) toward the second element isolation region 93. However, since the third impurity diffusion region 95, which is a high-concentration p-type impurity diffusion region, is formed in the bottom 93A of the second element isolation region 93, the first region 101 does not reach the second element isolation region 93.

Thereby, as shown in FIG. 36B, the third impurity diffusion region 95 is present between the bottom 93A of the second element isolation region 93 and the first region 101, and the third impurity diffusion region 95 functions as passage through which charges can move.

Next, in a process shown in FIGS. 37A through 37C, the gate insulating film 21, the gate electrode 22, and the buried insulating film 24 are sequentially formed using the same technique as the method described with reference to FIGS. 8A through 8C of the first embodiment (see FIGS. 8A through 8C).

In this case, since the gate insulating film 21 formed on the bottom 18c of the gate electrode trench 18 is covered with the first region 101, the semiconductor substrate 13 constituting the bottom 18c of the gate electrode trench 18 does not function as a channel.

Next, in a process shown in FIGS. 38A through 38C, phosphorus (P), which is n-type impurities, is ion-implanted into an entire upper surface of the structure shown in FIGS. 37A through 37C using the same technique as the method described with reference to FIGS. 9A through 9C of the first embodiment under conditions in which energy is 100 KeV and a dose amount is 1E14 atoms/cm$^2$ to thereby simultaneously form the first impurity diffusion region 28, and the second region 86 that is part of impurity diffusion region 71 (see FIGS. 9A through 9C).

Next, in a process shown in FIGS. 39A through 39C, using the same technique as the process shown in FIGS. 10A through 10C, FIGS. 11A through 11C, and FIGS. 12A through 12C of the first embodiment, an entire portion of the semiconductor substrate 13 located between the two gate electrode trenches 18, formed in the second side surfaces 18b of the two gate electrode trenches 18 is covered with the gate insulating film 21 and the first region 85 contacting the first region 101 is formed.

Accordingly, the second impurity diffusion region 96 consisting of the first region 85 and the first region 101 is formed.

Next, in a process shown in FIG. 40, the same process as the process shown in FIGS. 13 through 15, which has been described in the first embodiment, is performed to thereby fabricate the semiconductor device 90 of the third embodiment.

According to the method of fabricating a semiconductor device of the third embodiment, before the second element isolation insulating film 55 is formed, p-type impurities having the same conductivity type as the semiconductor substrate 13 are ion-implanted into the bottom 98a of the second element isolation trench 98 at a higher concentration than the semiconductor substrate 13 to thereby form the third impurity diffusion region 95 surrounding the bottom 93A of the second element isolation trench 93, and then n-type impurities having a different conductivity type from the semiconductor substrate 13 are selectively ion-implanted into the bottom 18c of the gate electrode trench 18 to thereby form the first layered region 101 (part of the second impurity diffusion region 96). Accordingly, a path for releasing extra charges accumulated in the semiconductor substrate 13 located between the gate electrode 22 and the second element isolation region 93 (a path for releasing charges in the semiconductor substrate 13 located downward from the third impurity diffusion region 95) can be formed between the bottom 93A of the second element isolation region 93 and the first region 101. Thus, the first and second transistors 19-1 and 19-2 can be operated independently and stably.

Further, the first region 101 covering the gate insulating film 21 formed on the bottoms 18c of the two gate electrode trenches 18 and divided into element forming regions by the third impurity diffusion region 95 is formed, and then the second region 86 reaching the first region 101 arranged downward from the second region 86 is formed in an entire portion of the semiconductor substrate 13 sandwiched between the two gate electrode trenches 18 to thereby form the second impurity diffusion region 96 consisting of the first region 101 and the second region 86. Accordingly, a state in which "L" is accumulated in the lower electrode 57 electrically connected with the first transistor 19-1 and "H" is accumulated in the lower electrode 57 electrically connected with the first transistor 19-1 is obtained. In this state, when on/off of the gate electrode 22 (word line) corresponding to the first transistor 19-1 is repeated, electrons e– induced in the channel of the first transistor 19-1 (not shown) are trapped by the first region 101 containing n-type impurities. Thus, the electrons e– induced in the channel of the first transistor 19-1 can be suppressed from reaching the second impurity diffusion region 96 (drain region) constituting the second transistor 19-2.

Accordingly, generation of a disturbance defect, in which an accumulation state of one cell is changed due to an operation state of the other adjacent cell, can be suppressed so that H information resulting from electrons e– induced in the channel of the first transistor 19-1 being accumulated in the lower electrode 57 electrically connected with the second transistor 19-2 is not destructed and the state is not changed into an L state.

Further, even in a DRAM in which an interval between the two gate electrodes 22 arranged to be adjacent to each other is equal to or less than 50 nm, the generation of the disturbance defect can be suppressed.

Further, with the method of fabricating the semiconductor device 90 of the third embodiment, the same effects as those of the semiconductor device 80 of the second embodiment can be obtained.

Although the preferred embodiments of the present invention have been described above, the present invention is not limited to such specific embodiments and various modifications and variations may be made without departing from the scope and spirit of the present invention defined in claims.

Figure 41:
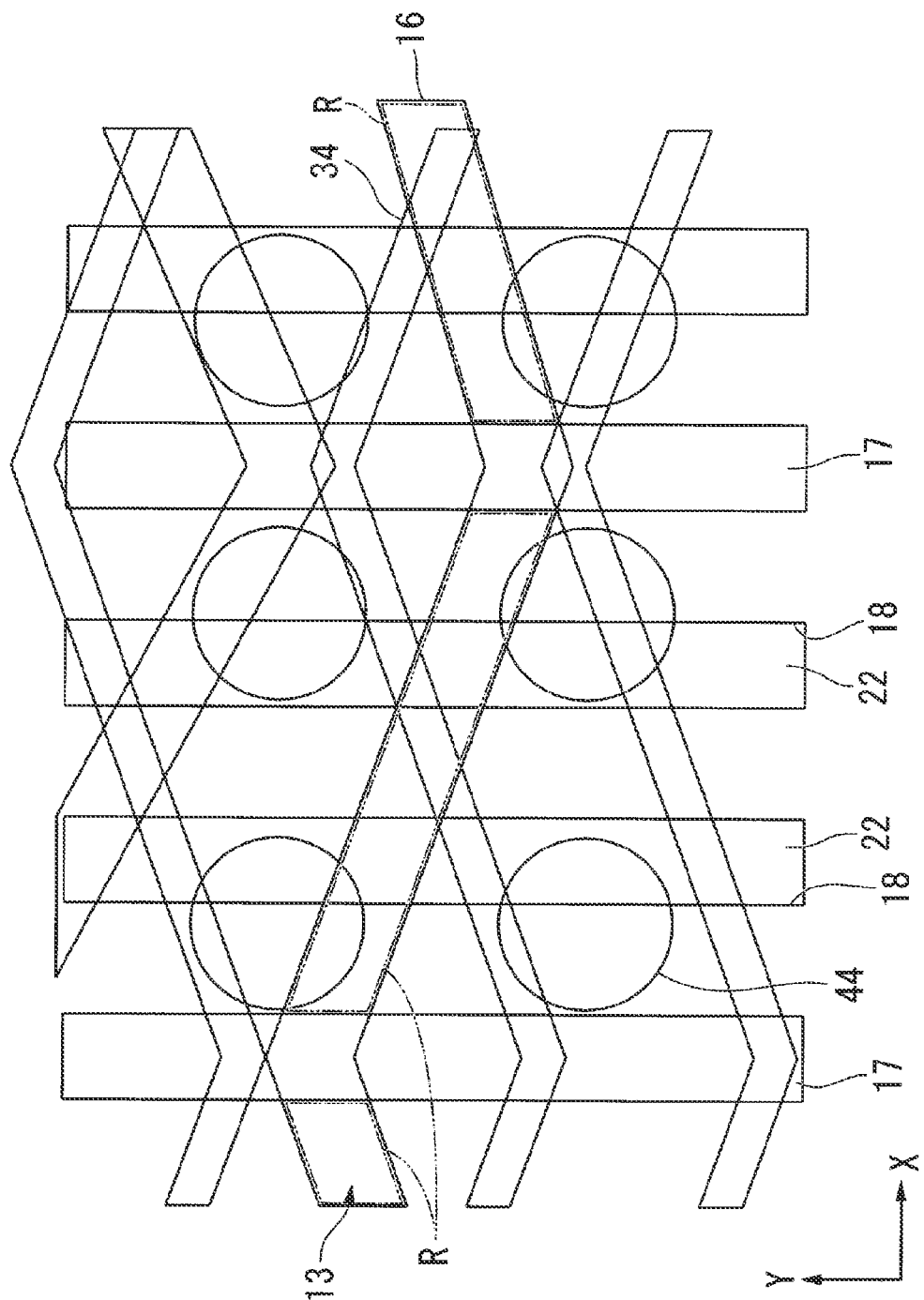
FIG. 41 is a fragmentary plan view of another memory cell array of the semiconductor device of one of the first to third embodiments of the invention.

FIG. 41 is a plan view showing another example of a layout of a memory cell array that can be applied to the semiconductor device according to the first to third embodiments of the present invention. In FIG. 41, the same components as those of the structure shown in FIG. 1 are assigned the same reference numerals.

The semiconductor devices 10, 80 and 90 of the first to third embodiments, which have been described above, may be applied to a layout in which the active region 16 and the bit line 34 as shown in FIG. 41 are in zigzag shape.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware and/or software that is constructed and/or programmed to carry out the desired function.

Furthermore, the particular features, structures, or characteristics may be combined in any suitable manner in one or more embodiments.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a semiconductor substrate having a first gate groove having first and second side walls facing to each other;
   a first gate insulating film covering the first and second side walls of the first gate groove;
   a first gate electrode on the first gate insulating film, the first gate electrode being in a lower portion of the first gate groove;
   a first burying insulating film that buries the first gate groove, the first burying insulating film covering the first gate electrode;
   a first diffusion region adjacent to a first upper portion of the first gate insulating film, the first upper portion being on an upper portion of the first side wall of the first gate groove; and
   a second diffusion region in contact with an entire portion of the second side wall of the first gate groove;
   an inter-layer insulating film over the first burying insulating film;
   a contact plug contacting the first diffusion region, the contact plug being in the first burying insulating film and the interlayer insulating film;
   a contact pad over the interlayer insulating film, the contact pad contacting an upper surface of the contact plug; and
   a capacitor electrically coupled to the contact pad.

2. The semiconductor device according to claim 1, wherein the semiconductor substrate further comprises a second gate groove having third and fourth side walls facing to each other, and
   wherein the second diffusion region is disposed between the first and second gate grooves, the second diffusion region being adjacent to the first and second gate grooves.

3. The semiconductor device according to claim 2, wherein the second diffusion region fills entirely in an interposed region of the semiconductor substrate between the first and second gate grooves.

4. The semiconductor device according to claim 3, further comprising:

a second gate insulating film covering the third and fourth side walls of the second gate groove;

a second gate electrode on the second gate insulating film, the second gate electrode being in an upper portion of the second gate groove; and a second burying insulating film that buries the second gate groove, the second burying insulating film covering the second gate electrode.

5. The semiconductor device according to claim 4, wherein the second diffusion region has a bottom portion which is lower than bottoms of the first and second gate grooves.

6. The semiconductor device according to claim 4, wherein the second diffusion region includes first and second regions which are united with each other, the first region being adjacent to the bottoms of the first and second gate grooves, and the second region filling entirely in an interposed region of the semiconductor substrate between the first and second gate grooves.

7. The semiconductor device according to claim 6, wherein the first and second gate grooves extend in a first direction in the semiconductor substrate.

8. The semiconductor device according to claim 7, further comprising:

first isolation regions in the semiconductor substrate, the first isolation regions extending in a second direction crossing the first direction, the first isolation regions defining at least an active region of the semiconductor substrate; and second isolation regions in the semiconductor substrate, the second isolation regions extending in the first direction, the second isolation regions dividing the at least an active region into a plurality of device formation regions.

9. The semiconductor device according to claim 8, wherein the first region of the second diffusion region is a layered region, the first and second isolation regions have bottoms which are deeper than bottom of the first region of the second diffusion region, the first and second isolation regions divide the first region of the second diffusion region into a plurality of regions.

10. The semiconductor device according to claim 8, wherein the second isolation regions have bottoms which are substantially the same level as the bottoms of the first and second gate electrode grooves.

11. The semiconductor device according to claim 10, further comprising:

third diffusion regions around the bottoms of the second isolation regions, the third diffusion regions being the same in conductivity type as the semiconductor substrate, the third diffusion regions being higher in impurity concentration than the semiconductor substrate, the third diffusion regions contacting the first region of the second diffusion region.

12. The semiconductor device according to claim 8, wherein the first isolation region comprises a first insulating film which buries in a first isolation groove extending in the second direction and in the semiconductor substrate.

13. The semiconductor device according to claim 8, wherein the second isolation region comprises a second insulating film which buries in a second isolation groove extending in the first direction and in the semiconductor substrate.

14. The semiconductor device according to claim 1, further comprising:

a bit line electrically coupled to the second diffusion region, the bit line extending in a direction crossing an extension direction of the gate electrode.

15. A semiconductor device comprising:

a semiconductor substrate having at least an active region that extends in a first direction, the semiconductor substrate having first and second gate electrode grooves;

first and second isolation regions in the semiconductor substrate, the first and second isolation regions extending in a second direction, the first and second isolation regions extending across the at least active region to divide the at least active region into a plurality of device formation regions;

first and second transistors disposed between the first and second isolation regions, the first and second transistors being aligned and adjacent to each other in the first direction, the first and second transistors having first and second diffusion regions, respectively, the first and second transistors having a third diffusion region as a common diffusion region, the third diffusion region being disposed between the first and second gate electrode grooves;

a bit line electrically coupled to the third diffusion region;

first and second gate insulating films in the first and second gate electrode grooves; and first and second gate electrodes on the first and second gate insulating films, respectively, the first and second gate electrodes burying lower portions of the first and second gate electrode grooves, wherein the first diffusion region is in the semiconductor substrate, the first diffusion region is disposed between the first isolation region and the first gate electrode groove, the first diffusion region has a first bottom which is higher in level than a top portion of the first gate electrode, wherein the second diffusion region is in the semiconductor substrate, the second diffusion region is disposed between the second isolation region and the second gate electrode groove, the second diffusion region has a second bottom which is higher in level than a top portion of the second gate electrode, the first gate electrode groove has first and second side surfaces and a first bottom, the first side surface facing against the first isolation region, the second side surface being adjacent to the third diffusion region, the second gate electrode groove has third and fourth side surfaces and a second bottom, the third side surface facing against the second isolation region, the fourth side surface being adjacent to the third diffusion region, the third diffusion region fills entirely in an interposed region of the semiconductor substrate between the first and second gate grooves, the third diffusion region extending from an upper surface of the semiconductor substrate to the bottoms of the first and second gate electrode grooves, the first transistor has a first channel region between the first diffusion region and the bottom of the third diffusion region, and the second transistor has a second channel region between the second diffusion region and the bottom of the third diffusion region.

16. The semiconductor device according to claim 15, wherein the first channel region extends from the bottom of the first diffusion region along the first side surface of the first gate electrode groove, and the second channel region extends from the bottom of the second diffusion region along the third side surface of the second gate electrode groove.

17. The semiconductor device according to claim 15, wherein the third diffusion region include first and second regions united with each other, the first region extends entirely in an interposed region between the first and second gate electrode grooves and from the upper surface of the semiconductor substrate to a deep portion between the bottoms of the first and second gate electrode grooves, the second region extending between the bottoms of the first and second gate electrode grooves, the second region contacting the bottoms of the first and second gate electrode grooves, the second region is a lowered region, the first channel region extends between the bottom of the first diffusion region to the second region of the third diffusion region, and the second channel region extends between the bottom of the second diffusion region to the second region of the third diffusion region.

18. The semiconductor device according to claim 17, wherein the first and second isolation regions have bottoms which are deeper than the bottom of the third diffusion region, and the third diffusion region is divided by the first and second isolation regions into a plurality of diffusion regions.

19. The semiconductor device according to claim 17, further comprising:

fourth diffusion regions around the bottoms of the first and second isolation regions, the fourth diffusion regions being the same in conductivity type as the semiconductor substrate, the fourth diffusion regions being higher in impurity concentration than the semiconductor substrate, the fourth diffusion regions contacting the second region of the third diffusion region.

20. A semiconductor device comprising:

a semiconductor substrate having a gate groove including a lower portion and an upper portion;

a gate insulating film covering an inner surface of the gate groove;

a gate electrode formed on the insulating film, the gate electrode being provided in the lower portion of the gate groove;

a buried insulating film that at least buries the upper portion of the gate groove, the buried insulating film covering the gate electrode;

a first diffusion region provided on the semiconductor substrate adjacent to the upper portion of the gate groove via the gate insulator, a bottom of the first diffusion region being positioned above a bottom of the gate groove;

a second diffusion region provided in the semiconductor substrate in an opposite side of the first diffusion region across the gate groove, a bottom of the second diffusion region extending below the bottom of the gate groove;

an interlayer insulating film formed over the buried insulating film; and a contact plug contacting the first diffusion region, the contact plug being provided in the buried insulating film and the interlayer insulating film.

\* \* \* \* \*